US008418167B2

(12) United States Patent
Meller et al.

(10) Patent No.: US 8,418,167 B2
(45) Date of Patent: Apr. 9, 2013

(54) METHODS AND SYSTEMS FOR UPDATING CONTENT INCLUDING A COMPRESSED VERSION

(75) Inventors: Evyatar Meller, Petach-Tikva (IL); Sharon Peleg, Ramat Hasharon (IL)

(73) Assignee: Red Bend Ltd., Tel Aviv (IL)

( * ) Notice: Subject to any disclaimer, the term of this patent is extended or adjusted under 35 U.S.C. 154(b) by 1603 days.

(21) Appl. No.: 11/543,996

(22) Filed: Oct. 6, 2006

(65) Prior Publication Data

US 2007/0083571 A1 Apr. 12, 2007

Related U.S. Application Data

(60) Provisional application No. 60/723,939, filed on Oct. 6, 2005.

(51) Int. Cl.
G06F 9/44 (2006.01)
(52) U.S. Cl. .......................... 717/169; 717/168
(58) Field of Classification Search .................. None
See application file for complete search history.

(56) References Cited

U.S. PATENT DOCUMENTS

| 5,644,791 | A  | * | 7/1997  | Brady et al. ................ 710/68 |
| 6,018,747 | A  |   | 1/2000  | Burns et al. |
| 6,546,552 | B1 | * | 4/2003  | Peleg ........................ 717/170 |
| 6,832,373 | B2 |   | 12/2004 | O'Neill |
| 6,912,711 | B1 | * | 6/2005  | Curtis et al. ............... 717/173 |
| 7,103,740 | B1 | * | 9/2006  | Colgrove et al. ........... 711/162 |
| 7,134,041 | B2 | * | 11/2006 | Murray et al. ............... 714/4.1 |
| 7,669,195 | B1 | * | 2/2010  | Qumei ....................... 717/170 |
| 7,711,706 | B2 | * | 5/2010  | Manapetty et al. ......... 707/621 |
| 7,886,093 | B1 | * | 2/2011  | Chen .......................... 710/68 |
| 7,971,199 | B1 | * | 6/2011  | Chen .......................... 717/168 |
| 2003/0004990 | A1 | * | 1/2003 | Draper ....................... 707/511 |
| 2003/0056139 | A1 | * | 3/2003 | Murray et al. ............... 714/4 |
| 2004/0054858 | A1 | * | 3/2004 | Chandrasekaran et al. .. 711/154 |
| 2004/0148303 | A1 |   | 7/2004 | McKay et al. |
| 2005/0086445 | A1 | * | 4/2005 | Mizuno et al. ............. 711/162 |
| 2005/0114852 | A1 | * | 5/2005 | Chen et al. ................. 717/168 |
| 2005/0132179 | A1 | * | 6/2005 | Glaum et al. ............... 713/1 |
| 2005/0216530 | A1 |   | 9/2005 | Meller et al. |
| 2006/0106888 | A1 | * | 5/2006 | Iida et al. .................. 707/203 |
| 2006/0174300 | A1 | * | 8/2006 | Gu et al. .................... 725/100 |

FOREIGN PATENT DOCUMENTS

| WO | 2004031961 A | 3/2004 |
| WO | WO-2004/114130 A2 | 12/2004 |
| WO | WO-2005/003963 A2 | 1/2005 |

* cited by examiner

*Primary Examiner* — Insun Kang
(74) *Attorney, Agent, or Firm* — Buchanan Ingersoll & Rooney PC

(57) ABSTRACT

An original version of content is in-place updated to an updated version in a non-volatile storage device including blocks, by obtaining an update package, copying the original version to volatile memory, and updating the original version to provide an uncompressed updated version. The methods may also include compressing the uncompressed updated version so as to independently or interdependently compress each amount of uncompressed updated content and writing the compressed updated version in place of the original version in the storage device. Each of the independently compressed amounts may be written to a separate storage blocks.

41 Claims, 28 Drawing Sheets

METHODS AND SYSTEMS FOR UPDATING CONTENT INCLUDING A COMPRESSED VERSION

CROSS REFERENCE TO RELATED APPLICATIONS

This application claims the benefit of U.S. Provisional Patent Application No. 60/723,939, titled "Method and system for updating content stored in a storage device" and filed on Oct. 6, 2005, which is hereby incorporated by reference herein.

FIELD OF THE INVENTION

This invention relates to methods and systems for in-place updating content stored in a storage device. More specifically this application relates to in-place updating an original version of content to an updated version in a non volatile storage device including blocks, where the original version and/or the updated version are compressed on the storage device.

BACKGROUND OF THE INVENTION

It is sometimes required to update content stored in a storage device. For example, if the content is software, or a program (such as an executable file), it is sometimes required to fix a bug existing therein or introduce new features thereto. Yet, the latter example in non-limiting and other types of content may also require updates, such as text, data stored in a database, etc. Hereinafter the terms "old version" or "original version" refer to a version of content before update, and the terms "new version" or "updated version" refer to a version that includes already updated content. In other words, an original version includes "original content" while an updated version includes "updated content". It should be noted that updated content can be further updated. In case of a second update, for example, the updated content of the first update turns to be original content of the second update while new updated content is generated by the second update etc.

A process that updates original content yielding updated content is referred to as an "update process". The update process usually requires instructions, instructing it how to perform the update. Such instructions provided to the update process constitute together an "update package", wherein each instruction included therein constitutes an "update command". That is, an update process obtains an update package as input, and operates in accordance therewith in order to update the original content to updated content. This is non-limiting though and sometimes an update process can obtain more than one update package allowing it, together, to update the content. Alternatively, instead of obtaining an update package, the update process can sometimes retrieve an update package (or a set of update commands) from a storage device or from a database etc. Hence, hereinafter, when referring to the term "obtaining an update package" it should be appreciated that the update process can passively obtain the package, it can actively retrieve the package or sometimes it can activate a package embedded therein (e.g., a hard coded set of update commands).

One way to update an original version to an updated version is storing the updated version in the storage device in addition to the original version. For example, a computer program "prog.exe" is activated whenever a user presses a certain icon on the PC (Personal Computer) windows desktop. In order to update prog.exe it is possible to store the updated version of this file in a different location than the present (original) version, and then reset the path associated with the icon so as to activate the updated version instead of the original version. Later, when it is ascertained that the update process completed successfully, the original version can be deleted safely, releasing the space occupied thereby. In addition, this latter update method requires that the complete updated version be provided to the update process, e.g., in the update package. Such an update package easily becomes huge in size, and if it is required to transmit it to the updated device via band-width limited communication channels, transmittance may become cumbersome and sometimes even impossible. Therefore, it is preferable that the size of the update package be reduced.

Another update method can simply overwrite original content with updated content. This update method is risky and non-reliable, because if the update process fails in the middle of operating, when part of the original version is already overwritten, while only part of the updated version is written to the storage device, it is appreciated that the version stored on the storage device at the time of interruption is probably invalid or inoperable. In addition, the requirement to transmit the complete updated version is not yet solved with this method. Yet, it is noted that updating content by overwriting the original content with the updated content is commonly referred to in the art as "in-place update". Hereinafter, unless specifically noted, the term "update" is used to describe "in-place update".

One way for reducing the size of an update package is by including in it information representing the differences between the original and updated content. Such an update package is sometimes referred to also as a "difference", a "difference result" or a "delta". The update process, upon operating in accordance with a delta, applies it to the original content, hence producing the updated content.

The size of the delta being considered, there are methods trying to reduce the size thereof. For example, U.S. Pat. No. 6,546,552 ("Difference extraction between two versions of data-tables containing intra-references", published 2003) discloses a method for generating a compact difference result between an old program and a new program. Each program includes reference entries that contain references that refer to other entries in the program. According to the method of U.S. Pat. No. 6,546,552, the old program is scanned and for each reference entry, the reference is replaced by a distinct label mark, whereby a modified old program is generated. In addition, according to U.S. Pat. No. 6,546,552, the new program is scanned and for each reference entry the reference is replaced by a distinct label mark, whereby a modified new program is generated. Thus, utilizing directly or indirectly the modified old program and modified new program, the difference result is generated.

WO 2004/114130 ("Method and system for updating versions of content stored in a storage device", published 2004) discloses a system and method for generating a compact update package between an old version of content and a new version of content. The system of WO 2004/114130 includes a conversion element generator for generating a conversion element associated with the old version and new version. It also includes a modified version generator for generating a modified version, and an update package generator for generating the compact update package. The compact update package includes the conversion element and a modified delta based on the modified version and the new version.

WO 2005/003963 ("Method and system for updating versions of content stored in a storage device", published 2005) discloses a system and method for updating versions of content stored in a storage device. The system of WO 2005/

003963 includes an update module for obtaining a conversion element and a small delta. It also includes a converted old items generator for generating converted old items by applying the conversion element to items of an old version, a data entries generator for generating data entries based on the modified data entries and on the converted old item, and a new version generator for generating a new version of content by applying the commands and the data entries to the old version.

It was noted before that an update package is sometimes referred to as a delta, however, this is non-limiting, and as it appears from WO 2004/114130 and WO 2005/003963, the update package sometimes includes a delta therewith.

Other methods exist in the art, but before they are mentioned, several considerations should better be discussed. For example, it is appreciated that content is normally stored in a storage device. A storage device can be a volatile storage device (such as Random Access Memory, RAM) or a non-volatile storage device (such as a hard disk or flash memory).

There are storage devices that are organized in discrete areas, referred to, e.g., as blocks or sectors, wherein one block can include content belonging to more than one file. Hence, if there are, for example, two files stored in a storage device, a single block can include several ('x') bytes belonging to a first of the two files, as well as several ('y') bytes belonging to a second of the two files. If the size of a block is 'z' bytes, it is clear that $z>=x+y$. Yet, those versed in the art would appreciate that writing content into a block affects other content stored therein. That is, if it is required to re-write the content stored in the x bytes of the first file (e.g., during update thereof), due to storage device limitations it may be impossible to write only those x bytes, and it may be necessary to write the content of all the z bytes to the storage device. This can be done, for example, by reading content stored in the z bytes from the non-volatile storage device to a volatile storage device not including blocks, such as RAM, updating only the content stored in the x bytes in the volatile storage device (that is, the content of the other z-x bytes is left unaffected therein) and then writing the content of the z bytes back to the non-volatile storage device. This limitation characterizes flash memory devices, for example, wherein it is required to completely delete the present content of a block, before new content (including updated content) can be written thereto, and hard disks where it is not obligatory to delete the complete sector before writing data thereto, but it is required to write the complete content of a block in one writing operation (e.g., it is impossible to write only x bytes when leaving the content stored in the z-x bytes unaffected; In order to leave the z-x bytes unaffected, it is required to store the content thereof in the volatile memory device and write them back into the block, together with the x bytes). Hence, the update procedure may require many write operations to the storage device including blocks, and it is appreciated that in order to achieve an efficient update, the update should better be optimized. For example, if x equals, for example, two bytes, than these two bytes should better be updated together, instead of updating the first byte and then the second byte, writing these two bytes separately into the block.

Furthermore, when updating an original version (including original content) to an updated version (including updated content), there are sometimes update commands that use original content in order to generate updated content. For example, it is possible to copy original content to a different place in the storage device, wherein this copied content, in its destination place, forms part of the updated version. When copying content to a destination place it should be appreciated that this destination place could have been used before for storing other content (possibly also being part of the original version). Hence, the copied content can overwrite other original content. Still further, it is possible that there is another update command that uses the other original content in order to generate updated content. If this other update command is called further to operating in accordance with the first update command, the other original content can be already overwritten. This situation constitutes a "write before read conflict".

Write before read conflicts are a known problem in the art and U.S. Pat. No. 6,018,747 tries to cope therewith.

U.S. Pat. No. 6,018,747 ("Method for generating and reconstructing in-place delta files", published 2000) discloses a method, apparatus, and article of manufacture for generating, transmitting, replicating, and rebuilding in-place reconstructible software updates to a file from a source computer to a target computer. U.S. Pat. No. 6,018,747 stores the first version of the file and the updates to the first version of the file in the memory of the source computer. The first version is also stored in the memory of the target computer. The updates are then transmitted from the memory of the source computer to the memory of the target computer. These updates are used at the target computer to build the second version of the file in-place.

According to U.S. Pat. No. 6,018,747, when a delta file attempts to read from a memory offset that has already been written, this will result in an incorrect reconstruction since the prior version data has been overwritten. This is termed a write before read conflict. U.S. Pat. No. 6,018,747 teaches how to post-process a delta file in order to create a delta file, minimize the number of write before read conflicts, and then replace copy commands with add commands to eliminate conflicts. A digraph is generated, for representing the write before read conflicts between copy commands. A schedule is generated that eliminates write before read conflicts by converting this digraph into an acyclic digraph. Yet, U.S. Pat. No. 6,018,747 uses the delta file in order to backup, or protect, content overwritten during write before read conflicts. Hence, the delta file is enlarged.

Another known problem in the art occurs when a process of updating an old version is interrupted before its normal termination, such as in a power failure. In such a case, there is a possibility that the content of the block which was updated during the interruption may become corrupted and contain unexpected content.

It was already mentioned before that when updating blocks of content, an original content of a block sometimes forms part of the input used by the update process. In such a case, if the original block (which is corrupted due to interruption) is required, the update process may be unable to resume. It can be impossible to re-update the corrupted block.

U.S. Pat. No. 6,832,373 ("System and method for updating and distributing information", published 2004), for example, tries coping with the problem. It discloses devices, systems and methods for updating digital information sequences that are comprised by software, devices, and data. In addition, these digital information sequences may be stored and used in various forms, including, but not limited to files, memory locations, and/or embedded storage locations. Furthermore, the devices, systems, and methods described in U.S. Pat. No. 6,832,373 provide a developer skilled in the art with an ability to generate update information as needed and, additionally, allow users to proceed through a simplified update path, which is not error-prone, and according to U.S. Pat. No. 6,832,373's inventors, may be performed more quickly than through the use of technologies existing when U.S. Pat. No. 6,832,373 was filed.

That is, U.S. Pat. No. 6,832,373 describes using an auxiliary backup block, while all block update operations are performed thereby using two phases 'two-phase protocol' or 'two-phase commit'. According to U.S. Pat. No. 6,832,373, in a first phase of updating a block, the update process writes the updated content to the auxiliary backup block and verifies that the content is correctly stored. In a second phase, the update process writes the updated content into its target block to form the updated content of the updated block. Yet, variations of the same method exist, such as copying the original content of the updated block into the auxiliary backup block in the first phase, and in the second phase updating the target block to store the updated content.

Yet, the two phase commit (whether the backed up content is the original content or the updated content) is time consuming, since every write operation requires performing two operations (for the two phases). In addition, according to U.S. Pat. No. 6,832,373 every backup operation backups the complete (original or updated) content of a block in the auxiliary backup block, and hence if the number of blocks updated by the update process is n, the total number of operations required for the update process (including update operations and write operations into the auxiliary backup block) can not be smaller than 2n. If there are blocks into which content is written in more than one write operation, the number of operations that the update process is required to perform will be even larger than 2n.

There is a need in the art, thus, for a reliable and efficient mechanism for in-place updating original content of an original version, generating an updated version, where the original version and/or the updated version are stored compressed on a storage device.

SUMMARY OF THE INVENTION

According to the present invention, there is provided a method for in-place updating of an original version of content stored in a non-volatile storage device with storage blocks to yield an updated version of content, the method comprising: obtaining an update package; copying the original version or part thereof to volatile memory; updating the original version or part thereof to provide an uncompressed updated version or part thereof; compressing the uncompressed updated version or part thereof so as to compress independently each amount of uncompressed updated content; and writing the compressed updated version or part thereof in place of the original version or part thereof in the storage device, wherein each the independently compressed amount is written to a separate storage block.

According to the present invention, there is also provided a method for generating an update package for in place updating of an original version of content stored in a non-volatile storage device with storage blocks to yield an updated version of content, the method comprising: decompressing into virtual blocks any of the original and updated versions which comprised separate storage blocks for each independently compressed content; and simulating protection in a protection buffer of data required for performing transforming commands.

According to the present invention, there is further provided a method for in-place updating of an original version of content stored in a storage device with storage blocks to yield an updated version of content, the method comprising: obtaining an update package; copying the original version to volatile memory wherein if the original version includes content in more than one storage block which was compressed interdependently, then the copying includes decompressing the original version into volatile memory and protecting at least some content which is required for decompressing the original version; updating the original version to provide an uncompressed updated version; and copying the updated version back to non-volatile memory in place of the original version wherein if the updated version is to be stored compressed where blocks are compressed interdependently, then the copying includes protecting at least some content which is required for decompressing the updated version and compressing interdependently updated blocks, wherein at least one of the original version and the updated version includes content in more than one storage block which was compressed interdependently.

According to the present invention, there is provided a method for generating an update package for in place updating of an original version of content stored in a non-volatile storage device with storage blocks to yield an updated version of content, the method comprising: obtaining uncompressed old and uncompressed new versions of content; obtaining dependencies between storage blocks of any of old and new versions resulting from any of transforming commands and decompression of one or both versions; and simulating protection in a protection buffer of data required for performing any of transforming commands and decompressing one or both versions.

According to the present invention, there is also provided an apparatus for in-place updating of an original version of content stored in a non-volatile storage device with storage blocks to yield an updated version of content, comprising: a receiver configured to obtain an update package; an update module configured to copy the original version or a part thereof to volatile memory and configured to update the original version or a part thereof to provide an updated version or a part thereof; and a compression module configured to compress the updated version or a part thereof, if compressed, by interdependently compressing uncompressed amounts of the updated version, each of which will correspond to more than one storage block in the storage device, and protecting at least some content which is required for decompressing the updated version or by compressing independently each amount of uncompressed updated content which corresponds to a separate storage block; wherein the update module is also configured to write the compressed updated version or a part thereof in place of the original version or a part thereof in the storage device.

According to the present invention, there is further provided an apparatus for generating an update package for in place updating of an original version of content stored in a non-volatile storage device with storage blocks to yield an updated version of content, comprising: a decompression module configured to determine a correspondence between each storage block and an uncompressed virtual block and to determine decompression dependencies between blocks or configured to determine a correspondence between each storage block and an uncompressed virtual block which when independently compressed substantially equals a size of a storage block; and an update package builder configured to simulate protection in a protection buffer of data required for performing any of transforming commands and decompressing one or both versions.

According to the present invention, there is provided a program storage device readable by machine, tangibly embodying a program of instructions executable by the machine to perform method steps for in-place updating of an original version of content stored in a non-volatile storage device with storage blocks to yield an updated version of content, the method comprising: obtaining an update package; copying the original version or part thereof to volatile memory; updating the original version or part thereof to provide an uncompressed updated version or part thereof; compressing the uncompressed updated version or part thereof so as to compress independently each amount of uncompressed updated content; and writing the compressed updated version or part thereof in place of the original version or part thereof in the storage device, wherein each the independently compressed amount is written to a separate storage block.

According to the present invention, there is also provided a computer program product comprising a computer useable medium having computer readable program code embodied therein for in-place updating of an original version of content stored in a non-volatile storage device with storage blocks to yield an updated version of content, the computer program product comprising: computer readable program code for causing the computer to obtain an update package; computer readable program code for causing the computer to copy the original version or part thereof to volatile memory; computer readable program code for causing the computer to update the original version or part thereof to provide an uncompressed updated version or part thereof; computer readable program code for causing the computer to compress the uncompressed updated version or part thereof so as to compress independently each amount of uncompressed updated content; and computer readable program code for causing the computer to write the compressed updated version or part thereof in place of the original version or part thereof in the storage device, wherein each the independently compressed amount is written to a separate storage block.

According to the present invention, there is further provided a program storage device readable by machine, tangibly embodying a program of instructions executable by the machine to perform method steps for generating an update package for in place updating of an original version of content stored in a non-volatile storage device with storage blocks to yield an updated version of content, the method comprising: decompressing into virtual blocks any of the original and updated versions which comprised separate storage blocks for each independently compressed content; and simulating protection in a protection buffer of data required for performing transforming commands.

According to the present invention, there is provided a computer program product comprising a computer useable medium having computer readable program code embodied therein for generating an update package for in place updating of an original version of content stored in a non-volatile storage device with storage blocks to yield an updated version of content, the computer program product comprising: computer readable program code for causing the computer to decompress into virtual blocks any of the original and updated versions which comprised separate storage blocks for each independently compressed content; and computer readable program code for causing the computer to simulate protection in a protection buffer of data required for performing transforming commands.

According to the present invention, there is also provided a program storage device readable by machine, tangibly embodying a program of instructions executable by the machine to perform method steps for in-place updating of an original version of content stored in a storage device with storage blocks to yield an updated version of content, the method comprising: obtaining an update package; copying the original version to volatile memory wherein if the original version includes content in more than one storage block which was compressed interdependently, then the copying includes decompressing the original version into volatile memory and protecting at least some content which is required for decompressing the original version; updating the original version to provide an uncompressed updated version; and copying the updated version back to non-volatile memory in place of the original version wherein if the updated version is to be stored compressed where blocks are compressed interdependently, then the copying includes protecting at least some content which is required for decompressing the updated version and compressing interdependently updated blocks; wherein at least one of the original version and the updated version includes content in more than one storage block which was compressed interdependently.

According to the present invention, there is further provided a computer program product comprising a computer useable medium having computer readable program code embodied therein for in-place updating of an original version of content stored in a storage device with storage blocks to yield an updated version of content, the computer program product comprising: computer readable program code for causing the computer to obtain an update package; computer readable program code for causing the computer to copy the original version to volatile memory wherein if the original version includes content in more than one storage block which was compressed interdependently, then the copying includes decompressing the original version into volatile memory and protecting at least some content which is required for decompressing the original version; computer readable program code for causing the computer to update the original version to provide an uncompressed updated version; and computer readable program code for causing the computer to copy the updated version back to non-volatile memory in place of the original version wherein if the updated version is to be stored compressed where blocks are compressed interdependently, then the copying includes protecting at least some content which is required for decompressing the updated version and compressing interdependently updated blocks; wherein at least one of the original version and the updated version includes content in more than one storage block which was compressed interdependently.

According to the present invention, there is provided a program storage device readable by machine, tangibly embodying a program of instructions executable by the machine to perform method steps for generating an update package for in place updating of an original version of content stored in a non-volatile storage device with storage blocks to yield an updated version of content, the method comprising: obtaining uncompressed old and uncompressed new versions of content; obtaining dependencies between storage blocks of any of old and new versions resulting from any of transforming commands and decompression of one or both versions; and simulating protection in a protection buffer of data required for performing any of transforming commands and decompressing one or both versions.

According to the present invention, there is also provided a computer program product comprising a computer useable medium having computer readable program code embodied therein for generating an update package for in place updating of an original version of content stored in a non-volatile storage device with storage blocks to yield an updated version of content, the computer program product comprising: computer readable program code for causing the computer to obtain uncompressed old and uncompressed new versions of content; computer readable program code for causing the computer to obtain dependencies between storage blocks of any of old and new versions resulting from any of transforming commands and decompression of one or both versions; and computer readable program code for causing the computer to simulate protection in a protection buffer of data required for performing any of transforming commands and decompressing one or both versions.

BRIEF DESCRIPTION OF THE DRAWINGS

In order to understand the invention and to see how it may be carried out in practice, a preferred embodiment will now be described, by way of non-limiting example only, with reference to the accompanying drawings, in which.

DETAILED DESCRIPTION OF EMBODIMENTS

Figure 1:
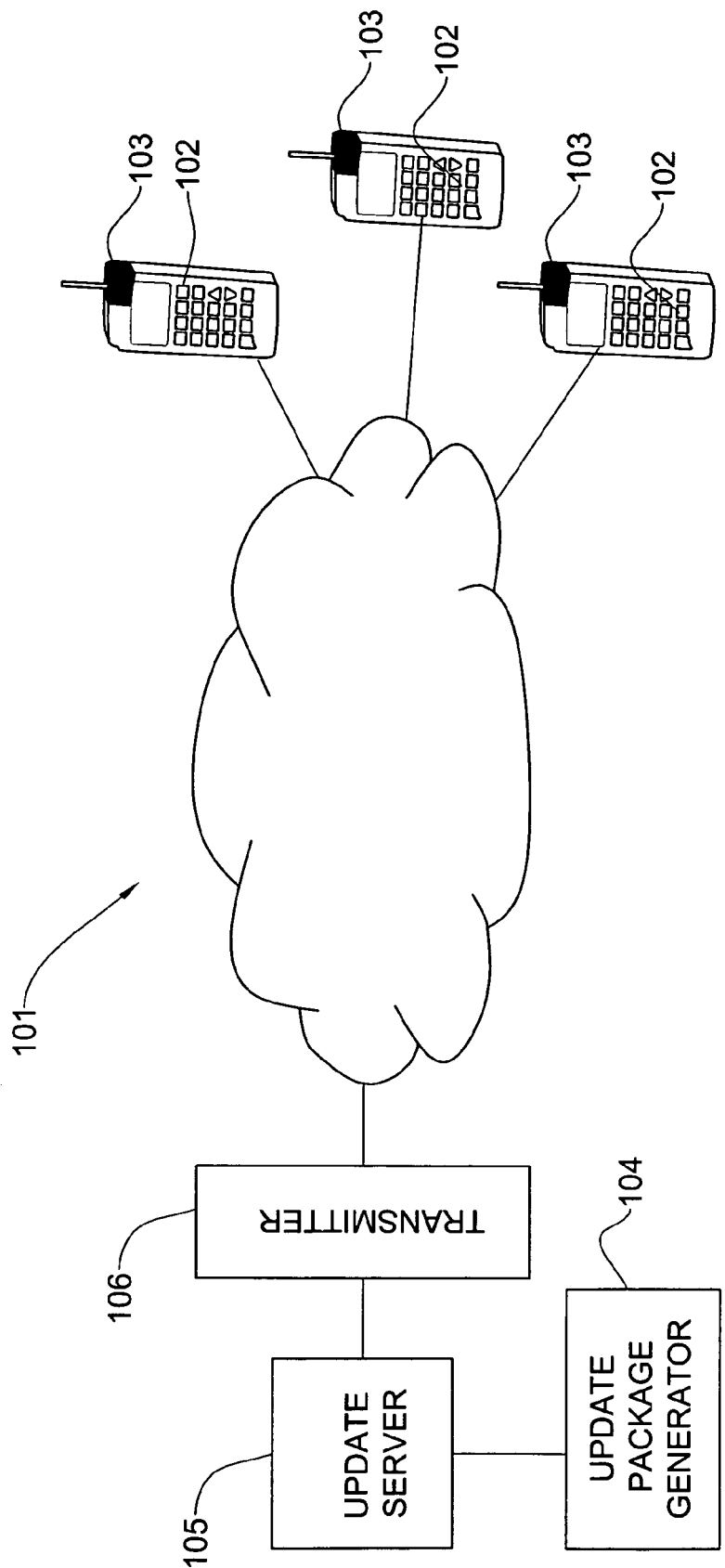
FIG. 1 is a schematic illustration of a system for updating versions in a cellular network, in accordance with one embodiment of the invention.

In the following description components that are common to more than one figure will be referenced by the same reference numerals.

Furthermore, unless specifically noted, the term "update" is used hereinafter to refer to "in-place update".

FIG. 1 is a schematic illustration of a system 101 for updating versions in a cellular network, in accordance with one embodiment of the invention. Cellular telephones 102 that are coupled to or include storage devices 103, execute programs that enable their operation. Programs are normally stored in files. The version of the program currently executing on a cellular telephone is referred to, hereinafter, as an "old version" or as an "original version".

It is noted that memory devices, such as the storage devices 103, are sometimes referred to also as "memory devices" or "memory units".

Sometimes there is a need to update the programs in order for a telephone 102 to execute a newer version thereof, constituting an "updated version" or a "new version". Such an updated version is generated by an update process operating in the telephone. The update process operates in accordance with an update package (constituting a "delta file") that the telephone receives.

According to the invention, an update package is generated in an update package generator 104, operating, for example, in a personal computer (PC) or in any other type of computer. The update package is stored in an update server 105 and transmitted, via a transmitter 106 to the cellular telephones 102.

It should be noted that the system 101 illustrated in FIG. 1 is a non-limiting example and the invention is not limited to updating programs. Many other types of content stored in storage devices require update, such as data stored in databases, files stored in the storage device etc. Therefore, hereinafter the term "content" will be used instead of "program".

In the same way, the invention is not limited to cellular networks and/or to cellular telephones 102. It should be appreciated that cellular telephones belong to a group referred to as embedded devices. There are other embedded devices, such as Personal Digital Assistants (PDAs), set-top boxes and other consumer electronic devices that are coupled to storage devices for storing content, and sometimes it is required to update the content stored therein. Yet, it is possible to update also content stored in storage devices coupled to non-embedded devices, such as PCs or other computers. Therefore, the storage devices 103 can be, for example, hard-disk drives, Flash-memory devices, EPROMs (Erasable Programmable Read-Only Memory) and EEPROMs (Electrically EPROM) or any other storage device.

For example, a PC, or any other computer, can store files that include data required for its operation or for operation of programs executing therein (such as "info files" or "dot files" known for those versed in the art). Sometimes it is required to update this data, for example, via communication lines, e.g., via the Internet or via any other communication means.

Understanding this, instead of using terms such as "telephones", "PDAs" "consumer electronic devices", "computers", "PCs", etc., the term "updated devices" will be used hereinafter, and it should be noted that the term "updated device" can refer to any device that is coupled to a storage device and allows updating content stored therein.

It was previously explained that in order to update content stored in the storage devices, update packages are generated, stored in the update server 105 and conveyed to the updated devices (such as the cellular telephones 102) and the storage devices coupled therewith. Alternatively, it is possible to convey an update package without storing it first in an update server 105. For example, it is possible to convey the update package directly from the update package generator where it is generated. In such a case the machine where the update generator operates, or the update generator itself is considered as the update server 105.

Furthermore, in the example illustrated in FIG. 1 the update package is conveyed via the transmitter 106. This is also non-limiting and any other way applicable for conveying the update package can be used. For example, it is possible to store the update package on a portable storage device, such as a floppy disk or disk-on-key thus allowing an updated device (such as the telephones 102) to access the update package by reading it therefrom.

When an updated device receives an update package, it can operate an update process in accordance with the update package, wherein the update process updates the original version for generating an updated version. It should be noted that the updated device can operate the update process immediately after receiving the update package. Alternatively it can store the update package in a non-volatile memory, such as in the storage device 103, and operate the update process at some later time (such as the next time the updated device reboots).

It is noted that a storage device can store content of more than one original and/or updated version. For example, it is appreciated that there can be several computer programs installed in a single hard disk.

In many cases a file is constituted of logically sequential content. For example, in a file including text, wherein the text is "123456789", the character '2' is logically consecutive to the character '1', the character '3' is logically consecutive to the character '2', etc. However, those versed in the art would appreciate that when storing this file in a storage device, the stored file, or the content included therein can be fragmented, i.e., different portions of the file can be stored in different portions, or blocks, of the storage device. In other words, a logically sequential content is not necessarily stored in a physically sequential manner in the storage device.

Bearing in mind that a logically sequential content is not necessarily stored in a physically sequential manner in the storage device and/or that the size of the logically sequential content can be larger than the size of a block, it should be appreciated that logically sequential content can be spread over several storage blocks. Furthermore, one storage block can include content belonging to several logically sequential contents (such as several files). Returning now to the previous example, where the text "123456789" constitutes logically sequential content, it should be appreciated that the content "1234" can be stored in one physical block, while the content "56789" in this example can be stored in a different physical block that physically precedes the block where "1234" is stored (yet it is clear that logically the content "1234" precedes the content "56789").

The logically sequential text "123456789" will be further considered as an original version. According to the example, it is possible to update this file to include an updated version, wherein the text stored in the updated version is "123756489". In this updated version the characters '4' and '7' were switched, compared to their position in the original version. In other words, the character '7' in the updated version replaces the character '4' that appears in the original version, while the character '4' replaces the character '7'. It should thus be appreciated that in order to generate this updated version, it is possible, e.g., to divide the original version into several segments (each segment constitutes a "logical block"). The first segment includes the content "123", the second segment's content is "4", the third segment includes "56", the fourth includes "7" and the fifth includes "89". When generating the updated version, the first, third and fifth segments are left intact, while the content of the second and fourth segments are switched. Thus, a segment includes logically sequential content.

The previous example of the "123456789" text and the update thereof to the updated version "123756489" is a simplified example. In other examples it is possible to divide the content into segments that occupy physically sequential area in one or more physical blocks. Thus, if "123" is fragmented in a way where "12" is stored in a first block, while "3" is stored in a second block, wherein "12" does not sequentially precede "3", then according to this example "123", although logically sequential, should be divided into two segments (specifically these are "12" and "3").

In this latter example the segment "12" can yet reside on two different blocks, as long as the blocks are sequential (a first block sequentially preceding a second block) and as long as the character '1' is stored in an area ending the first block while the character '2' is stored in the area opening the second block.

This latter example is non-limiting. For example, an alternative embodiment can limit a segment to occupy physically sequential area in one physical block (unlike "one or more" in the previous example). Thus, if "12" is sequentially stored in two sequential blocks it must be further divided into two segments (one is "1" and the second is "2").

In addition, moving a segment or leaving it intact are not the only behaviors, or transformations, that are allowed. For example, it is possible to delete a segment or to perform a calculation on the content stored therein. Thus, instead of switching the "4" and "7" segments in the "123456789" example, it is possible to add 3 to the numerical value corresponding to the content of the "4" segment (4 plus 3 yield 7) Similarly, it is possible to subtract 3 from the numerical value corresponding to the content of the "7" segment (7 minus 3 yield 4). In accordance with this case, "4" and "7" are still considered segments in the original version.

When content of a segment in the updated version (an "updated segment") corresponds to content of a segment in the original version (an "original segment"), these segments are considered as "corresponding segments" or "matched segments". Correspondence refers to any logical or arithmetic connection between the segments, wherein the updated segment can be a copy of the original segment, it can be a modified copy of the original segment (e.g., it is sometimes preferred to copy the content of a segment and then modify part or all of the copied content), it can include content received by computing the content of the updated segment based on content of the original segment, etc.

It is noted that sometimes there may be more than one updated segment corresponding to a certain original segment (e.g., the content of the original segment is copied twice, thus generating two updated segments corresponding thereto). The opposite is also true: Sometimes there may be more than one original segment corresponding to a single updated segment (e.g., in order to calculate the content of a single updated segment it is possible to use content stored in two distinct original segments).

Figure 2A:
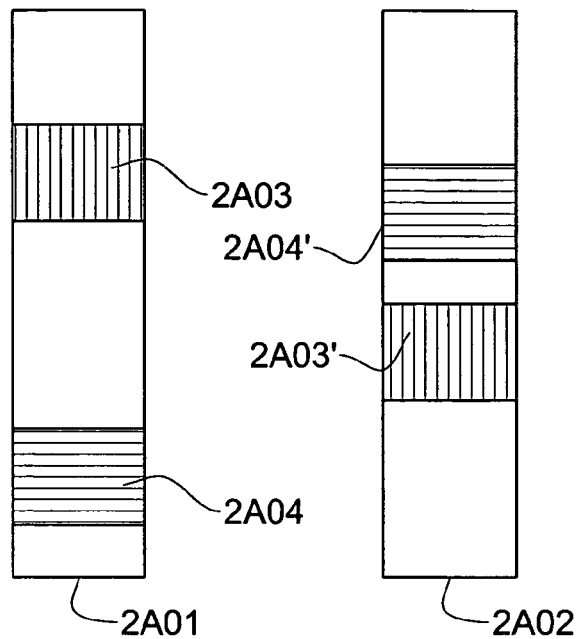
FIG. 2A illustrates an example of an original and updated versions having corresponding segments.

FIG. 2A illustrates a portion of a storage device wherein an original 2A01 and updated 2A02 versions have corresponding segments. According to this example, two segments 2A03 and 2A04 in the original version 2A01 correspond to segments 2A03' and 2A04', in the updated version 2A02, respectively, and vice versa: the segments 2A03' and 2A04' correspond to segments 2A03 and 2A04. According to this example, the content of the segment 2A03 is similar to the content of segment 2A03' and the content of the segment 2A04 is similar to the content of segment 2A04', although the segments 2A03' and 2A04' are positioned in the storage device differently (i.e., in different addresses) than the segments 2A03 and 2A04. According to the specific example, apart from changing the segments' positions, the relative order is also changed. That is, segment 2A03 physically precedes segment 2A04 in the storage device, but segment 2A04' physically precedes segment 2A03'.

Figure 2B:
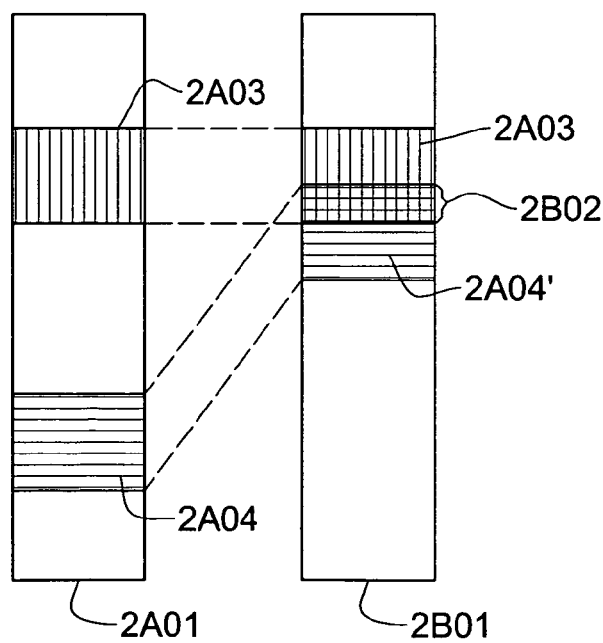
FIG. 2B illustrates how an ambiguous portion or a segment is formed when updating the original version of FIG. 2A to the updated version thereof.

FIG. 2B illustrates how an ambiguous portion of a segment is formed when updating the original version 2A01 of FIG. 2A to the updated version 2A02 thereof. According to this example, the content of segment 2A04 is moved before moving the content of segment 2A03, thus generating an intermediate version 2B01 in the storage device. It is illustrated by the intermediate version 2B01 that part of segment 2A04' overlaps part of segment 2A03, still positioned in its original position. Therefore, content of segment 2A04' overwrites part of segment 2A03's content. The overlapped original content of the segment's portion 2B02, being part of 2A03, is lost. This segment's portion (2B02) illustrates an "ambiguous portion", caused by an overlap, and it represents a "conflict" between two segments.

A conflict such as the conflict illustrated in FIG. 2B is known in the art as "write-before-read conflict". In a general manner, a write-before-read conflict arises when an original segment or a portion thereof, still required by the update process for further updating segments (such as segment 2A03 whose original content is required for the generation of segment 2A03's content), is being altered or lost before it is being used (in the example it is before copying the content of segment 2A03 for generating segment 2A03'). Unless otherwise noted, the term "conflict" is used below to refer, in short, to the term "write-before-read conflict".

Figure 2C:
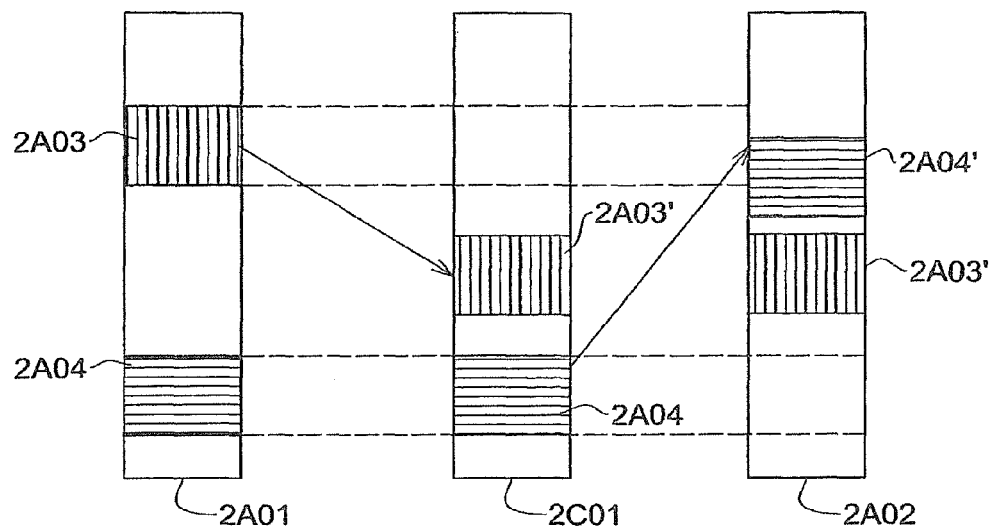
FIG. 2C illustrates one way, known in the art, to solve the write-before-read conflict of FIG. 2B.

It is currently known in the art that the content of segment 2A03 can be protected from conflict by copying it to its new position (that is, to segment 2A03'), before the content of segment 2A04' overwrites it, as illustrated in the example of FIG. 2C. An intermediate version 2C01, includes the original segment 2A04 and the updated segment 2A03', and then the content of segment 2A04 can be safely moved to its new position (segment 2A04') in the new version 2A02. FIGS. 2A, 2B and 2C provide an example of a copy-cycle for which a correct copy order can resolve conflicts.

Figure 2D:
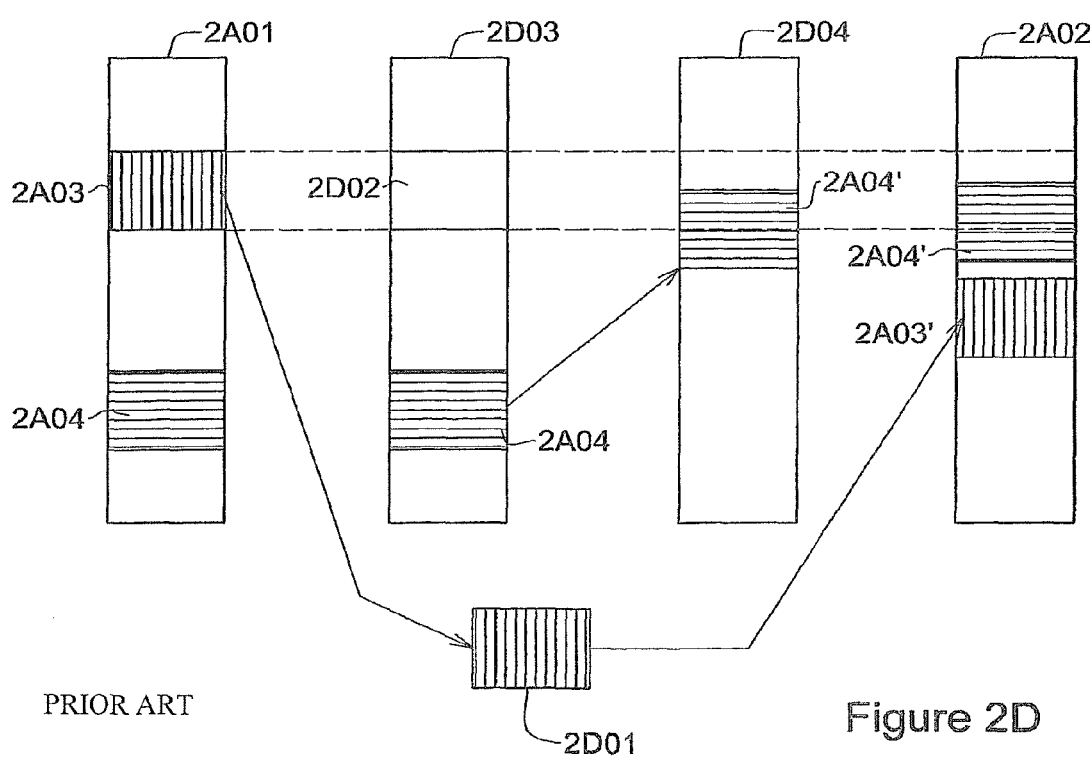
FIG. 2D illustrates an alternative way, known in the art, to solve the write-before-read conflict of FIG. 2B.

In an alternative example, illustrated in FIG. 2D, the content of segment 2A03 is copied to a memory area 2D01, named "backup buffer", "backup storage" or "protection buffer", turning the original content stored in the segment 2A03 into redundant content or released content, while the segment, or area, previously occupied by the released content is referred to as a "released area", marked in the intermediate version 2D03 as 2D02. This allows copying the content of segment 2A04 to its new position 2A04' that partially overlaps the released area 2D02 without overwriting the content of segment 2A03, as illustrated by the intermediate version 2D04. Now it is possible to copy the content of segment 2A03 (or more accurately, the copy thereof) from the protection buffer 2D01 into its position in the updated version, i.e., into updated segment 2A03' of the updated version 2A02. It is noted that according to the present example, the protection buffer is a storage area available to the update process, that is, this storage area does not include the area used for storing the original and/or updated content, not the storage area used for storing the update package.

Figures 3A, 3B:
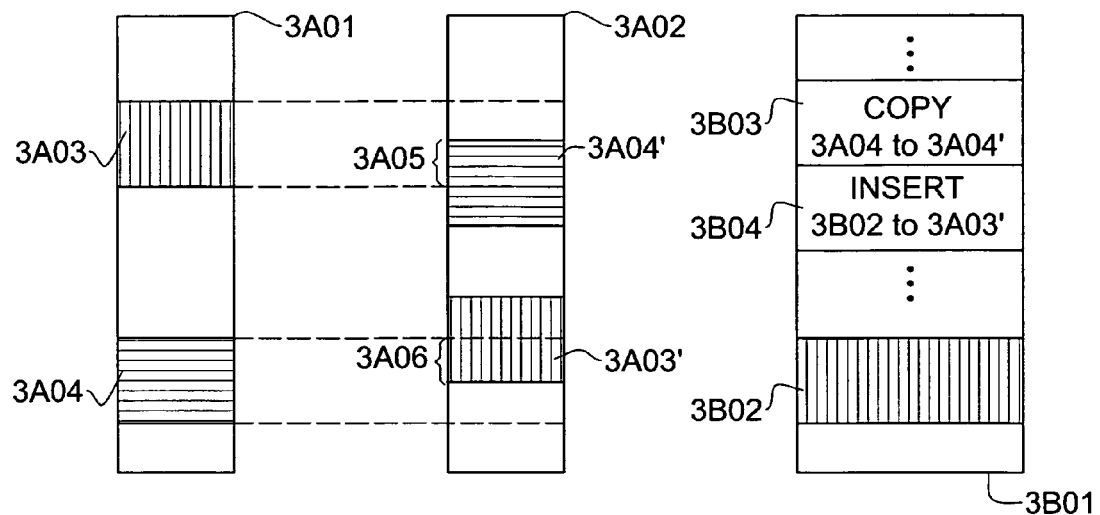
FIG. 3A illustrates another example of an original and updated versions having corresponding segments.
FIG. 3B illustrates an update package adapted for updating the original version of FIG. 3A to the updated version thereof.

FIG. 3A illustrates another example of an original version 3A01 and updated version 3A02 having corresponding segments 3A03, 3A04 and 3A03', 3A04' respectively. Similar to FIG. 2A, the updated segment 3A04' conflicts with original segment 3A03, illustrated by the ambiguous portion 3A05. However, unlike the example of FIG. 2A, here there is also a conflict between the updated segment 3A03' and the original segment 3A04, illustrated by the ambiguous portion 3A06. Therefore, a person versed in the art will appreciate that the solution of FIG. 2C, that is, changing the copy order, is not applicable here. It is noted that the example of FIG. 3A allows no copy order that can avoid the illustrated write-before-read conflicts.

FIG. 3A provides an example of a copy-cycle for which a correct copy order for resolving conflicts does not exist. It should be appreciated that other copy-cycles may exist, where there are more then two segments involved ("multiple-copy-cycles"). Even in such multiple-copy-cycles there is sometimes no conflict-resolving copy order. For example, a copy-cycle of four segments (A, B, C and D) could be created in the following way: updated A conflicts with original B, updated B conflicts with original C, updated C conflicts with original D and updated D conflicts with original A. It is appreciated that this copy cycle allows no conflict-resolving copy order.

U.S. Pat. No. 6,018,747, for example, tries to cope with read-before-write conflicts by identifying copy cycles, re-dividing the updated version into segments in a way that full segments conflict with other segments (thus giving rise to "ambiguous segments"), and replacing conflicting copy commands with add commands (add commands are sometimes referenced as "insert commands"). An add command requires that added, or inserted data will be available in the update package. Therefore, while replacing a copy command with an add command, the previously copied, now inserted content is inserted into the update package, thus enlarging its size.

It is appreciated that according to a different approach, the update process updating the original version 3A01 to the updated version 3A02 can use a method similar to the one illustrated in FIG. 2D for resolving the conflicts. More specifically, it can use a protection buffer for storing copies of the original conflicting segments.

It is noted that after determining that a conflict exists, it is possible to re-divide the segments in a way similar to U.S. Pat. No. 6,018,747, but instead of storing the original content of the ambiguous segment in the update package, it can be stored in a protection buffer.

FIG. 3B illustrates an update package 3B01 adapted for updating the original version 3A01 of FIG. 3A to the updated version 3A02 thereof. The update package 3B01 includes 3B02, a portion that includes content similar to the content of original segment 3A03, thus rendering the original content of segment 3A03 redundant. Now the update process can safely copy the content of segment 3A04 to its updated position, the corresponding segment 3A04', in accordance with the update command 3B03. After storing the copy of the original segment 3A04 in the updated segment 3A04', the content of segment 3A04 becomes redundant too, thus allowing the update process to overwrite it with the content stored in 3B02, which is a copy of the original content of segment 3A03. This is done, according to the current example, in accordance with the insert command 3B04 of the update package 3B01.

It should be noted that when there are multiple conflicts, it may be desired to select one of the conflicts to be resolved before resolving the other conflicts. The selection can be guided by optimization criteria. For example, the size of the protected segment can be used as an optimization criterion. If the size of the original segment 3A04 is smaller than the size of the original segment 3A03, then it may be desired to store a copy of segment 3A04's content, instead of storing a copy of the content stored in 3A03 as illustrated in FIG. 3B. Furthermore, instead of storing a copy of content stored in at least one conflicting segment, it is possible to store a copy of content stored in at least one ambiguous portion. If the sizes of the ambiguous portions are used as an optimization criterion, then according to the example it is possible to try storing only these (one or more) ambiguous portions whose size is smaller.

Figure 3C:
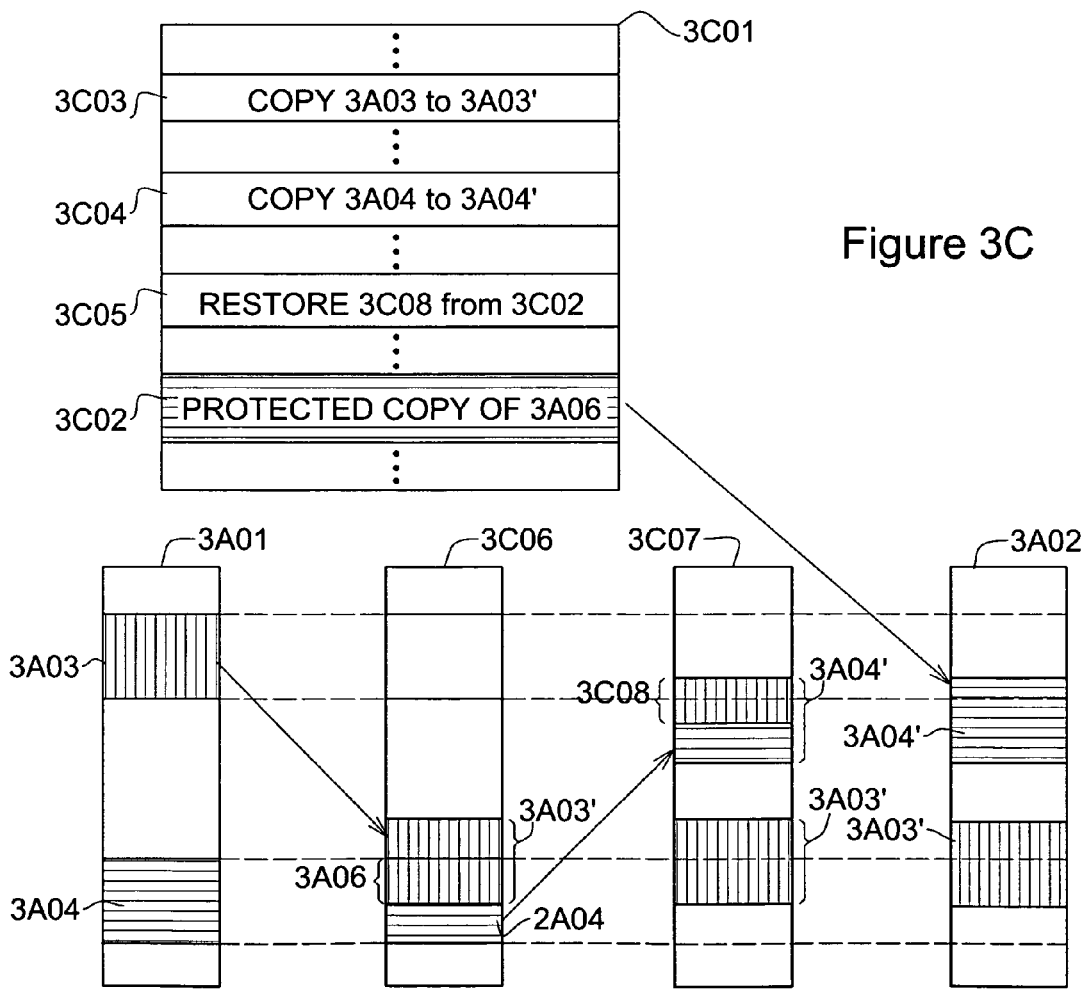
FIG. 3C illustrates updating the original version of FIG. 3A to the updated version thereof.

FIG. 3C illustrates updating the original version 3A01 of FIG. 3A to the updated version 3A02 thereof. While generating an update package 3C01, because the size of the ambiguous portion 3A06 is smaller then the size of the ambiguous portion 3A05, a copy of the original content of this ambiguous portion 3A06 is inserted into the update package (see 3C02). It is noted that 3C02 protects the content of portion 3A06, and hence it allows deleting (or modifying) the content thereof. Having done this, the update package 3C01 includes the following update commands: The update command 3C03 instructs the update process to copy the original content of 3A03 to generate the updated content of segment 3A03', overwriting portion 3A06 of segment 3A04, yet, the original content of portion 3A06 is protected by 3C02. Segment 3A03 becomes now a released segment; The update command 3C04 instructs the update process to copy the content of 3A04 to 3A04' (it is noted that the content copied in accordance with this command includes also a portion of the content stored in segment 3A03', that is, it includes a copy of the content that overwrote portion 3A06 as illustrated in the figure, represented by portion 3C08); and the update command 3C05 instructs the update process to insert the content stored in 3C02 (i.e., content similar to the original content of portion 3A06), into 3C08, for restoring the content of 3A04'. The insert command 3C05 is a "restoration update command" or shortly, a "restoration command" and in the figure it is represented as "restore" in order to emphasize this. Yet, it is noted that 3C05 could be an insert command (like 3B04 in FIG. 3B).

It is noted that this example assumes that the update is performed in accordance with a certain sequence (constituting an "update sequence"), wherein 3A03 is copied to 3A03', then 3A04 is copied to 3A04' and then 3C08 is restored. In this case the update sequence is influenced by the size of the ambiguous portion 3A06, which is smaller than the size of the ambiguous portion 3A05, and hence an update package including a copy thereof is smaller than an update package including a copy of 3A05.

Those versed in the art will appreciate that a variation of this example (i.e., the example of FIG. 3C) would avoid copying the original content of the whole segment 3A04 to generate the updated segment 3A04', followed by overwriting a portion thereof (3C08) by the protected content of 3C02 for restoring the content of 3A04'. It is possible to divide each of the two segments 3A03 and 3A04 into two segments, one that generates conflict (an ambiguous segment) and one that does not.

Figure 3D:
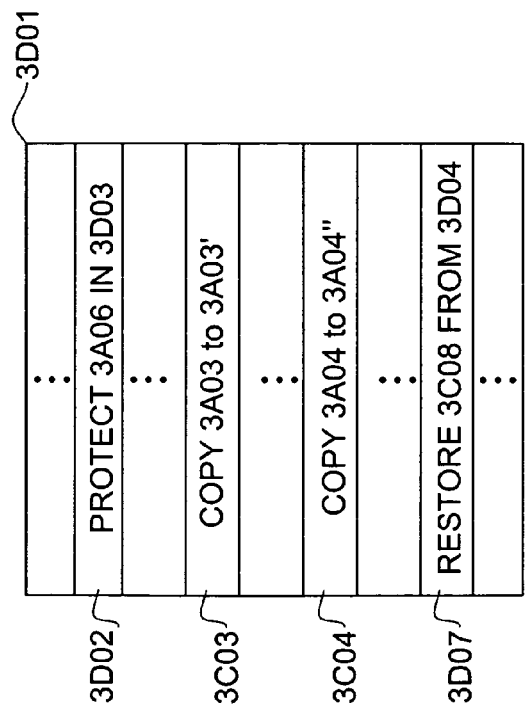
FIG. 3D illustrates updating the original version of FIG. 3A to the updated version thereof.
Figure 3D:
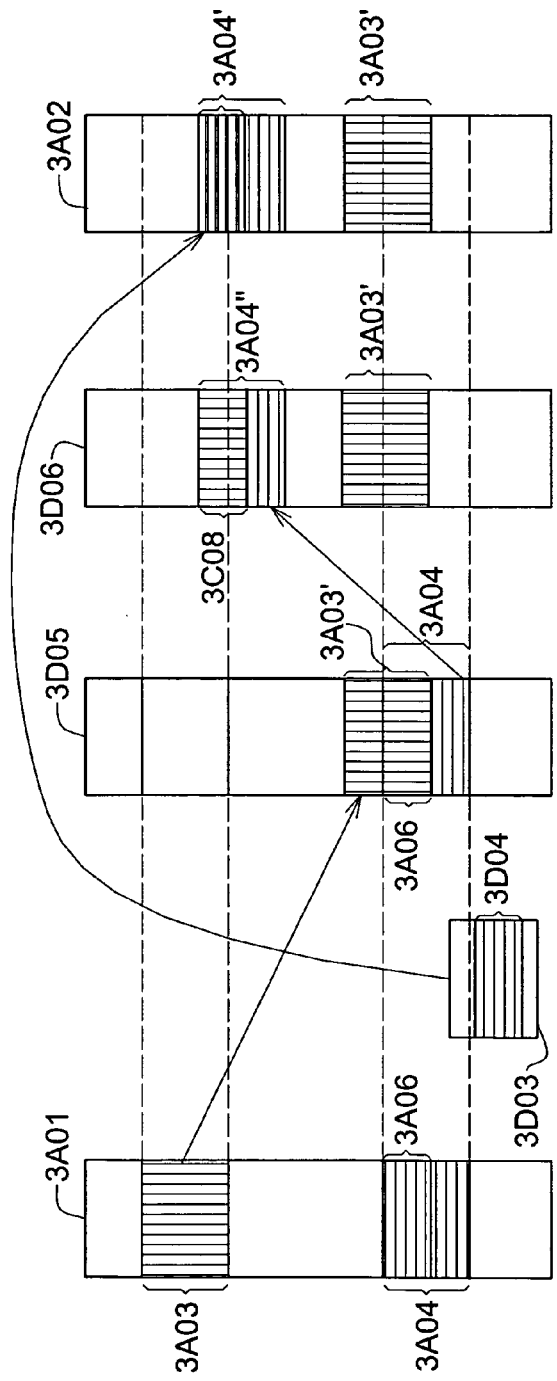

FIG. 3D illustrates yet another example for updating the original version 3A01 of FIG. 3A to the updated version 3A02 thereof. According to this example, content that needs to be protected from conflicts is stored in a protection buffer in the storage device.

It was already illustrated that according to this example there is a need to protect content of only one ambiguous portion. Again, this would be the ambiguous portion whose size is smaller than the other. In this case this would be the ambiguous portion 3A06.

When generating an update package 3D01, an update command 3D02 is inserted thereto, instructing the update process to store a copy of the original content of the ambiguous portion 3A06 in a protection buffer 3D03, protecting its content thereby. The command 3D02 constitutes a "backup command", a "protection update command", or shortly, a "protection command". The update process needs to perform this command before overwriting portion 3A06 with content of the segment 3A03'. The operation performed by the update process in accordance with a protection command is referred as a "protection operation", "protect operation" or "backup operation" and it is noted that instead of using an explicit "protect" update command, a "copy" command could have been used.

When operating in accordance with the update command 3D02, the update process copies the content of portion 3A06 into the protection buffer 3D03, thus generating a protected portion 3D04. At this stage, the update process can safely operate in accordance with the update command 3C03 and copy the original content of 3A03 to the segment 3A03', overwriting the content of the ambiguous portion 3A06, whose original content is protected in the protection buffer 3D03. The version in the storage device becomes an intermediate version 3D05.

Following this, the update process can operate in accordance with the update command 3C04, and copy the content of segment 3A04 to its new position 3A04" in the intermediate version 3D06. It should be noted that at this stage the portion 3A06 includes content that was originally part of 3A03. Thus, when copying 3A04 to 3A04", a small portion of the original content of 3A03 is copied too, as illustrated by the portion 3C08. It is noted that the size of the portion 3C08 is similar to that of the ambiguous portion 3A06.

In order to generate the expected content of segment 3A04', the update process is required to restore the content of 3C08 to be similar to the original content of segment 3A06. In order to do so, the update process operates in accordance with the update command 3D07, thus copying the protected content of 3D04 to replace the content of the portion 3C08, thus giving rise to the expected content of segment 3A04'. It is noted that 3D07 is another example of a restoration command yet a copy command could have been used instead.

It was illustrated thus that sometimes original content needs to be protected (e.g., by storing a copy thereof in a protection buffer) before overwriting it with content of another segment. However, this in non-limiting and there are other circumstances requiring protection of original content. For example, the content of a segment (or a portion thereof) is sometimes modified during update. Yet, there may be other segments whose update requires the original content of the modified segment. For example, an original segment ("segment A") originally stores a number (such as 2), wherein the updated content thereof stores a different number (such as 4). The size of the updated content in this case stays similar to that of the original content. However, there may be another segment or portion thereof ("segment B") whose update requires, e.g., to add the value stored in the original segment A to a number stored in the original segment B, wherein the result of the addition is stored in the updated segment B. Even though the position of the updated segment A (or the portion storing the number in it) is kept similar to the position of the original segment A, indeed its content is changed (the original 2 is replaced by 4). Thus, by updating segment B after updating segment A, the update process must avoid using the updated content of segment A. This can be done by storing the original content of segment A in the protection buffer (or in the update package), thus protecting the original content of segment A.

It should be noted that the updated segment A in this non-limiting example corresponds to the original segment A. In addition, the updated segment B corresponds to both the original segment A and the original segment B.

Returning to the figures, it is noted that both the update packages 3C01 and 3D01 of FIGS. 3C and 3D, respectively, are referred to as conflict resolving update packages. However, when comparing the two examples illustrated in FIGS. 3C and 3D, it is noted that the update package 3D01 includes more update commands compared to the update package 3C01, as it includes also the backup update command 3D01. Backup commands may backup large quantities of content, and therefore they may slow down the update process. The embodiment of FIG. 3C does not require backup commands to be inserted into the update package 3C01, and therefore they allow the update process to be faster. On the other hand, the update package 3C01 is used for storing the protected data instead of the protection buffer 3D03, and therefore, as long as the size of the protected data is larger than the size of the respective backup command, the update package 3C01 is larger in size than the update package 3D01. Remembering that the update packages are conveyed to the updated devices, e.g., by transmitting them over communication lines, a larger update package may be a limitation.

Figure 4:
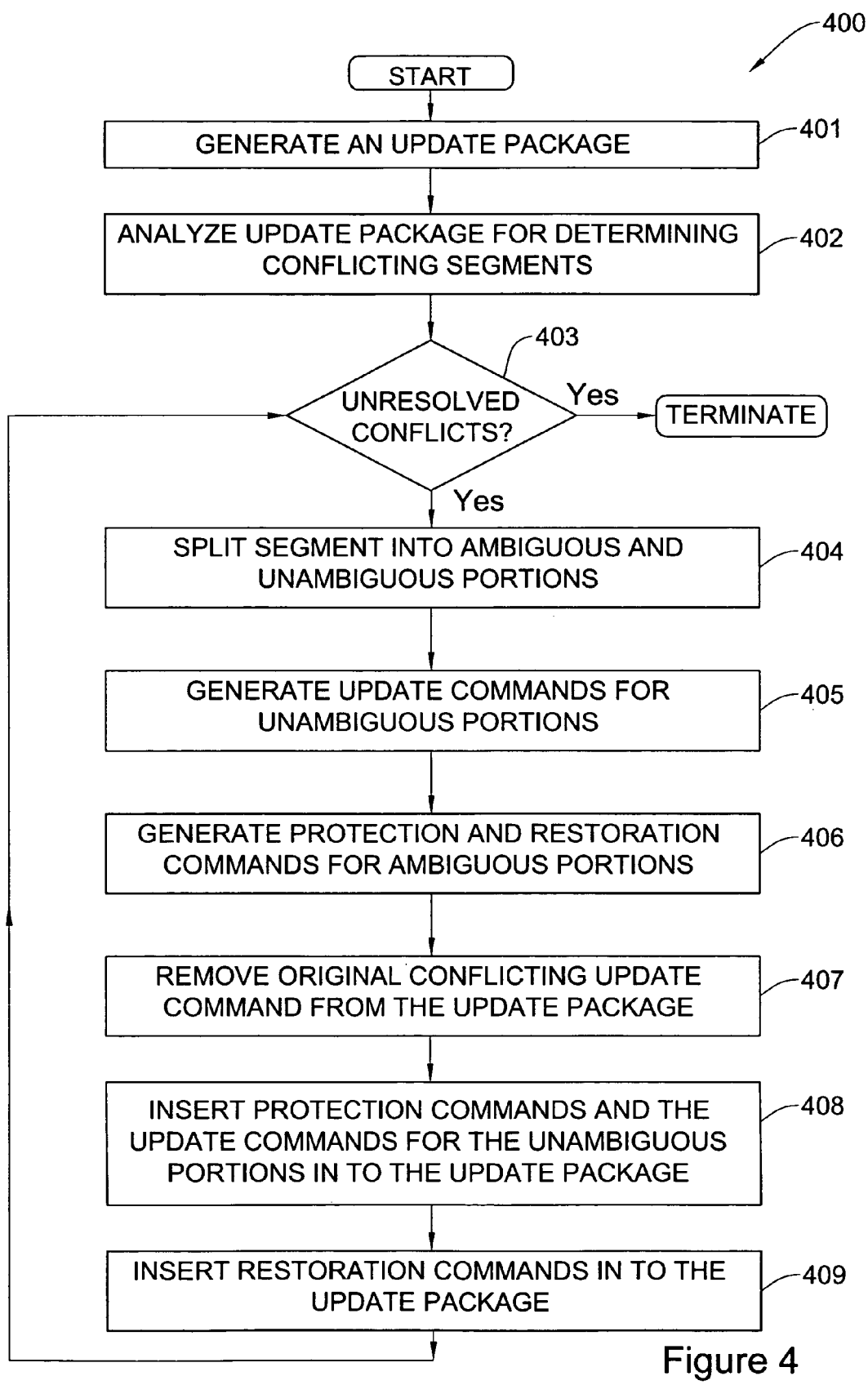
FIG. 4 is a flowchart illustrating generation of a conflict resolving update package.

FIG. 4 is a flowchart illustrating generation of a conflict resolving update package. The flowchart corresponds to embodiments using a protection buffer for protecting content of conflicting segments. In 401 an update package is obtained. The update package can be generated by any way known in the art (see, for example, U.S. Pat. No. 6,546,552, WO 2004/114130, WO 2005/003963 and diff). The update package can be generated during 401 in order to form a basis for the presently referenced flowchart (of FIG. 4), or it can be pre-generated and obtained by any available method (such as reading it from a storage device, receiving it from communication lines, via inter-process communication, etc.). Then, in 402, the update package is analyzed in order to identify segments which form conflicting segments. This can be done by constructing a digraph and identifying cycles (or in other words, "copy-cycles") therein, as described, e.g., by U.S. Pat. No. 6,018,747. It is noted that conflicting segments include ambiguous portions whose sizes can be similar or smaller than the size of their respective segments, thus leaving zero or more unambiguous portions in the segments.

The unresolved conflicts are handled one after the other, as indicated by 403. In 404 a selected segment that includes an ambiguous portion is split into ambiguous and unambiguous portions, thus giving rise to two segments, one ambiguous and one unambiguous. It is noted that sometimes a segment includes more than two portions (more than one ambiguous and/or more than one unambiguous). For example, when the ambiguous portion is in the middle of the segment, there can be at least two unambiguous portions and one ambiguous portion. In such a case the segment would be split into more than two segments.

In 405 a new update command is generated for each of the unambiguous segments, and in 406 a protection command and a restoration command are generated for each ambiguous segment. In 407 the original update command that generated the conflict is removed from the update package and in 408 the new update commands, as well as the protection commands are inserted into the update package, replacing the removed update commands. In 409 the restoration commands are inserted into the update package, instead of the insertion commands inserted, for example, in accordance with U.S. Pat. No. 6,018,747.

It is noted though that instead of removing the original update commands and inserting newly generated update commands in replacement thereof (see, e.g., 405, 406, 407 and 408), it is possible to modify the original update command so as to refer to only the unambiguous portions (which become unambiguous segments).

After understanding that it is possible to protect only segments of content requiring protection instead of complete blocks, it should be realized that the original and/or updated versions stored in the storage device can include compressed content. When the updatable device needs to operate in accordance with the version stored therein, if the version is compressed, it is decompressed (e.g., at run time), for example, into RAM, thus allowing operation.

For example, if an executable file (a program) is stored in a compressed form, it is de-compressed in order to allow operation. Another example is having compressed data. When a program needs access to the data, the data is decompressed, allowing program operation thereby.

Thus, an original version stored in an updatable device can be a compressed original version, and similarly the updated version can be a compressed updated version.

Described below are embodiments of the invention where both the original version and the updated version are compressed on the storage device, because these embodiments are the most complicated. The reader will therefore be able to easily also understand simpler embodiments where either the original version or the updated version is not stored compressed by assuming that any of the description below relating to compression/decompression, virtual blocks, virtual boundaries, and/or decompression dependencies of the original version or the updated version respectfully are not relevant.

Prima facie, in order to update a compressed original version to a compressed updated version it is possible to operate the update process in accordance with a simple delta file, including update commands that are constructed in a simple way, handling the differences between the two compressed versions one after the other. However, those versed in the art would appreciate that small differences existing between two uncompressed versions can result in considerably larger differences between the respective compressed versions, such as the example of ZIP files. Therefore, the simple delta will become large and inefficient, notwithstanding the bandwidth required for its transmittance to the updatable devices, the storage required for storing it in the device, or both.

Figure 5:
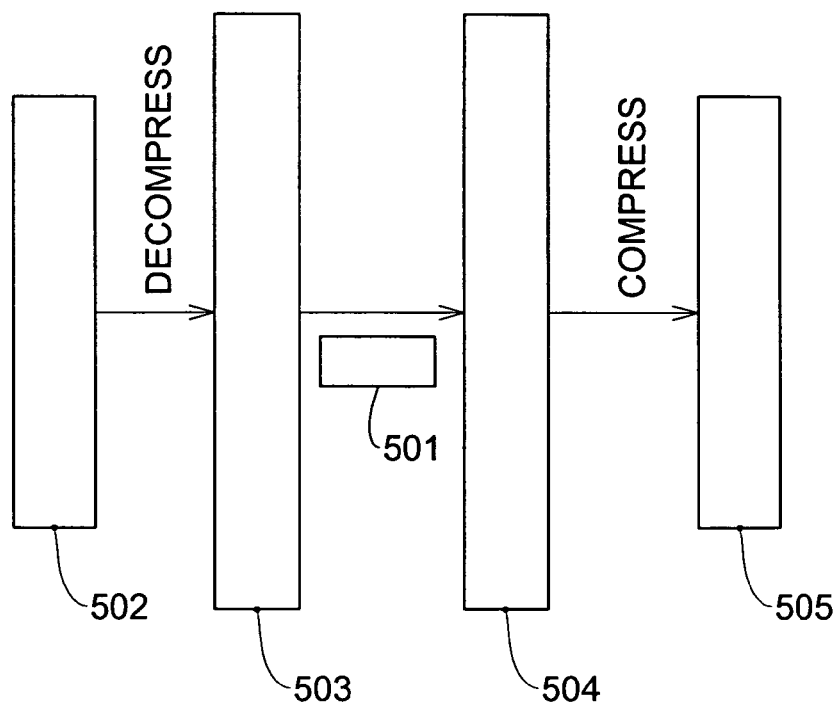
FIG. 5 illustrates updating a compressed original version to a compressed updated version thereof, in accordance with one embodiment of the invention.

Another solution is provided in accordance with one embodiment of the invention, illustrated in FIG. 5. According to this embodiment an update package 501 is generated, between the two un-compressed versions. Then, when such an update package 501 is received at an updatable device, where a compressed original version 502 is stored (e.g., a mobile telephone), it is possible to decompress the compressed original version 502, e.g., in RAM, giving rise to a decompressed original version 503. The decompressed original version 503 can be updated in accordance with the update package 501, yielding an uncompressed updated version 504, which in turn can be compressed in the updatable device, thus yielding a compressed updated version 505. It is noted that the update of the decompressed original version 503 to the uncompressed updated version 504 can be performed in accordance with any method, such as in-place updating, and the update package 501 is not limited to be a simple delta. Yet, this embodiment is non-limiting and it should be understood that is possible to update the decompressed original version 503 to the uncompressed updated version 504 in accordance with any other update method which is not in-place, e.g., by generating the uncompressed updated version 504 in another place in RAM, without overriding the decompressed original version 503. It is noted, though, that this mode of operation normally requires more RAM space, in order to allow decompression of the complete original version.

Figure 6:
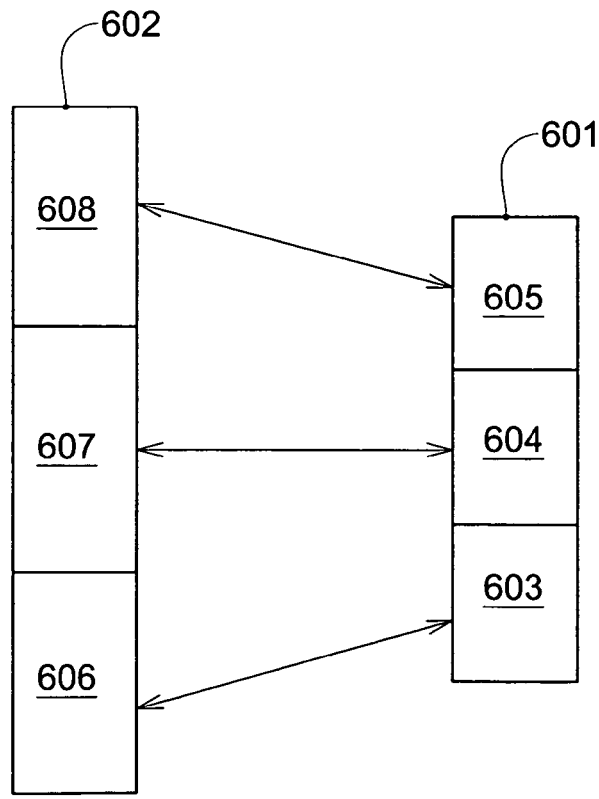
FIG. 6 illustrates a compressed version and its respective uncompressed version.

According to one embodiment of the invention, the compression used for generating the compressed original and updated versions is a linear compression (wherein compressed content maintains the same order as the uncompressed content), such as the known per se zip, Hoffman code and/or a combination thereof. Thus, it is possible to determine that in a linear compression the first block of a compressed version, in accordance with the compression order, corresponds to a first virtual block of the respective uncompressed version, the second block of the compressed version corresponds to a second virtual block of the uncompressed version etc. This is illustrated in FIG. 6, wherein 601 denotes a compressed version, while 602 denotes the respective uncompressed version. The compressed version 601 is stored in three storage blocks, 603, 604 and 605 in the storage device. Similarly, the uncompressed version 602 can be divided into three virtual blocks, 606, 607 and 608, which are not necessarily equal to each other in size. The content of virtual block 606 is compressed into storage block 603; the content of virtual block 607 is compressed into storage block 604; and the content of virtual block 608 is compressed into storage block 605.

According to one embodiment of the invention, it is possible to decompress content stored in one storage block of the compressed original version, thus yielding the respective uncompressed original virtual block. It is noted though that in those cases when the storage block includes content being part of the original version, as well as content which is not part of the original version being updated (e.g., content being part of another program), only the content being part of the original version may need to be decompressed.

Then, the content of the uncompressed original virtual block can be updated, yielding a corresponding uncompressed updated virtual block, and this uncompressed updated virtual block or part thereof can be afterwards compressed into a compressed updated block. The compressed content in the compressed updated block is thus being part of the compressed updated version.

Since it is assumed that content is stored in compressed form on the storage device, it is assumed that each compressed block is a physical block. Each compressed block corresponds to one uncompressed "block" whose size may vary. The uncompressed "block" is also termed herein below a virtual block because the virtual block is typically in RAM which is not organized in discrete blocks, as explained above. Hereinbelow, block(s) even when referring to virtual or decompressed block(s) will be used without quotation marks, for improved readability. Assuming that segments are to be examined in the decompressed form thereof but stored in the compressed form, it would be helpful to be aware of which uncompressed segments comprise a virtual block that corresponds to any given physical block of compressed data.

According to one embodiment of the invention compression of the uncompressed updated version to compressed updated version is performed block by block, generating the compressed updated version accordingly. In this embodiment, each amount of uncompressed content (i.e. a virtual block) which when compressed fits into one physical block is compressed independently. This embodiment is referred to, therefore, as a "single-block embodiment" or "block by block" embodiment. In some cases, a block by block compression is advantageous because there will be no decompression dependencies between blocks, and therefore each block can be independently decompressed.

In order to perform block by block compression, it is required to determine virtual blocks in the uncompressed version, the content stored in each virtual block can be compressed to fill a single storage block. The update package can optionally include commands for compressing the determined virtual blocks, thus yielding the compressed updated version.

In addition, it should be noted that sometimes only part of the original and/or updated versions is compressed. Thus, generally speaking, the invention provides for methods and systems for updating compressed content, wherein the compressed content can be either original content, updated content or original and updated content.

In order to better understand the correspondence between a physical block of compressed data and a virtual block of uncompressed data in the block by block compression embodiment, the reader will be presented with non-limiting methodologies for compressing and decompressing content.

It should be appreciated that one non-limiting way for the determination of a virtual block which corresponds to a physical block is by using known per se binary search. That is, knowing the address where a virtual block starts, it is possible to select a termination address. The content stored in the storage, starting from the starting address and terminating at the termination address can be compressed.

Figure 7:
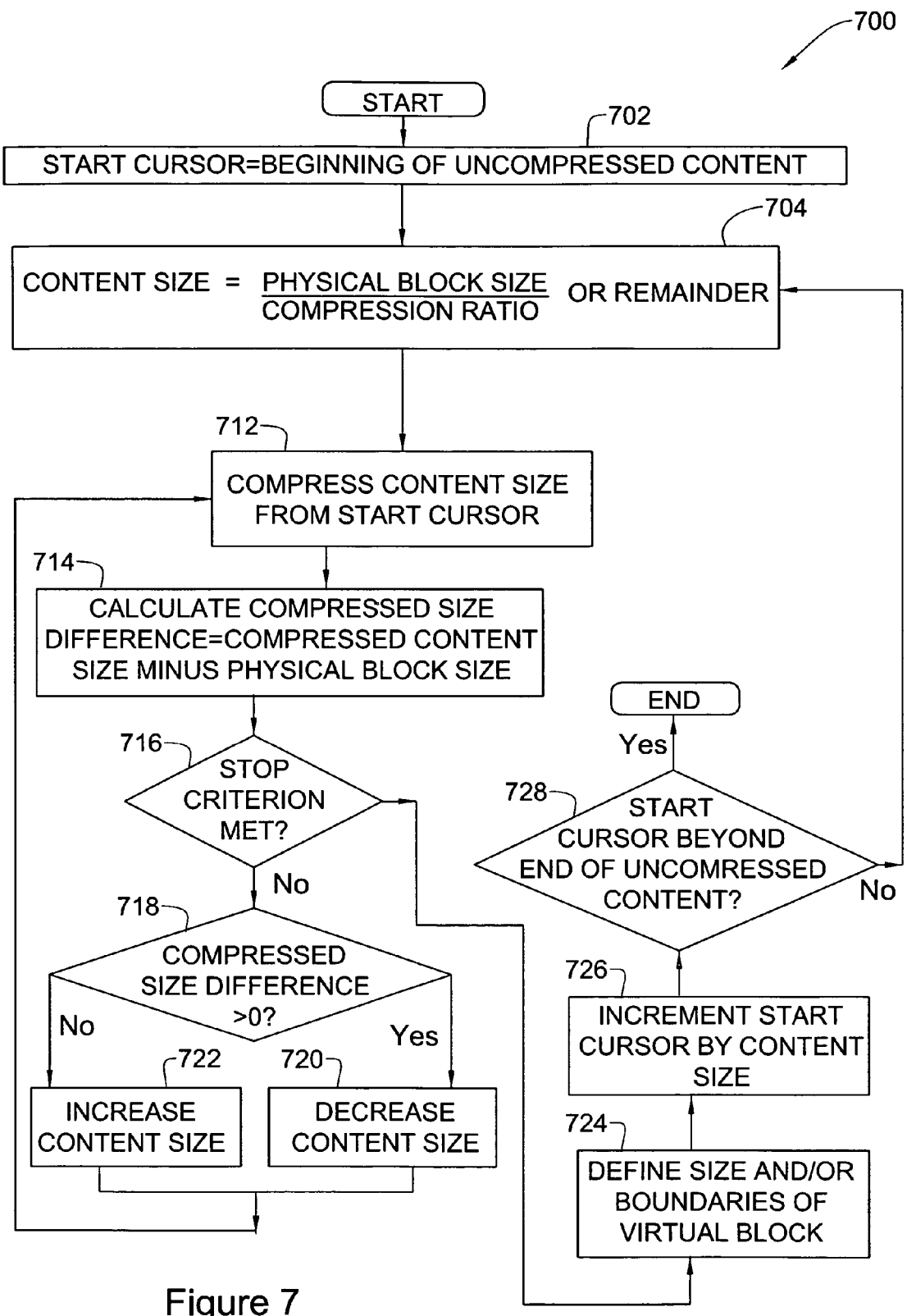
FIG. 7 is a flowchart of a method for compressing content, according to an embodiment of the present invention.

An example of a method 700 of compressing content into compressed physical (i.e. storage) blocks so as to maximize the utilization of the physical blocks, according to an embodiment of the invention is illustrated by the flowchart of FIG. 7. Note that although the term physical block is used hereinbelow when discussing compression of content into a physical block and decompression of content from a physical block, it is possible that in some embodiments content in RAM of an equivalent size of a physical block is compressed and/or decompressed. In FIG. 7 and other figures below, certain cursors are described whose positioning in the illustrated embodiments is used during the processing. It should be understood that the description of these cursors are to aid in the understanding of the reader and that other means of keeping track of positions may be used in addition or instead. It should also be understood that in some embodiments additional cursors not described here so as to not complicate the description may be used in addition or instead.

In stage 702 a start cursor (for a virtual block) is set to the beginning of the uncompressed content (i.e. the content which is to be compressed). In stage 704 an initial estimate is made of the size of the virtual block of uncompressed content which will fit in when compressed into a physical block. For example, the initial size of the virtual block (i.e. the distance between the starting and termination addresses) can be assumed as a first estimate to be, for example, in accordance with the size of the physical (compressed) block and a compression ratio typical to the compressed content. For example, if the size of a physical (compressed) block is 128 bytes and the compression ratio is 1:2 (compressed size divided by uncompressed size), then it is possible to start with the initial assumption that content occupying 256 bytes will be compressed roughly into 128 bytes (a physical block). Alternatively the initial content size can be estimated to be the remaining uncompressed content, if smaller than the ratio of physical block size to compression ratio. In stage 712 content beginning with the start cursor and comprising the assumed size of the virtual block is compressed, using the desired compression ratio and any suitable compression algorithm. It should be noted that in some embodiments the compression algorithm and/or compression ratio used to compress an original version of content may differ from the compression algorithm and/or compression ratio used to compress the new version of content which updates the original version in-place. In stage 714 the size of the compressed content (i.e. compressed in stage 712) is compared to the size of a physical block to see if one or more stop criteria are met. Stop criteria should be understood as criteria which cause the last previously estimated content size to be accepted as the size for the virtual block in a particular embodiment. For example, in one embodiment, stop criteria can be, for example, when two (or any pre-determined number) of iterations show that the process does not converge (the value of the compressed size difference between the compressed content size and the physical block size stops decreasing) or when the compressed size difference value goes below a pre-determined value. If a stop criterion is not met (i.e. last previously estimated content size for the virtual block is not acceptable), then in stage 718 it is determined if the compressed content size is larger than the physical block size. If the compressed content size turns out to be more than a physical block size, the uncompressed virtual block content size has to be reduced (stage 720), while if the compressed content's size is less than a physical block size, the uncompressed virtual block content size needs to be enlarged (stage 722) (It should be understood that the content size can not be increased past the end of the uncompressed content). For example, in one embodiment, if the difference between the compressed content size and the physical block size is determined by > size difference=compressed content size−physical block size Then the newly estimated virtual block size can be determined in stage 720 or 722, e.g., in accordance with the following equation:

> Newly estimated uncompressed virtual block size=previously computed uncompressed virtual block size−size difference/compression ratio The process then iterates back to stage 712 where a virtual block having the newly estimated uncompressed block size (and starting at the same starting address) is compressed and the newly compressed content size is compared again with a physical block size. If the size is still not equal, a new size can be determined in accordance, e.g., with binary search criteria, as known to those versed in the art. The compression and comparison can be repeated until a proper size for the virtual block is achieved, for example until a stop criterion is met (yes in stage 716). The stop criterion for any virtual block can be met the first time stage 716 is executed or in any subsequent execution. In stage 724 the size of the virtual block and/or the boundaries of the virtual block are optionally defined and/or recorded. For example, the lower boundary of the virtual block may be defined as the position of the start cursor (the starting address) and the upper boundary may be defined at the terminating address of the virtual block (i.e. the address of the start cursor plus the estimate of the content size for the virtual block which resulted in the stop criterion being met). In stage 726, the start cursor is incremented by the size of the content so as to point to the start of the next virtual block (i.e. the terminating address+1 of the previous virtual block becomes the starting address for a next virtual block to be compressed). The whole procedure repeats from stage 704 and on for determining the second virtual block, the third virtual block and so on, until the start cursor is incremented beyond the end of the uncompressed updated version (stage 728) and the method ends.

In other embodiments, compression may be simplified by compressing the content as long as the compressed size difference is less than or equal to zero, thereby omitting the stage of increasing the content size in order to better fill the physical block (stage 722). These embodiments may in some cases result in less efficient usage of the physical block.

For simplicity's sake, embodiments herein below describe boundaries of virtual blocks being defined and/or recorded. However should be evident to the reader that in other embodiments within the scope of the invention other characteristics of virtual blocks which enable the computation of the boundaries may in addition or instead be defined and/or recorded.

Figure 8:
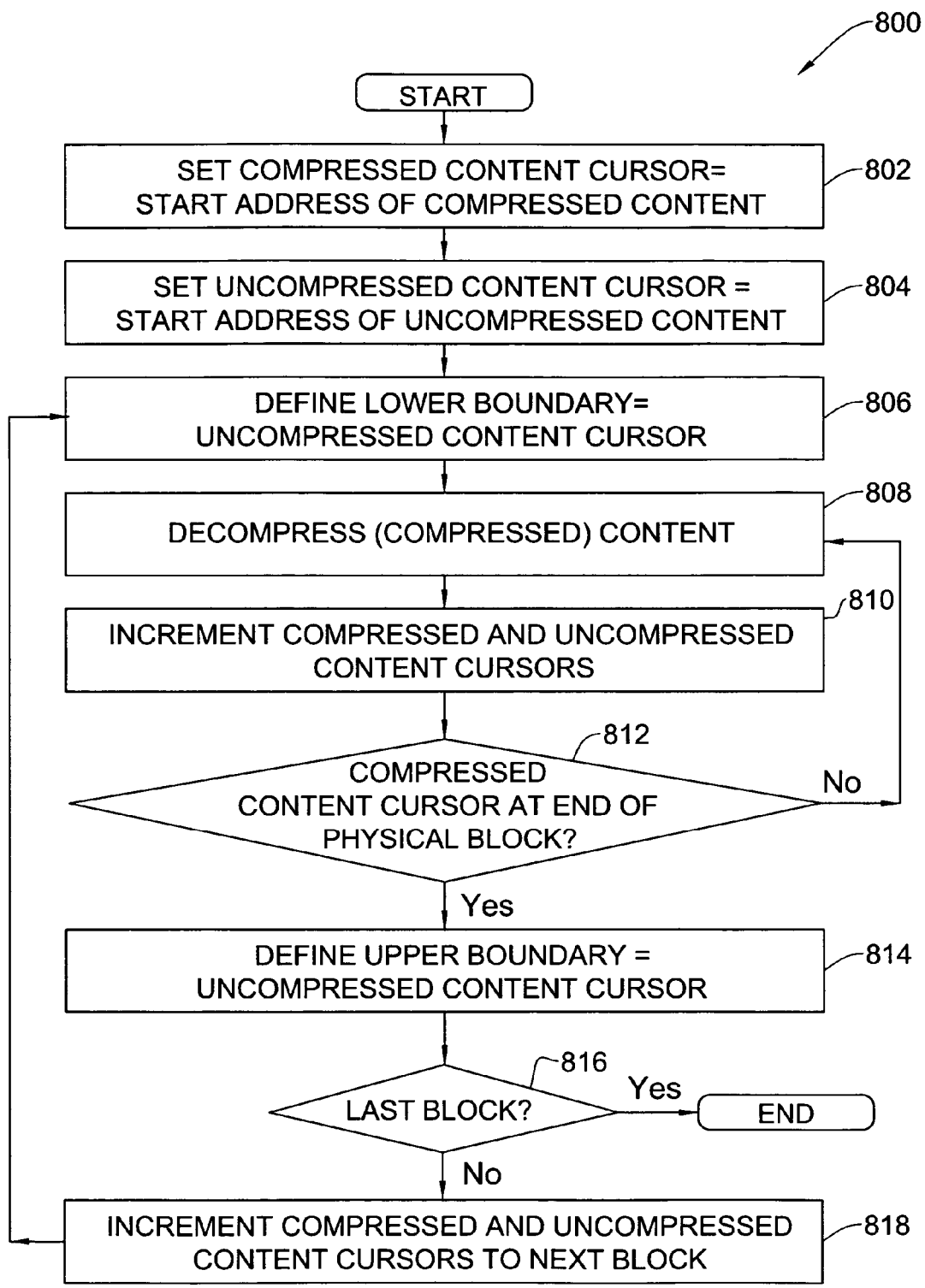
FIG. 8 is a flowchart of a method for decompressing content, according to an embodiment of the present invention.

Now that block by block compression has been explained, the reader will now be presented with a non-limiting methodology for decompressing content from physical blocks into virtual blocks. It is assumed that content to fill each physical block had been independently compressed (i.e. no interblock compression dependencies), for example in accordance with method 700. FIG. 8 is a flowchart of a method for decompressing content, according to an embodiment of the present invention. In stage 802, a compressed content cursor (keeping track of the compressed content) is set to the starting address of the compressed content, i.e. the beginning of the first physical block which is to be decompressed. As mentioned above, the term physical block is used here for simplicity of description but, it is possible that the compressed content from each physical block has been copied into an equivalent size of RAM and that the compressed content cursor points to the starting address of the compressed content in RAM. In stage 804 the uncompressed content cursor (keeping tracking of the uncompressed content) is set to the starting address for the uncompressed content—i.e. to the beginning of the first virtual block which will hold the decompressed content from the first physical block to be decompressed. In stage 806 the lower boundary of the virtual block is optionally defined and/or recorded as the position of the uncompressed content cursor. In stage 808 a unit of content, for example one byte, from the physical block is decompressed using the inverse compression ratio which had been used to compress the content and the suitable decompression algorithm. The compressed content cursor and the uncompressed content cursor are then incremented to be positioned at the terminating addresses of the compressed unit of content and the corresponding uncompressed unit of content respectively (stage 810). If the compressed content cursor is not at the end of the physical block (stage 812) then another unit of content is decompressed (stage 808) and the compressed content cursor and uncompressed content cursor are incremented accordingly (stage 810)

When the compressed content cursor reaches the end of the physical block (stage 812), then in stage 814 the upper boundary of the virtual block is optionally defined and/or recorded as the position of the uncompressed content cursor. If the physical block is not the last block (no to stage 816), then the compressed content cursor and the uncompressed content cursor are incremented (stage 818) so as to refer to the address of the beginning of the next physical block and to the beginning address where the content of the next physical block will be decompressed (i.e. what will be the corresponding virtual block) respectively. The process then iterates for the next block until the last block is reached and the process ends (yes in stage 816)

Thus by following the method of FIG. 8 or similar methods, the boundaries of each virtual block corresponding to each physical block may be defined and/or recorded during the decompression. It should be noted that if optional stages 724 had been executed during the compression then it is possible that the boundaries of the virtual blocks may already be known from the compression process. In this case, a simplified decompression algorithm may be followed instead which includes the decompression of the content without necessarily redefining upper boundaries (stage 814) and lower boundaries (stage 806) of the virtual blocks (because the boundaries are already known).

Therefore by executing a method of compression and/or decompression which includes the definition and/or recording of as described above, the correspondence between each virtual block and physical block may be determined.

Figure 9A:
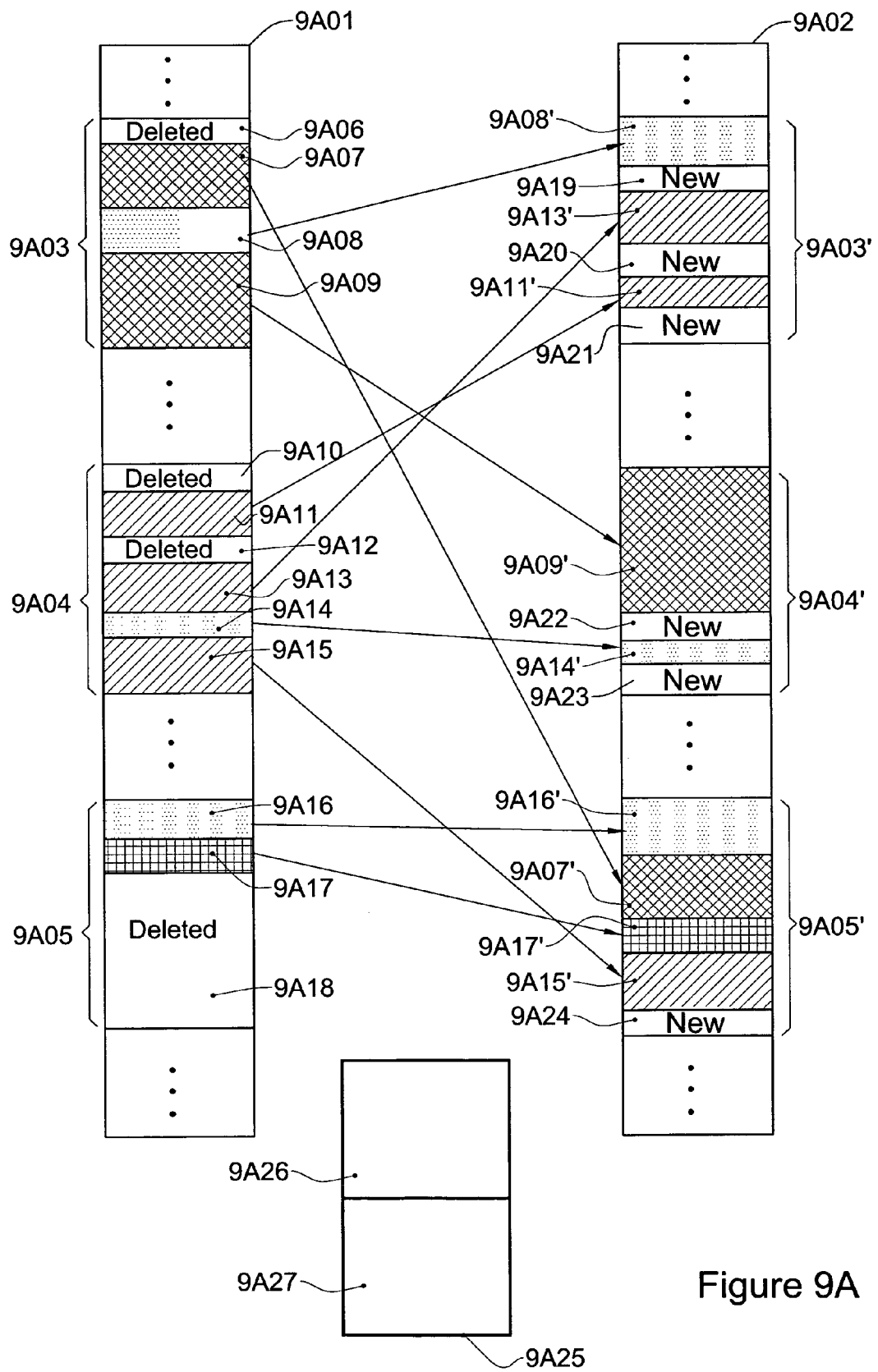
FIG. 9A is a schematic illustration of another example of an original version, and the updated version thereof.

FIG. 9A is a schematic illustration of an example of an original version 9A01, and an updated version 9A02 thereof in decompressed form in RAM. It should be appreciated that the uncompressed original version 9A01 is updated into the uncompressed updated version 9A02. Depending on the embodiment, the virtual blocks of original version of 9A01 may be updated in-place in RAM or may be updated to a different area in RAM, but in either case the physical blocks comprising the compressed version of 9A01 are updated in-place. For simplicity of description, it is assumed in the description of FIGS. 9A, 9B and 9C that the virtual blocks in RAM are updated in place In this embodiment the original version 9A01 occupies at least three virtual blocks, specifically referenced as 9A03, 9A04 and 9A05. The updated version 9A02 occupies at least the same virtual blocks (assuming in-place updating in RAM). However, in order to differentiate between original and updated content, 9A03' denotes virtual block 9A03 when updated content is stored therein; 9A04' denotes virtual block 9A04 when updated content is stored therein; and 9A05' denoted virtual block 9A05 when updated content is stored therein. Although in FIG. 9A, it appears that a virtual block (which corresponds to a particular physical block) is the same size when containing updated uncompressed content as when containing original uncompressed content, the size equality is not necessarily true, and it is possible that a virtual block (corresponding to a particular physical block) when containing updated uncompressed content may be larger than, smaller than, or of equal size as when containing original uncompressed content. As the reader will understand even slightly modified content can result in completely different compression behavior (and therefore a different virtual block size of uncompressed content which fits into a physical block).

The block 9A03 includes four segments: 9A06, 9A07, 9A08 and 9A09; The block 9A04 includes six segments: 9A10, 9A11, 9A12, 9A13, 9A14 and 9A15; and the block 9A05 includes three segments: 9A16, 9A17 and 9A18.

During update, the content stored in segment 9A06 is deleted and thus it has no corresponding segment in the updated version 9A02. Other deleted segments are 9A10, 9A12 and 9A18. Furthermore, the content stored in segment 9A07 is moved (copied) to block 9A05', thus generating segment 9A07'. The content stored in segment 9A08 is left in block 9A03', constituting segment 9A08', but as segment 9A06 is deleted, the segment 9A08' (or at least part thereof) now occupies addresses in the block that previously were occupied by the content of 9A06, or in other words, it becomes the first segment in the block, which belongs to the updated version 9A02. The content stored in segment 9A09 is copied from block 9A03 to block 9A04', constituting segment 9A09' therein. It is noted that the segments 9A07', 9A08' and 9A09' are segments in the updated version that correspond to segments 9A07, 9A08 and 9A09, respectively.

The content of segments 9A11 and 9A13 are copied to block 9A03', generating the corresponding segments 9A11' and 9A13' therein, respectively. Yet, in the original version segment 9A11 precedes segment 9A13, while in the updated version 9A02 their respective order changes and segment 9A13' precedes segment 9A11'. In addition, content is inserted into three new segments (9A19, 9A20 and 9A21) in block 9A03', and it is noted that none of these new segments (9A19, 9A20 and 9A21) correspond to segments in the original version. Similarly, content is inserted into two new segments (9A22 and 9A23) in block 9A04' and into one new segment (9A24) in block 9A05'. Neither 9A22, 9A23 nor 9A24 correspond to segments in the original version.

The content stored in segment 9A14 of block 9A04 is left in the same block 9A04', giving rise to the corresponding segment 9A14', and the content stored in segment 9A15 of the same block (9A04) is moved (copied) into block 9A05', constituting segment 9A15'.

The segment 9A16 of block 9A05 corresponds to segment 9A16' in block 9A05'. Similarly to the segment 9A16, which is the first segment in the block 9A05 being part of the original version 9A01, the segment 9A16' is the first segment in block 9A05' being part of the updated version 9A02. However, it is noted that the updated content of segment 9A16' is not necessarily identical to original content stored in segment 9A16, and in this case the size of the updated content of 9A16' is larger than the size of the original content of 9A16. For example, an update command can insert one or more zeros (0's) along the content of the updated segment. Such a command could, for example, insert a hundred zeros after each original thousand bytes. The update command allowing updating the content of 9A16 to the content of 9A16' can be indicative of any other transforming operation, such as "convert lower case characters to lower case character" etc. The segment 9A17 of block 9A05 corresponds to segment 9A17' of block 9A05', but their positions in the block are different.

Although not specifically noted before, there may exist additional corresponding segments, such as 9A14 and 9A14', whose position within their respective blocks have changed.

It is noted that according to this example there is a protection buffer 9A25 available for the update process. Although the size of a protection buffer is not limited by the invention, in the present example of FIG. 9A the protection buffer size equals the size of two (physical) storage blocks wherein one protection block is referenced as 9A26 and the other as 9A27. Yet, it is noted that this is a non limiting example, and the protection buffer can be of any size.

It was noted, with reference to FIG. 9A, that the original content stored in segment 9A13 is required for updating segment 9A13' in block 9A03'. Assuming an update sequence of block 9A05', then block 9A04' and then block 9A03', it is appreciated that the content of the updated block 9A03' (including segment 9A13') is not yet generated while the update process operates in accordance with the update command "copy 9A09 to 9A09'", overwriting the original content of segment 9A13 (or at least a portion thereof). Therefore, it is appreciated, that upon reaching the "copy 9A13 to 9A13'" command, the content stored in segment 9A13 will already be updated content being part of segment 9A09', and not the original content of 9A13. Hence, the "updated" content to be stored in 9A13', in this case, would not be the expected content (it would not be a copy of the original content of 9A13). In order to avoid this error, the original content stored in 9A13 needs to be protected (e.g., in the protection buffer) before overwriting it with segment 9A09'.

Understanding this, it is possible to determine that before overwriting original content stored in a segment, this original content should be protected if it is required for at least one update command yielding updated content to be stored in a block further in the update sequence.

It is noted that for simplicity's sake the embodiments described below refer to the option of protecting uncompressed original content into the protection buffer. Yet, this is non-limiting and it should be appreciated that in other embodiments compressed original content and/or original content which has been manipulated in any other way, for example through encryption or another transformation may be instead protected in the protection buffer.

It is also noted with reference to FIG. 9A, that the content of segment 9A17 is copied into segment 9A17' of the same block (9A05). 9A17' appears to precede 9A17, i.e., the updated content of 9A17' does not overwrite the original content of 9A17. Hence, it appears, prima facie, that the original content of 9A17 is implicitly protected by 9A17', and this original content does not require explicit protection (e.g., in a protection buffer). However, in those cases when the updated device has a storage device including blocks, such as flash memory, it is appreciated that usually a copy of the updated content is generated, e.g., in RAM (Random Access Memory), and after completing the updated content generation of the whole updated block (9A05' in this case), the updated content is compressed and copied from the RAM to the physical block corresponding to updated block 9A05' after deleting the content of the physical block corresponding to original 9A05. It is appreciated thus that while overwriting the original physical block corresponding to 9A05 with the (compressed) updated content corresponding of 9A05', if the writing operation fails after the success of the delete operation, the original compressed content corresponding to 9A17 will be lost, regardless of the fact that it is not overwritten by the compressed content corresponding to 9A17'. Therefore it should be noted that protection is required also for purpose of reliability, in those cases when the content of the original segment is required to update the content of a corresponding updated segment in the same virtual block.

On the other hand, segment 9A15 is copied into segment 9A15' of block 9A05'. This is done while updating block 9A05', i.e., before updating blocks 9A04' and 9A03'. Hence, it can be appreciated that upon updating block 9A04' and overwriting the original content of 9A15 with the updated content of segments 9A23, 9A14' and possibly also 9A22, the original content of 9A15 has already been copied into 9A15', which is in a block preceding 9A04' in the update sequence.

Therefore, in the example of FIG. 9A there is no need to explicitly protect the original content of 9A15.

Even further, if in the example there was an additional update command copying the original content of 9A15 into a corresponding segment in block 9A03', in addition to the presently existing copy command, copying the content of 9A15 into 9A15' in block 9A05' (it is noted that block 9A03' follows block 9A05' in the update sequence), there would still be no requirement to explicitly protect the content of 9A05. Although block 9A03' follows block 9A04' in the update sequence, hence overwriting the original content of 9A15 before updating block 9A03', it is possible to use the content stored in 9A15' instead of a copy thereof explicitly stored in the protection buffer.

Hence, there is no requirement to explicitly protect content of a segment if there is at least one update command copying the content thereof in a block that precedes the original block of the original segment in the update sequence.

Understanding that, it is appreciated that in block 9A05 the segments 9A16 and 9A17, or portions thereof, require protection. In block 9A04, the segments 9A11, 9A13 and 9A14, or ambiguous portions thereof require protection, while in 9A03 it is 9A08, or an ambiguous portion thereof that requires protection.

It is noted that the example of FIG. 9A is non-limiting. In the example the update package allows the update process to update the original version 9A01 to the updated version 9A02, while first executing update commands for updating block 9A05', then update commands for updating block 9A04' and then update commands for updating block 9A03'. Alternatively, after updating block 9A05' it is possible to update 9A03' and finally block 9A04'. It is still possible to update block 9A04' first, followed by block 9A03' and 9A05' etc. It should be noted that according to this example there are six different update sequences allowed. Generally, there are n! possible update sequences, wherein n is the number of blocks that include modified data being part of the new version. All these n! update sequences give rise to the same updated version. An "update sequence" or "update order" is the order in accordance with which blocks of the updated version are updated (or written).

According to the invention, an operating environment of an updated device can be pre-configured to allocate one or more areas in the storage device 103 that are used for backup and/or protection purposes of operations performed by any software executed by the device. Updating content is one example for such an operation. Such an area is the "protection buffer". According to one embodiment described by way of example with reference to FIG. 3D, it is possible to protect original content of a segment by storing a copy thereof in a protection buffer 3D03 in the storage device 103 thus reducing the size of the update package, compared to a package storing content of protected segments therein.

According to another embodiment, content of more than one segment (or one or more portions thereof) can be stored in the protection buffer. It is noted that if after storing portions the protection buffer includes unused area, it is possible to use this unused area for storing copies of content stored in additional segments requiring protection (or portions thereof). These additional protected segments can be stored in the current block or they can be stored in other blocks in the storage device. That is, it is possible to store segments or portions thereof in the protection buffer, instead of copying complete blocks thereto.

It was noted before that it is possible to split an ambiguous segment into several segments, i.e., an ambiguous segment can be split into one or more ambiguous segments and one or more non-ambiguous segments. Then the update commands are adapted to correspond to the split segments. Realizing this, it is noted that hereinafter, instead of speaking of an ambiguous segment and/or an ambiguous portion thereof, segments (and/or ambiguous segments) will be discussed.

Notwithstanding, when further discussing the examples of FIGS. 9B and 3C below, instead of splitting the segments to sub-segments (ambiguous and/or unambiguous), in order to keep the description as simple as possible, reference will be made to the complete "original" segments. For example, it appears from FIG. 9A that 9A17 should be split into two portions or sub-segments; one is overwritten by the updated content of segment 9A16' and the other by the updated content of segment 9A07'. Yet, the description below refers to protecting the original content of the complete segment 9A07.

Figure 9B:
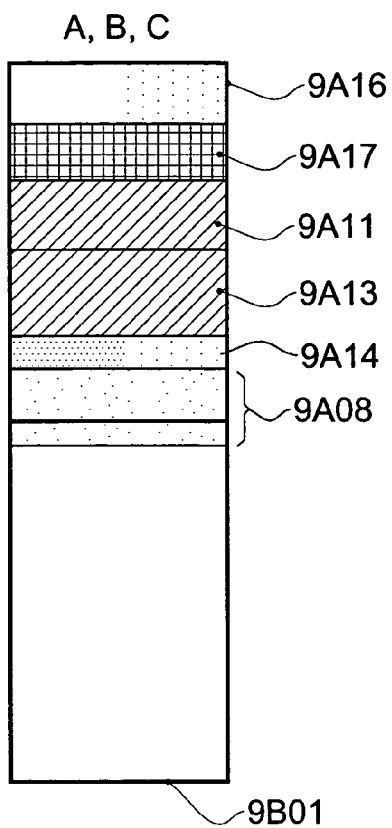
FIG. 9B is a schematic illustration of a protection buffer used while updating the original version of FIG. 9A to the updated version thereof, in accordance with one embodiment of the invention.

FIG. 9B is a schematic illustration of a protection buffer 9B01 used while updating the original version of FIG. 9A to the updated version thereof, in accordance with one embodiment of the invention. In this example the size of the protection buffer 9B01 is two storage blocks, as is the case with the protection buffer 9A25 of FIG. 9A, however, this is non-limiting and the protection buffer can be of any applicable size. It is noted that when the update process begins operating, the protection buffer is empty, or in other words, the size of the unused area thereof is similar to the size of the protection buffer.

In the current example the selected update sequence is 9A05', 9A04' and then 9A03'. Thus, when updating the original content of block 9A05' (which means overwriting the original content stored in 9A05), the original content of segment 9A16 requires protection. The size of segment 9A16 is smaller than the size of the protection buffer, and therefore the original content of segment 9A16 is copied thereto.

The segment 9A17 also requires protection. Because the size of segment 9A17 is smaller than the unused area of the protection buffer, the original content of segment 9A17 can also be copied thereto. Now, when all the segments of 9A05 that require protection are protected, the content stored in block 9A05 can be safely overwritten by the updated content of 9A05' (that is, by the updated content of segments 9A16', 9A07', 9A17', 9A15' and 9A24). As already explained, copying original content into the protection buffer provides protection to ambiguous segments as and/or reliability of the update process.

Furthermore, before updating block 9A04' (thus overwriting the original content stored in 9A04), and as long as there is unused area in the protection buffer, the original content of the segments 9A11, 9A13 and 9A14 is copied thereto, while there is no need to further protect the original content of segment 9A15, and therefore its content is not copied to the protection buffer (9A15 is implicitly protected by 9A15', as was previously explained with reference to FIG. 9A). In addition, before updating block 9A03', and as long as there is sufficient unused area in the protection buffer, the original content of 9A08 should also be copied thereto.

It is noted though that now the used area of the protection buffer 9B01 is a little larger than the size of one storage block. If the size of the protection buffer would have been only one storage block, thus, there would not have been enough unused area to store the copy of segment 9A08 therein. When the protection buffer does not have sufficient unused area for protecting all segments requiring protection, their content needs to be backed up in alternative storage areas, such as the update package itself as described in U.S. Pat. No. 6,018,747 or with reference to FIG. 3C.

Figure 9C:
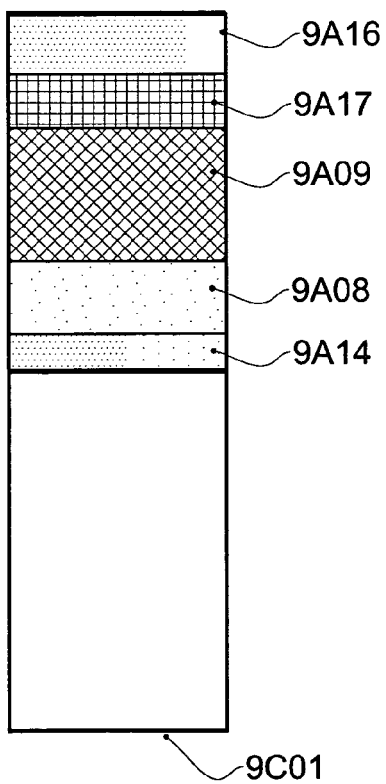
FIG. 9C is a schematic illustration of a protection buffer used while updating the original version of FIG. 9A to the updated version thereof, in accordance with another embodiment of the invention.

FIG. 9C is a schematic illustration of a protection buffer 9C01 used while updating the original version of FIG. 9A to the updated version thereof, in accordance with another embodiment of the invention. According to this embodiment the update sequence is selected in order to reduce the number of protection operations or the area used by protected content. For example, the usage of the protection buffer 9C01 illustrates the protection operations required when the update sequence is 9A05', 9A03' and finally 9A04'. As was previously explained with reference to FIG. 9B the original content of segments 9A16 and 9A17 is copied into the protection buffer before overwriting them with the updated content of block 9A05'. Before updating block 9A03', and with reference to the disclosure of FIG. 9B, it should be appreciated that the segment 9A07 does not require protection. Hence, the content of segments 9A08 and 9A09 that needs protection, is copied into the unused area of the protection buffer 9C01 without copying the content of 9A07.

Now, turning to block 9A04', it should be understood that the segments 9A11, 9A13 and 9A15 do not require explicit protection, as their content was copied before to blocks 9A03' and 9A05' (their original content is implicitly protected). The only original content in block 9A04 that requires protection is the original content stored in segment 9A14, and therefore this content is copied into the unused area of the protection buffer 9C01.

By comparing the usage of the protection buffer 9B01 with that of the protection buffer 9C01 it is possible to see that the protection buffer 9C01 includes content of fewer segments compared to the protection buffer 9B01 (five segments in 9C01, unlike six segments in 9B01). A person versed in the art would appreciate that this reduction in the number of protected segments results due to the implicit protection of three segments (9A11, 9A13 and 9A15) achieved by updating block 9A03' before block 9A04'.

In addition, it is noted that the used area of the protection buffer 9C01, after protecting required original content of segments in all three blocks is smaller than the used area of the protection buffer 9B01. Again, this is due to having larger segments implicitly protected by selecting the abovementioned update sequence (9A05', 9A03' and then 9A04').

Generally, thus, by selecting a certain update sequence it may be possible to reduce the number of backup operations and/or the protection buffer space required during the update process. Bearing in mind that backup operations are time consuming, reducing the backup operations is beneficial in achieving a faster update process. In addition, taking into account that writing data into blocks in a storage device including blocks is time consuming, it should be appreciated that reducing the space used for protection (and hence possibly also the number of blocks used in the protection buffer) can also be beneficial in achieving a faster update process.

Furthermore, it is noted that the update sequence affects the time during which it is required to keep a copy of an original content of a segment in the protection buffer. In the example of FIG. 9A, e.g., segment 9A09 is required for updating block 9A04'. If the update sequence determines that block 9A03' should be updated before block 9A04', then the original content of segment 9A09 should be copied into the protection buffer. It is possible (although not shown in the figure) that between updating blocks 9A03' and 9A04' other blocks (additional blocks that not illustrated) are updated, while 9A04' is the last block updated in accordance with the update sequence. In such a case it should be appreciated that it is required to keep the protected content of segment 9A09 in the protection buffer until block 9A04' is updated, or in other words, almost until the end of the update process. During all this time the protected content of segment 9A09 occupies area of the protection buffer.

However, it is possible to modify the update sequence in this case, updating block 9A04' before the other segments. It was already noted that if 9A09' includes content identical to the content of 9A09 it can be used as implicit protection thereof, and therefore in this case it would be possible to free (or reuse) the area of the protection buffer occupied by the protected content of 9A09 after updating block 9A04'.

Yet, even in those cases when the content of 9A09' is different from the content of 9A09, it is still possible to select an update sequence that allows updating the blocks whose update depends on the original content of 9A09 before updating the rest of the blocks, thus allowing release or reuse of the area in the protection buffer previously occupied by the protected copy of the original content of 9A09.

As mentioned above, it was assumed in the description above of FIG. 9A, 9B 9C that the uncompressed updated virtual blocks overwrote the uncompressed original virtual blocks in RAM and that therefore for convenience sake protection of segments occurred before the update sequence was applied to the overwriting in RAM. It should be understood that in other embodiments, the segments may instead be protected in another place in RAM prior to the overwriting in RAM or may not be protected at all prior to the overwriting in RAM because the original content may in any event be retrieved and decompressed from the storage device as long as the storage (physical) blocks have not yet been overwritten. In these other embodiments or in an embodiment where the uncompressed updated virtual blocks are instead written to a separate area in RAM, protection of segments in non-volatile storage may be deferred until any time prior to writing the compressed content to the physical blocks. When updating to a separate area of RAM, the protection of segments is not relevant because the original virtual blocks in RAM are not touched. However, prior to the compressed updated content overwriting the original content in storage in accordance with an update sequence, certain segments may need to be protected as explained above.

The invention is thus adapted to storage devices including physical blocks, wherein writing updated content into a physical block affects other content stored therein. Hence, as of access efficiency considerations, it is possible to group together update commands writing content into a specific physical block, operating in accordance therewith, before writing content into a different block. In the present example of FIG. 9A, the update process updates block 9A05', then block 9A04' and then block 9A03'.

Note that in RAM (Random Access Memory) there is no such limitation relating to storing content. RAM includes no blocks and hence, content written to the RAM does not affect other content written therein. For example, there is no requirement to erase content stored in a block before writing any piece of content (e.g., a segment) thereto and similarly, there is no requirement to write the complete content of a block during one write operation. Hence, it is possible to generate a copy of an updated block in RAM, one segment after the other (for example operating in accordance with the update commands), then compressing and writing the content of the complete block into a block in the storage device. In addition, there is no special importance to the order of the update commands relating to one updated block, although in some cases access efficiency may be considered.

That is, the update package includes the commands "insert 9A24", then "copy 9A15 to 9A15'", followed by "copy 9A17 to 9A17'", "copy 9A07 to 9A07'", and "update 9A16 to yield 9A16'". Yet, as for access efficiency considerations, this is equivalent to "copy 9A17 to 9A17'38, followed by "update 9A16 to yield 9A16'", "copy 9A15 to 9A15'", "copy 9A07 to 9A07'" and "insert 9A24".

Before proceeding with the description of an embodiment for determining an update sequence, it should be noted that "Size" of a segment is the number of bytes occupied by the segment. However, this is non-limiting and it is possible to measure the size of a segment by any other applicable measure, such as bits, words, etc.

In addition, every original block has a dependency value, denoted as DEP(block). It should be understood that because each virtual block corresponds to one physical block (and the boundaries of each virtual block corresponding to a physical block can be determined for example as in method 700 or 800), the blocks B, $B_i$, etc. may equivalently refer to physical blocks or virtual blocks. However as explained above, the size/boundaries of a virtual block when containing old content which corresponds to a particular physical block may in some cases differ from the size of the virtual block when containing new content which corresponds to the same particular physical block and therefore for ease of description below, the update sequence refers to the sequence of updating physical blocks.

In the embodiment described below, because the updating takes place when the content is uncompressed, the sizes of segments are assumed to refer to the sizes of uncompressed segments in virtual blocks corresponding to physical blocks when calculating of equations 1 and 2 (further below). However in other embodiments, the sizes may refer to the sizes of segments when compressed. The original (uncompressed) segments of a block B that correspond to updated (uncompressed) segments in the updated version constitute "original corresponding segments CS". Understanding that the segments in an old block that potentially require protection are original corresponding segments, the dependency value of a block is determined as the total size of all the original corresponding segments included therein. Initially the DEP value of a block is given by Equation 1.

$$DEP(B_i) = \sum_{j=1}^{m} Size(CS_j) \quad \text{Equation 1}$$

Wherein:

$B_i$ is an i'th block (it is noted that blocks mentioned herein are updated blocks, i.e., blocks whose original content is overwritten by updated content, while it is unnecessary to protect content stored in those blocks that are not updated);

m is the number of original segments in a block that potentially require protection (m>=0); and $CS_j$ is an original segment in $B_i$ that corresponds to an updated (uncompressed) segment, wherein j=1, 2, . . . , m.

If m=0 then there are no corresponding segments in $B_1$, and therefore $DEP(B_i)=0$.

For example, in FIG. 9A, the initial dependency of block 9A04 is:

DEP(9*A*04)=size(9*A*11)+size(9*A*13)+size(9*A*14)+size(9*A*15)

Figure 10:
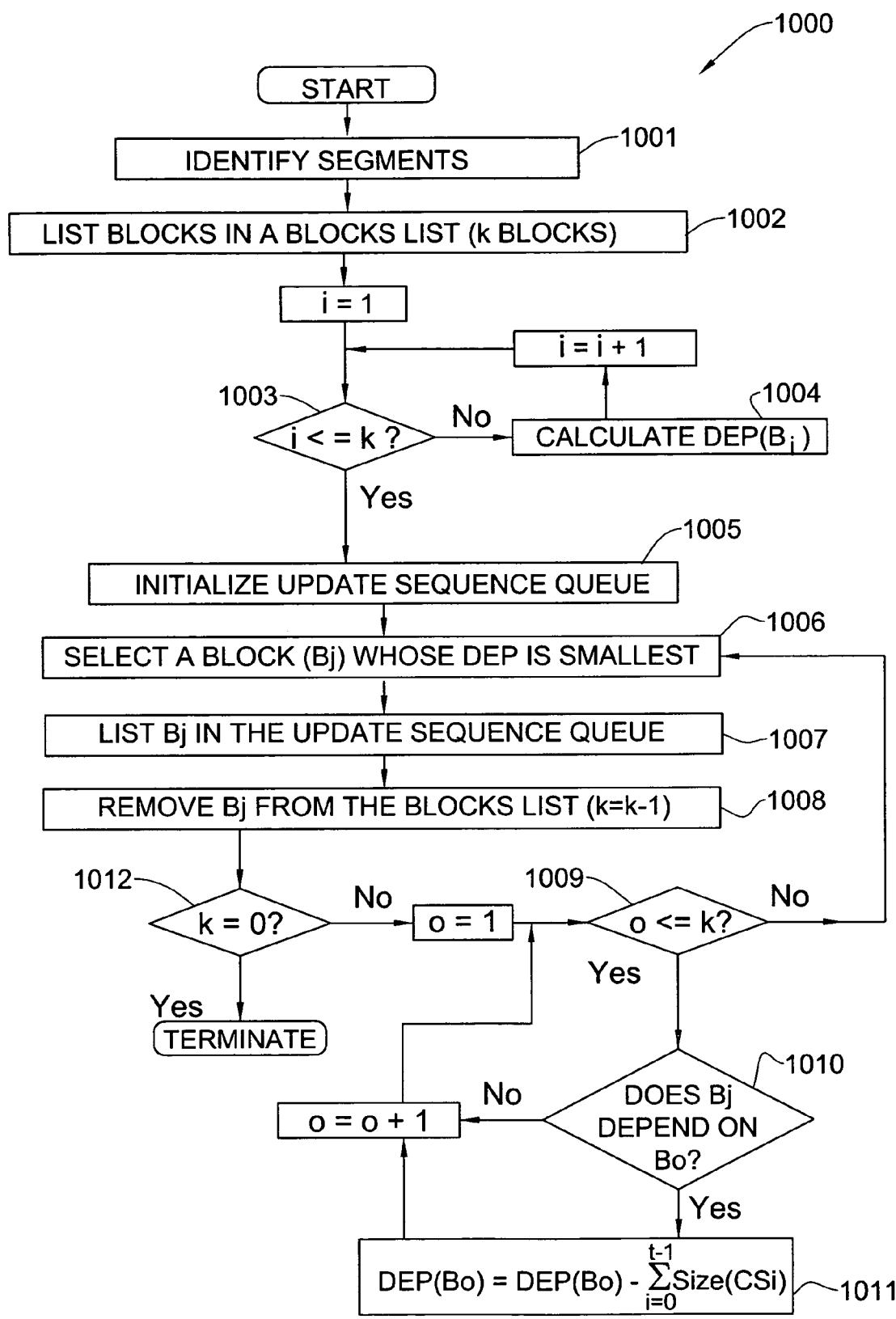
FIG. 10 is a flowchart illustrating in detail one embodiment for determining an update sequence.

FIG. 10 is a flowchart illustrating in detail one embodiment for determining an update sequence. It is noted that an update sequence determined by the illustrated embodiment is determined in order to reduce the area or space used by protected content. It should also be understood that being the order in accordance with which the updated blocks are updated in the storage device, an update sequence is always determined in connection with an update package (as it is the update package that determines the update sequence in accordance with which the update process operates).

In 1001 an update package is analyzed in order to identify corresponding segments, e.g., by identifying original segments whose content is copied into segments of the updated version and/or updated segments whose content is calculated based on content of original segments etc. As explained above it is assumed that the segments referred to in FIG. 10 are uncompressed segments of content in virtual blocks corresponding to the physical blocks. It is noted that non-corresponding segments included in the updated version (i.e., segments that have no correspondence with segments in the original version), such as new content that is inserted into the updated version without any correspondence to the original version, does not necessarily affect the update sequence. Alternatively, the corresponding segments can be pre-identified (see, for example, FIG. 11), in which case 1001 can be skipped.

In addition, a pre-prepared update package is not a pre-requisite. If there is no pre-prepared update package, it is possible to generate one, for example, by utilizing a diff tool as is known in the art or by any other way such as by the methods described in U.S. Pat. No. 6,546,552, WO 2004/114130 or WO 2005/003963.

In 1002 all the blocks which will be updated for the updated version are listed in a list denoted "blocks list", wherein k is the number of listed blocks. For every block i (i=1, 2, . . . , k) in the list (see 1003) $DEP(B_i)$ is calculated (in 1004).

According to the illustrated embodiment, blocks will be listed in an "update sequence queue", when the block whose dependency (DEP) is lowest will be inserted thereto first (and therefore it will be the first to be retrieved). It should be understood that because each virtual block corresponds to one physical block (and the boundaries of each virtual block corresponding to a physical block can be determined for example as in method 700 or 800), the blocks list and update sequence queue may equivalently refer to virtual blocks or physical blocks. However as explained above, the size/boundaries of a virtual block when containing old content which corresponds to a particular physical block may in some cases differ from the size/boundaries of the virtual block when containing new content which corresponds to the same particular physical block and therefore for ease of description below, the update sequence refers to the sequence of updating physical blocks.

Thus, in 1005 an empty queue is initialized. Yet, this embodiment is non-limiting and other data structures, such as a stack, can be used as well, as can be appreciated by those having skills in the art. The first block to be updated in accordance with the update sequence, i.e., the first block to be pushed into the update sequence queue, is the block whose DEP is lowest.

In 1006 the block in the blocks list whose DEP value is the smallest is selected. It is noted that if there are several (more then one) blocks with the same smallest DEP value, then one of them is selected, e.g., according to the smallest i. The selected block is denoted $B_j$. In 1007 $B_j$ is pushed into the update sequence queue and in 1008 it is removed from the blocks list. Then, in 1012, if the blocks list is empty (k=0), process terminates.

It was already explained that it is possible that $B_j$ depends on other blocks. That is, there are possibly updated segments in $B_j$ (or more specifically, in the updated version of $B_j$) whose corresponding original segments are in other original blocks. For each such other block $B_o$ that is still listed in the blocks list, segments corresponding to segments in the updated version of $B_j$ are identified (it is possible to recognize the segments according to the start and end addresses of the other blocks listed in the blocks list) and their size is reduced from $DEP(B_o)$.

In order to do so, each block $B_o$ still listed in the blocks list (see 1009 and 1010) is tested to see whether $B_j$ depends on it or not (i.e., whether the updated content stored in $B_j$ includes a segment whose corresponding source segment is in the old version of that block $B_o$). If $B_j$ depends on the tested block $B_o$, in 1011 the depending segments are identified and their total (uncompressed) size is reduced from the dependency value (DEP) of the tested block $B_o$. That is, if there are t updated segments in $B_j$ that correspond to old segments in $B_o$, $$DEP(B_o) = DEP(B_o) - \sum_{i=0}^{t-1} \text{Size}(CS_i) \qquad \text{Equation 2}$$

Wherein:

$B_o$ is a block in the blocks list (not yet in the update list) on which $B_j$ depends;

t is the number of corresponding segments (CS) in $B_o$ that correspond to updated segments in $B_j$ (t>=1); and $CS_i$ is an old segment in $B_o$ that corresponds to the updated segment in $B_j$ After the DEP values have potentially been modified at 1011 the next block having the smallest dependency value is selected (1006) and the process repeats itself, until the blocks list is found to be empty (then, it is appreciated that k=0).

Upon termination, the update sequence queue represents the determined update sequence. It should be noted that according to one embodiment the update package can be re-arranged to reflect the update sequence. Alternatively it is possible to associate the update sequence, or more accurately, a representation thereof, with the update package. A representation of the update sequence can be, for example, by sorting and storing the update commands in the update package according to their target segments addresses, in accordance with the update sequence.

It is appreciated that method 1000 assumes that any segment CS for block $B_o$ which is required to update block $B_j$ is not required to update other blocks. However in an embodiment where any particular segment of $B_o$ may be required to update other blocks in addition to Bj, equation 2 can be modified so that the size of CS is only subtracted from the DEP of $B_o$ if all dependent blocks are prior to $B_o$. For example, stage 1010 can be modified to ask "Is Bj the latest block in the update sequence which depends on Bo?"

Figure 11:
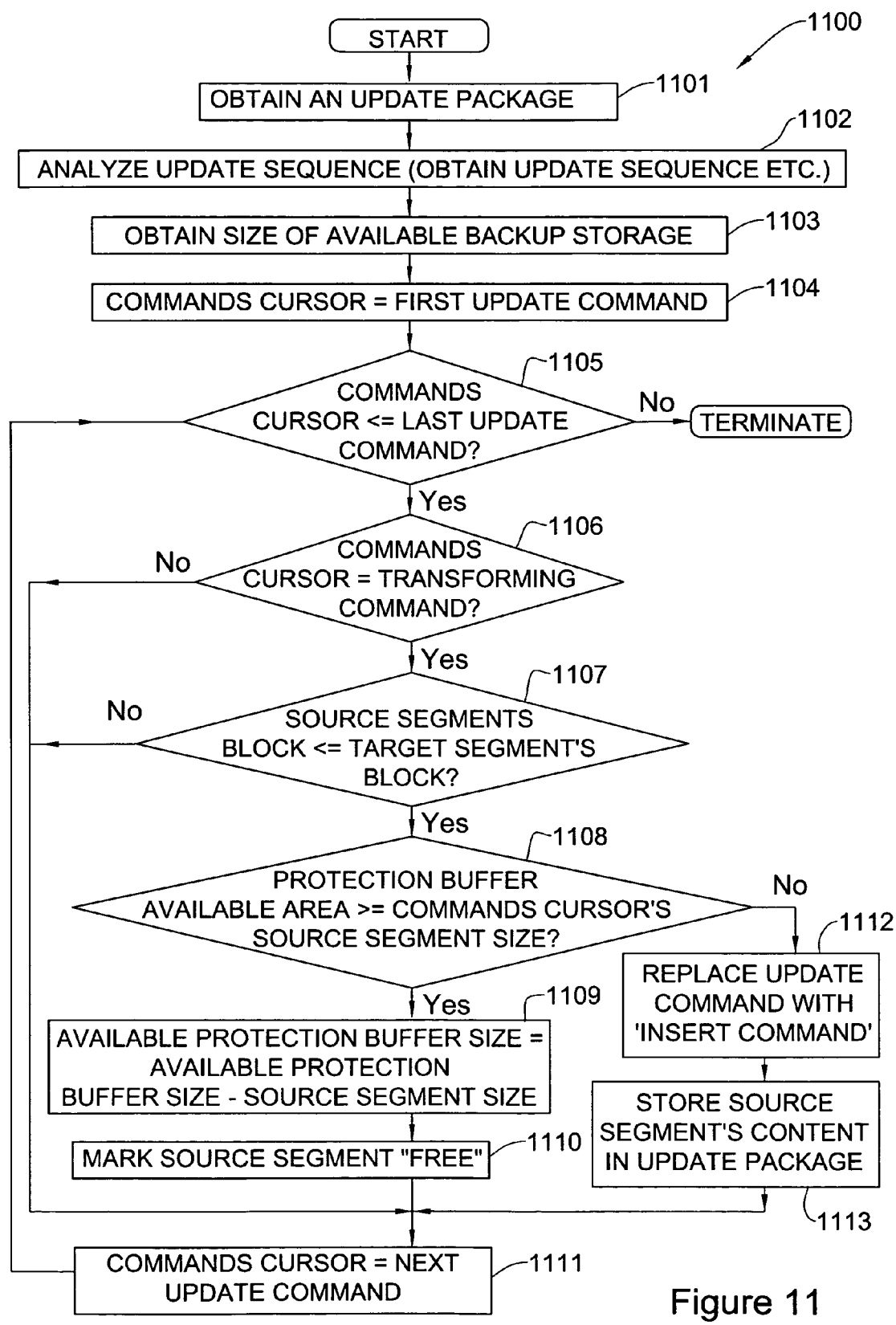
FIG. 11 is a flowchart illustrating generation of an update package, in accordance with one embodiment of the invention.

FIG. 11 is a flowchart illustrating generation of an update package, in accordance with one embodiment of the invention. Before providing detailed explanation of the flowchart, it should be appreciated that when generating an update package, the generator has to predict the updated devices' behavior, including protection buffer usage, thus allowing to improve usage thereof, e.g., by determining the update sequence. Only upon predicting that the protection buffer is fully occupied (or unavailable), copy commands are replaced with insert commands, as done, for example, in U.S. Pat. No. 6,018,747.

In 1101 an update package (constituting a first update package) is obtained by any method. It can be generated locally, or received from an external source, e.g., via a communication network, in an inter-process communication, by reading it from any kind of storage device, etc. To this end the update package (constituting a first update package) can be generated by any known method, such as in accordance with U.S. Pat. No. 6,546,552, WO 2004/114130 or WO 2005/003963 or by utilizing a known per se diff tool.

In one embodiment, as part of the update package generation, the old version is decompressed and loaded into RAM and/or the new version is decompressed and loaded into RAM. In this embodiment, a correspondence is determined between the virtual blocks of the decompressed old content and the physical blocks of the compressed old content, and/or similarly a correspondence is determined between the virtual blocks of the decompressed new content and the physical blocks of the compressed new content, for example by executing method 800 or from the previous storage of virtual block boundaries during a previous execution of method 700 or 800. For example in one embodiment a received update package may optionally include the virtual block boundaries or alternatively, as part of the decompression executed in stage 1101, virtual boundaries (defined for example as in method 800) may be stored in a locally generated update package.

If the correspondence between virtual blocks (either with old or new uncompressed content) and physical compressed blocks is known, then the source uncompressed segments and target uncompressed segments in virtual blocks upon which the update commands are executed can be easily associated with corresponding compressed physical blocks in order to determine when the source uncompressed segments and target uncompressed segments are updated in the update sequence. Hereinbelow, unless specifically stated otherwise, it is assumed that source and target segments are uncompressed.

The update package is analyzed in 1102 in order to identify corresponding (uncompressed) segments and an update sequence. The update sequence can be determined, for example, in accordance with FIG. 10 described above. It is noted that before determining the update sequence it is possible to analyze the update package in order to identify corresponding segments therein. Alternatively, it is possible to identify corresponding segments when determining the update sequence (see for example, 1001 in FIG. 10). In addition, in those cases when the update package is pre-organized in accordance with a preferred update sequence, or when it is associated, e.g., with information laying out a preferred update sequence (such as a list), 1102 can be skipped.

In order to generate the update package in accordance with the embodiment it is required to obtain (1103) the size of a storage area available to be used as a protection buffer in an updated device, thus generating an update package optimized for this device. This embodiment assumes that all the storage devices that will be updated in accordance with the generated update package have an available storage whose size is substantially equal to the obtained size.

Alternatively, according to another embodiment, it is possible to have a predetermined size for the protection buffer. An update package generated in accordance with this latter embodiment is adapted for updated devices that have free area larger or equal in size to the predetermined size. For example, it is possible to determine the required size of the protection buffer (such as the pre-determined size), e.g. in the update package generator, and store the required size in the update package. When an updated device receives the update package, or when the update process starts operating accordingly, the updated device can try to allocate a protection buffer, in accordance with the required size stored in the update package. If there is not enough free storage area in the device for allocating the protection buffer, it is possible to terminate the operation of the update process, thus avoiding, e.g., memory overflow. It is even further possible to inform the update package server 105 about the situation, possibly including the updated size of the available storage area, thus allowing transmission or re-transmission of an update package better adapted to the updated device. It is noted that such an update package can be pre-prepared by the update-package generator 104 and be pre-stored in the update server as described below. Alternatively, the update server can instruct the update package generator 104 to generate an update package adapted to the available size etc.

Yet other embodiments are also allowed. For example, it is possible to communicate with the updated devices for obtaining their available storage which can be used as protection buffer (unlike receiving the information from the device upon transmitting thereto an update package that is not adapted), and then to generate an update package adapted for the obtained size, and to convey it to the updated device. Combinations of the abovementioned embodiments are also allowed.

Those versed in the art would appreciate that when an updated device receives an update package it stores it in an accessible storage area. Therefore, when considering available storage area in an updated device, it should be taken into account that the update package needs to be stored therein too. Similarly, a certain storage area may be required for the operation of the update process etc.

Returning to FIG. 11, in order to generate an update package in accordance with the embodiment, a cursor is initiated in 1104 to be indicative of the first update command in the update sequence. This cursor constitutes a "commands cursor". In the described embodiment, the update commands refer to uncompressed content (i.e. the segments of virtual blocks). Before continuing with describing FIG. 11, it is noted that update commands are generally divided, according to the embodiment, into three main categories. One category includes commands that are founded, or based on original content stored in segments of the original version, or in other words, such commands use original content in order to generate updated content. These commands constitute "founded commands" or "transforming commands". For example, a "copy command" belongs to the category of transforming commands. A transforming command, thus, has a "source segment" (the original segment on whose original content the command is based) and a "target segment" (the updated segment whose updated content is generated by the transforming update command). The second category, of "incorporating commands", includes update commands that incorporate into the updated version updated content that is not based on original content. For example, an "insert command" introduces content into the updated version; this content is not taken from the original version, but more likely from the update package or from any other source. The third category is of "erasing commands". An erasing command erases original content included in a segment of the original version, without yielding a corresponding segment thereof in the updated version. An example of an erasing command is the "delete" update command.

It is noted that copy commands are not the only transforming commands. Any command that has a source segment and a target segment is a transforming command. For example, one such transforming command can transform all lower case characters stored in the source segment to upper case. Another transforming command can multiply a number stored in the source segment by a certain value, etc.

In addition, the content affected by a transforming command constitutes "modified content". When considering the block where the source segment resides (constituting a "source block"), and the block where the target segment resides (constituting a "target block"), it should be appreciated that at least part of the content of the source block is modified in the target block. That is, it is possible that part of the source block is, e.g., deleted, and hence does not form part of the content stored in the updated block.

In accordance with the embodiment illustrated in FIG. 11, for each update command in the update package (see 1105), if in 1106 it is determined whether the commands cursor is indicative of a transforming command, and if so, it should be checked whether the original content of the source segment requires explicit protection or not.

It was previously demonstrated, with reference to FIGS. 9A and 9B, for example, that when updating content in an updated block, explicit protection of an original segment's content is not required when, in accordance with the update sequence, the physical (compressed) block corresponding to a transforming command's target uncompressed segment's virtual block precedes the physical (compressed) block corresponding to the transforming command's uncompressed source segment's virtual block. Therefore, in 1107 it is checked whether physical (compressed) block corresponding to a source uncompressed segment's virtual block precedes the physical (compressed) block corresponding to a target uncompressed segment's virtual block, or if the physical (compressed) block corresponding to a source uncompressed segment's virtual block is the same as the physical (compressed) block corresponding to a target uncompressed segment's virtual block, and if so, the content of the source segment requires protection. Before protecting the content, it is further checked in 1108 whether the protection buffer has enough available storage area to store the protected copy of the source segment.

If there is enough space available in the protection buffer, in 1109 the available size is reduced by the size of the source segment (for example in uncompressed format), and optionally in 1110 the source segment is marked as free. It is noted that instead of marking a source segment as free, alternative embodiments can delete the original content of the source segment or perform any other applicable operation, including not performing an operation at all.

In 1111 the commands cursor is advanced to the next update command in accordance with the update sequence. To this end it is noted that during update package generation there is no need to update the original version to the updated version, and "simulation" thereof is sufficient. Thus, when operating in accordance with the flow chart of FIG. 11, the update package generator (or any other processor generating the update package accordingly) does not have to operate in accordance with the update commands.

Returning to 1108, if it is found that there is not enough available space in the protection buffer to store the protected content of the source segment, it is understood that this content must be protected elsewhere before overwriting the corresponding compressed segment with updated content. It was previously noted, with reference to FIGS. 3B and 3C, that the content can be protected, e.g., by storing a copy thereof in the update package itself. It is assumed hereinbelow that the uncompressed content to be protected is stored in the update package, but alternatively the compressed content to be protected may be stored in the update package. Therefore, in 1112 the update command indicated by the commands cursor is replaced with an Insert command, and in 1113 the original content of the source segment is protected by storing a copy thereof in the update package (see, for example, U.S. Pat. No. 6,018,747)

In the embodiment depicted in FIG. 11, when the available protection buffer size is too small (see 1108), content requiring protection is stored in the update package. It should be understood that even though a source segment is too large for protection in the protection buffer, as long as the protection buffer's available size is larger than zero, it is possible that contents of other source segments (being source segments of other transforming update commands further in the update sequence) are small enough for protection therein.

Alternatively, in one embodiment, if the answer to 1108 is "no" a predetermined number of times, then when processing subsequent transforming commands 1112 directly follows 1107 (i.e. assuming no space in the protection buffer regardless of the size of the source segment, thereby bypassing 1108 to 1110 in subsequent iterations) In one embodiment, it may also be checked in 1107 whether the source segment is copied to an updated virtual block earlier in the update sequence, so that the copied segment can be used instead when updating the later virtual block. In this case, the update command can be modified to refer to the copied segment and the method continues directly to 1111 (bypassing 1108 to 1113)

In one embodiment 1107 may be modified to also check whether the source segment had already been protected in the protection buffer/update package, for example because of an earlier processed transforming command. In one embodiment, if the source segment had already been protected in the protection buffer/update package then method continues directly to 1111 (bypassing 1108 to 1113), provided the source segment can be easily obtained during update. In another embodiment, instead of protecting the source segment again, a pointer to the protected source segment may be instead stored.

It should be evident to the reader that depending on the embodiment, the size of the protection buffer may be decreased at the expense of the update package and vice versa, for example to meet system constraints.

It should be noted that the update package can include optionally include decompression commands, for decompressing compressed original content stored in storage blocks. It can also optionally include compression commands, for compressing the updated portions into content stored in blocks of the compressed updated version.

Depending on the embodiment, the update package can be compressed prior to provision to an updated device as described below with reference to FIGS. 12A and 12B, using a compression method agreed to by the update package builder and the updated device.

Before turning to describe the update process operating in the updated devices, it should be appreciated that according to some embodiments, the protection buffer can be reused in order to increase its effectiveness, as was already noted with reference to FIGS. 9A, 9B and 9C. In other words, when content stored in the protection buffer is not required anymore, some embodiments can free the area used by this not-required content (e.g., by physically deleting the content or by marking it as free etc.) thus allowing the update process to re-use the free area for further backup operations required while updating. Reusing the protection buffer effectively allows performing more protection operations and hence, the update package size can be reduced (less protected content needs to be stored therein). The reuse is simulated during generation of the update package, hence allowing the generator to know when the protection buffer is full and when there is a free space therein.

Figure 12A:
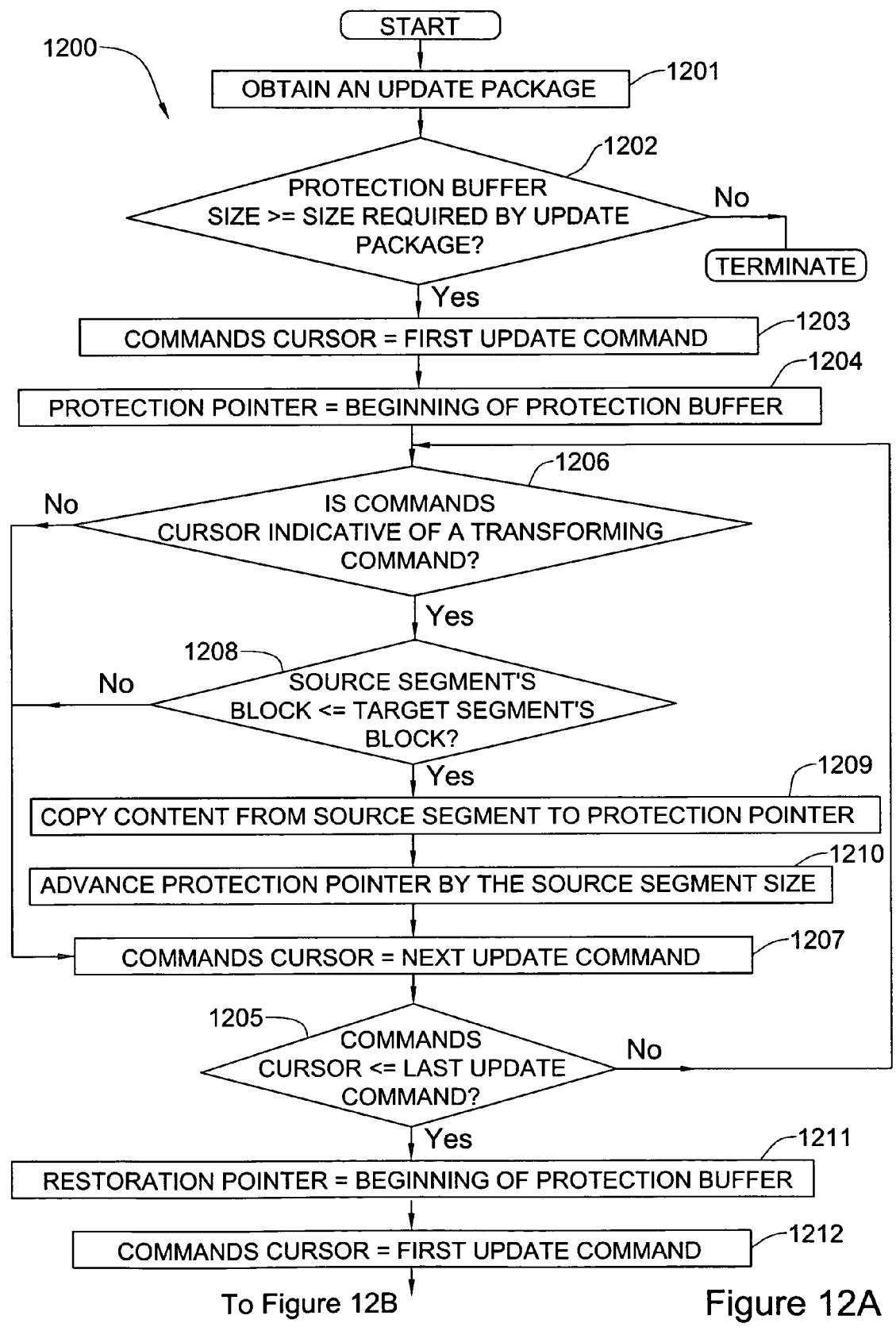
FIG. 12 (divided into 12A and 12B) is a flowchart depicting updating of an original version to an updated version thereof, in accordance with one embodiment of the invention.
Figure 12B:
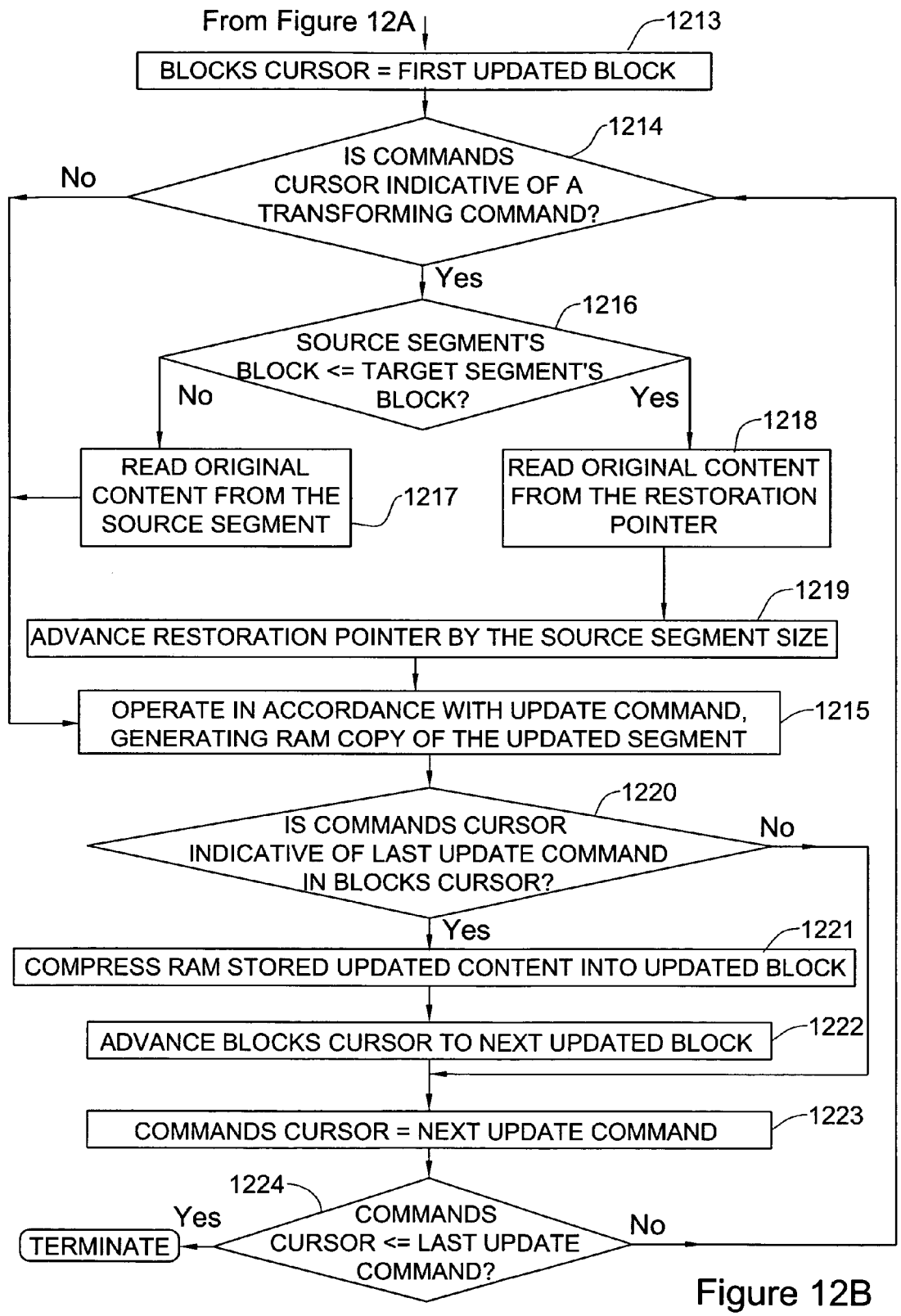

After considering an embodiment for generating an update package, the description turns now to FIGS. 12A and 12B illustrating together a flowchart depicting updating an original version to an updated version thereof, in accordance with one embodiment of the invention. The flowchart depicted in FIGS. 12A and 12B is applicable, for example, in an update process operable in an updated device. It should be appreciated that the illustrated embodiment is adapted to operate in an updated device having a storage device including blocks.

When an update process starts operating, in 1201 it obtains, or accesses an update package stored in the storage device 103, e.g., in volatile or non-volatile memory. It is appreciated that the updated device could have received the update package previously from the update server 105. Alternatively, the update package was loaded to the storage device by any applicable means, such as by copying it from a portable memory device (e.g., a floppy or compact disc) or by receiving it from the Internet. Depending on the embodiment, the update package may or may not need to be decompressed using a decompression method agreed to by the package builder and the updated device. It should be further appreciated that according to the embodiment, the accessed update package has a certain update sequence. The update sequence can be determined simply by the order of the update commands in the update package, or it can be determined in accordance with additional information stored in association with the update package, such as a list determining the sequence for executing update commands, e.g., if different from the sequence in which the commands appear in the package. According to the example, the update sequence is adapted to reduce protection buffer usage in the updated device, or at least improves utilization of the protection buffer available therein. According to one embodiment, the update package could have been generated and the update sequence could have been determined (e.g., in an update package generator) in accordance with the flowcharts of FIGS. 10 and 11.

In 1201, the original compressed version is retrieved from the storage device and decompressed into RAM. The correspondence between the virtual blocks in the decompressed original version and the physical blocks in the compressed original version may be determined for example through the execution of the method of FIG. 8 or from the previous storage of virtual block boundaries during a previous execution of the method of FIG. 7 or 8. For example in one embodiment the obtained update package may optionally include the virtual block boundaries of the decompressed original version. In any case, the source uncompressed segments in virtual blocks upon which the update commands are executed can be easily associated with corresponding (compressed) physical blocks in order to determine when the uncompressed source segment is updated in the update sequence.

In one embodiment, the obtained update package includes the virtual boundaries of the new uncompressed version, for example which were earlier determined and stored through the execution of the method of FIG. 7 or 8. In this case, the target uncompressed segments in virtual blocks upon which the update commands are executed can be easily associated with corresponding (compressed) physical blocks in order to determine when the target uncompressed segment is updated in the update sequence. Therefore for simplicity of description it is assumed that the virtual boundaries were received in the update package. Further in the description this assumption will be relaxed when describing another embodiment.

According to the embodiment, before updating any content (thus risking with overwriting original content requiring protection), the update process checks in 1202 that there is enough storage device available in the updated device for running the update process in accordance with the update package obtained in 1201. According to the embodiment, if the update package includes an indication of the required protection buffer size, this required protection buffer size is compared in 1202 with the protection buffer size available in the updated device, terminating the update process if the available protection buffer size is not enough.

Furthermore, before updating any content the update process protects all the original content requiring protection. Due to the verification performed in 1202, it is assured that the available protection buffer is sufficient for storing all the data requiring protection, and therefore a further test such as "available protection buffer size>=segment protected size" is redundant.

In order to allow protection, a pointer or a cursor is initiated in 1203 to be indicative of the first update command in accordance with the update sequence. This cursor constitutes a "commands cursor". The commands cursor will be further advanced in accordance with the update sequence.

Furthermore, in 1204 a pointer to the protection buffer is initiated, constituting a "protection pointer". The protection pointer is indicative of the position in the protection buffer into which protected data should be written next. It is noted that according to the embodiment the updated device can generate a copy of the protected content, e.g., in RAM (constituting a "RAM protection buffer"), and then, when the RAM copy is complete (i.e., it includes all the content that needs to be protected), write it into the "non-volatile protection buffer" (constituting also a "non-volatile backup buffer") in the non-volatile storage device. Writing the protected content stored in the RAM protection buffer into the non-volatile backup buffer is referred to as "backup block storage operation". As the non-volatile storage device is a storage device including blocks (unlike RAM), this method is more efficient than writing content of every protected segment directly into the non-volatile protection buffer. To this end it is appreciated that in this case the protection pointer is indicative of the position in the RAM protection buffer into which protected data should be written next. It is noted though that hereinafter, unless specifically noted, the description will refer to "protection buffer" without distinguishing between the RAM and the non-volatile protection buffers.

It is noted that "RAM protection buffer" is only one example of a "volatile protection buffer".

It is now checked whether any segments in the virtual blocks need to be protected in the protection buffer. For each update command (see 1205), the update process checks (in 1206) if the commands cursor is indicative of a transforming update command. It should be appreciated that an update command that is not a transforming update command does not require protection, and therefore, in 1207 the commands cursor can be advanced to the next update command. However, if in 1206 the update process determines that the update command is a transforming command, it further checks in 1208 if the physical block corresponding to the virtual block that includes the command's source segment precedes in the update sequence or is the same as the physical block corresponding to the virtual block that includes the target segment. Again, it should be understood that if the physical block corresponding to the virtual block that includes the target segment precedes the physical block corresponding to the virtual block that includes the command's source segment, no protection is required and the update process can advance (in 1207) the commands cursor. However, if the physical block corresponding to the virtual block that includes the command's source segment precedes in the update sequence or is the same as the physical block corresponding to the virtual block that includes the target segment, protection is required. Thus, in 1209 the update process copies the source segment to the protection buffer, i.e., to the protection pointer, and in 1210 it advances the protection pointer by the size of the source segment. In an embodiment where the source segment had been copied to an updated virtual block earlier in the update sequence and the update command had been modified to copy the target segment from the copied segment in the updated block, protection is also not necessary. In an embodiment where the source segment had already been protected in the protection buffer/update package (for example because the source segment had already been subject to a transforming command), protection of the same source segment may also not be necessary, for example provided the source segment can be easily obtained during update. In another embodiment, instead of protecting the source segment again, a pointer to the protected source segment may be instead stored.

As noted above, for simplicity's sake it is assumed that the protected segment is uncompressed but in other embodiments the segment may be compressed and/or otherwise manipulated.

As was noted before, the process described so far, with reference to 1206, 1207, 1208, 1209 and 1210 repeats (see 1205), until the update process protects all the segments requiring protection. After this has been completed, the content requiring protection is protected in the protection buffer. The number of protection operations used to protect the protected content in the protection buffer is referred to as p. It is noted though that if the protection buffer is a RAM protection buffer, its content should be stored in the non-volatile protection buffer before starting to update the original content of the original version, thus overwriting at least portions of the original content, thus providing also reliability to the update process in case the process is aborted and restored. The storage in the non-volatile protection buffer can take place, e.g., after 1205, and before moving to 1221.

After protecting the content in the protection buffer, the update process can start updating the original content originally stored in the storage device, thus generating the updated version. In order to do so, it should be appreciated that original content previously protected in the protection buffer should be read therefrom, instead of reading it from the original version. In other words, such content should be restored. Therefore, a new pointer, constituting a "restoration pointer" is initialized in 1211, initially pointing to the beginning of the protection buffer. In 1212 the commands cursor is re-set to be indicative of the first update command in the update package.

It is assumed in the illustrated embodiment that the virtual boundaries of a virtual updated uncompressed block corresponding to a compressed physical block are known, and that therefore each updated virtual block can be efficiently and independently compressed into a physical block.

It was previously explained that the illustrated embodiment is adapted for storage devices including blocks, hence creating a copy of an updated virtual block in RAM (or generally in a "volatile updated buffer"), and then, compressing the content of the whole virtual block to a corresponding physical block in the non-volatile storage device. The operation of compressing the content stored in the volatile updated buffer into a physical block in the non-volatile storage device is referred to as "update block storage operations". Therefore, an additional cursor, constituting "blocks cursor" is initialized in 1213, to be indicative of the first updated block in accordance with the update sequence.

Hereinafter, the number of update block storage operations and backup block storage operation is referred to as m. Yet this is non-limiting and m represents the total number of block storage operations, which includes every operation storing content in a block in the non-volatile storage device.

If in 1214 it is determined that the commands cursor is indicative of an update command that is not a transforming update command, it is appreciated that this update command is not based on content originally being part of the original version, that is, it is not based on content stored in either the original version or the protection buffer, and therefore in 1215 the update process can operate in accordance with the command, thus generating a copy of the target segment in RAM. The update commands that are not transforming commands can optionally include insert commands inserted into the update package in 1112

Returning to 1214, if the update process determines that the commands cursor is indicative of a transforming command, it further checks, in 1216, whether the physical block corresponding to the virtual block that includes the command's source segment precedes in the update order or is equal to the physical block corresponding to the virtual block that includes the target segment. As mentioned above in the illustrated embodiment the analysis relates to uncompressed segments in virtual blocks and commands relating to the uncompressed segments in virtual blocks. Remembering that no protection is required for a source segment included in virtual blocks corresponding to physical blocks that follows the physical block corresponding to the target segment's virtual block in accordance with the update sequence, it is appreciated that the update process did not protect the source segment of this update command in 1208 and 1209, leaving the original content stored in the original segment instead of copying it into the protection buffer. Therefore in 1217 the update process reads the source content from the update command's source segment, and in 1215 the update process operate in accordance with the update command, thus generating a copy of the target segment in RAM.

However, if in 1216 the update process determined that the physical block corresponding to the source segment's virtual block precedes or is the same as the physical block corresponding to the target segment's virtual block, it should read the original content (or a copy thereof) from the protection buffer. Therefore, in 1218 the update process reads the source content from the address indicated by the restoration pointer, in 1219 the restoration pointer is advanced by the size of the source segment, thus pointing to the next protected segment, and in 1215 the update process operates in accordance with the update command, thus generating a copy of the target segment in RAM.

One way or the other, following 1215 (the execution of the update command, generating the target content in RAM) it is appreciated that the update process can compress the content stored in RAM into the updated block if in 1215 it wrote the content of updated block's last target segment into RAM. Therefore, in 1220 the update process checks whether the commands cursor is indicative of the last update command in the block indicated by the blocks cursor, and if so, the uncompressed content of the updated virtual block, currently stored in RAM, is compressed in 1221 into the updated physical block in the storage device, and in 1222 the blocks cursor is advanced to the next updated block. Alternatively, the content of the updated virtual block may in some cases be first compressed into RAM (of the size of a physical block) and then copied to storage. In an alternative embodiment, each updated segment in a virtual block may be separately compressed into RAM and when the correct size of a physical block is reached in RAM, the compressed block is copied to storage.

It is noted though that if in 1220 the update process determined that the update command is not last in the updated block (as indicated by the blocks cursor), the commands cursor is advanced (see 1223) without copying the RAM stored content and without advancing the blocks cursor. It is further noted that by advancing the commands cursor (in 1223) beyond the last command in the updated virtual block, it becomes indicative of the first update command in the next updated virtual block. And thus, if the advanced commands cursor precedes the last update command in accordance with the update sequence, or is equal to (see 1224), the update process can operate in accordance with this update command, thus generating updated content (see 1214, 1215, 1216 etc.). Alternatively, if in 1224 the update process determines that it moved past the last update command it can terminate, as the updated version is stored in the storage device.

In another embodiment, rather than compressing each block separately as described above, which assumes that the virtual boundaries are known or that efficient compression is not important, stage 1221 instead follows 1224, i.e. a block by block compression is achieved, for example using method 700.

In another embodiment, assume that the original version is decompressed into RAM and that the updated uncompressed version is to be written to a different area in RAM (i.e. not overwriting the original version in RAM). In this embodiment, prior to stage 1207 (i.e. prior to advancing to the next update command), the current update command can be executed, thus building the complete updated uncompressed version in a different area in RAM. In this embodiment, stages 1211 and 1212 can be omitted. In stage 1213, the block cursor points to the updated virtual block in RAM corresponding to the first physical block in the update sequence. Stages 1214 to 1220 may be omitted in this embodiment because the original version is still in RAM and therefore all original segments may be accessed during the update. Stages 1221 and 1222 directly follow stage 1213, i.e. with the compression of each virtual block and writing to storage occurring in the update order (assuming the virtual boundaries of updated uncompressed virtual blocks corresponding to compressed physical blocks are known). Stages 1221 and 1222 are repeated until the last block in the update order is reached. Stage 1223 and 1224 are omitted.

In other embodiments, assume that the virtual boundaries for virtual blocks in the updated version are not known from the update package or from prior to executing method 1200. Also assume that the update commands in the update package are independent of the virtual boundaries of the blocks in the updated version. For example the update package may designate an address range which should be allocated in RAM for the updated uncompressed version and the commands can relate to addresses within that range (for example with respect to the lower or upper bound of the range). In these embodiments, the update commands are executed in no particular order, building an updated uncompressed version in RAM) (the old uncompressed version is not overwritten). Then the uncompressed updated version may be compressed in RAM, for example using method 700 where a same size area in RAM substitutes for each physical block. Once compression has been achieved, the virtual block boundaries of the uncompressed updated version are known. In one of these embodiments these virtual boundaries of the updated version are stored in non-volatile memory, for example in the protection buffer. The update commands are then analyzed, for example in the update sequence (or in any sequence followed in method 1100) in order to protect any source segment which needs to be protected in the protection buffer—see above description of stages 1203, 1204, 1206, 1208, 1209, 1210, 1207, and 1205. The compressed updated version may then be written in the update order to storage (stage 1221).

In some embodiments in addition or instead of a restoration pointer, another medium for locating the protected content in the protection buffer is used, for example a cross reference table between location of protected segment in the protection buffer and source segment/block and/or target segment/block. In these embodiments, there is no need to process each block completely i.e. update, advance restoration pointer, compress and write to storage prior to processing another block, so that the restoration pointer will be pointing to the correct segment in the protection buffer if interrupted.

It should be appreciated, further to the flowchart of FIGS. 12A and 12B and further to the example of FIGS. 9A, 9B and 9C that the size of the protected content (just before storing it in the non-volatile protection buffer) may in one embodiment includes less blocks than the number of n (n>1) blocks of the original version that are modified in the updated version. That is, in this embodiment less than n operations are required in order to store protected content in the non-volatile protection buffer. If the number of block storage operations is designated m, it should be appreciated that in this embodiment 2<=m<2n.

It is further noted that reusing the protection buffer could be beneficial. The reuse which was simulated during generation of the update package (with reference to FIG. 11) reflects the behavior of the update process described in FIGS. 12A and 12B. Hence, if reuse is utilized, it is possible to check further to 1221 if the updated compressed content just stored used protected content and if so as long as the protected content is not required for updating additional segments (corresponding to the same physical block or corresponding to other physical blocks following in accordance with the update sequence), this protected content can be marked as free. In this embodiment, when all the protected content stored in one block of the non-volatile protection buffer is marked as free, this protected content can be deleted and the block can be reused.

As mentioned above, in some cases the compression algorithm and/or compression ratio used for the new version is not necessarily the same at the compression algorithm and/or compression ration used for the original version. Method 1200 fully allows for this possibility since there is no limitation on whether the compression used in the new version is the same or different as the compression used in the original version. It should further be understood that in some embodiments there may not be an updating of uncompressed content but simply a recompression of original content using a different algorithm and/or compression ratio. In these embodiments, the update package may include commands to recompress the original content using a different algorithm and/or compression ratio. Because there are no transforming commands in these embodiments, no source segments need be protected and therefore simulation of segment protection in the protection buffer and replacement of the update commands with insert commands in method 1100 may be omitted in these embodiments. Similarly, actual protection of source segments the protection buffer in method 1200 may be omitted in these embodiments. The in-place updating should therefore be understood to include embodiments where an original version is updated in-place with a new ("updated") version which has been compressed in accordance with a different algorithm and/or compression ratio than the original version, regardless of whether the content in the uncompressed original version is identical or not to the content in the uncompressed updated version.

Assume now that while updating the blocks in accordance with FIG. 12, the process aborts for any reason and the content in RAM is erased. In this case, the physical block contents in the (non-volatile) storage device, the update package and protection buffer are not erased. However, the reader will understand based on the discussion above that once stage 1221 or the equivalent writing to storage has been executed for at least one block, some of the physical blocks which originally comprised old (compressed) content, will instead comprise at the time of the abort new (compressed) content due to the updating which has already taken place. In some embodiments, because the segments which require protection have been protected in stage 1209, the updating can reliably continue with the next block to be updated according to the update sequence. The resume location can be determined for example as in US Published Application Number 20050216530 to Meller et al, which is incorporated by reference herein. In one of these embodiments, assuming the virtual boundaries of the updated virtual blocks corresponding to the physical blocks is known then no further handling of the physical blocks comprising new content is necessary. Therefore, in this embodiments all the physical blocks which have not yet been updated (i.e. comprising old content) may be decompressed into RAM, for example in accordance with method 800, and then the method can continue with stage 1213 with the blocks cursor pointing to the first block in the update sequence which has not yet been updated. In some of these embodiments, the restoration pointer of 1218 may not be relevant and the content from the protection buffer may be retrieved for example using a cross reference table.

Although the described embodiments described with reference to FIGS. 11 and 12 assume that source segments relating to transforming commands may be potentially protected in the protection buffer and/or update package, it should be understood that in other embodiments, other data relating to transforming commands may in addition or instead be protected. For example in one of these other embodiments, target segments may be potentially protected instead of or in addition to source segments. As another example, in one of these other embodiments a manipulated form of source segments and/or target segments may be protected, where the manipulation may or may not be related to the transformation prescribed by the command.

An embodiment described thus far assumed that each virtual block is independently compressed into a physical block. Therefore in this embodiment, each physical block can be independently decompressed into a corresponding virtual block.

After understanding the single block embodiment, it should be noted that sometimes compression is performed on more than one block at a time (i.e. the compression of one block may depend on the compression of other blocks). For example, if the original and updated versions are pre-prepared and pre-compressed, and then conveyed to the update package generator for update package generation (while the update package generator has information regarding the compression sequence and compression algorithms). An alternative embodiment, thus, referred to as a "multi block embodiment", is described below.

Figure 13:
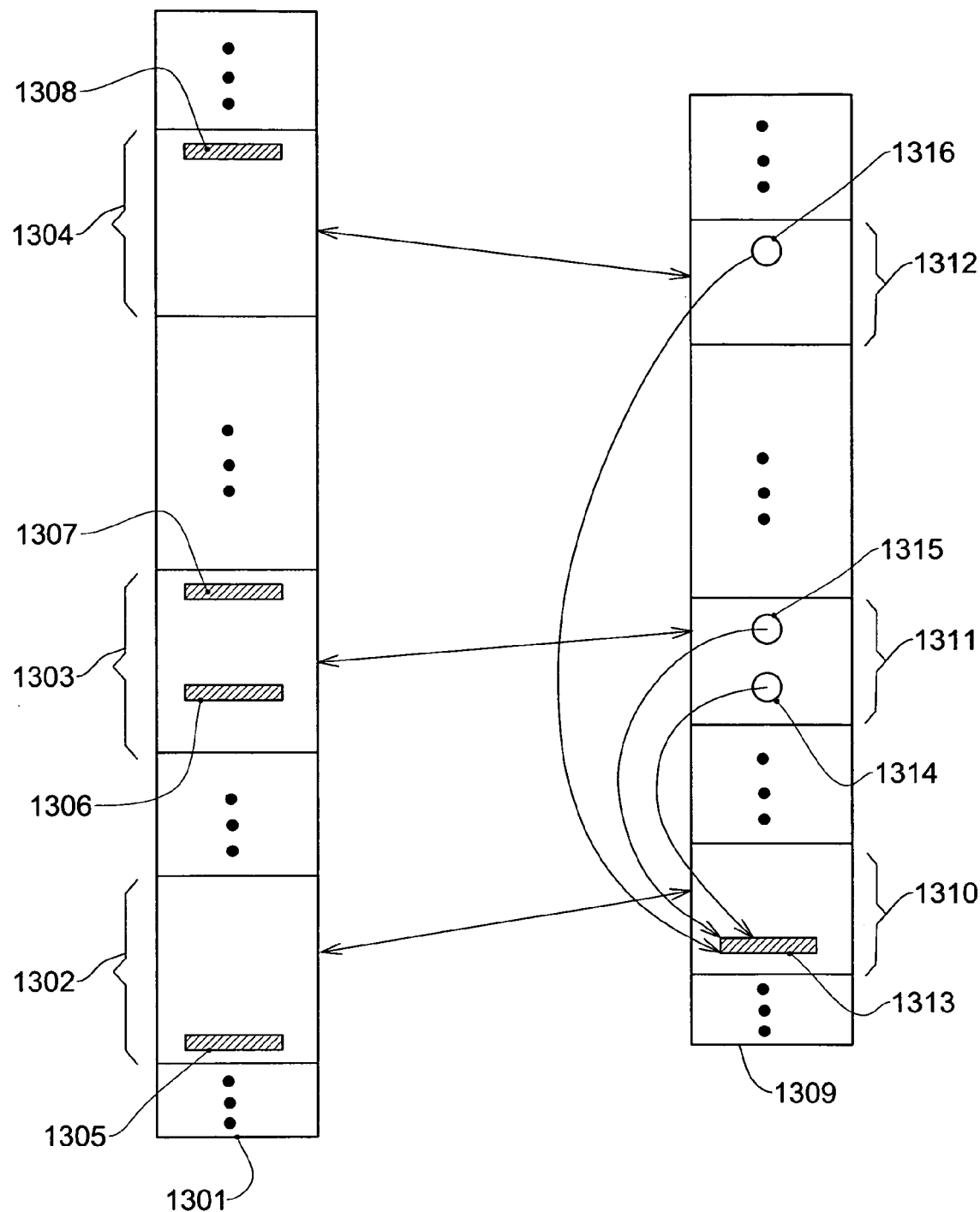
FIG. 13 illustrated an exemplary uncompressed version including a repetitive piece of content, and the respective compressed version.

In the multi-block embodiment, in order to be able to successfully decompress certain compressed content, stored in certain blocks including part of the compressed original version, it is sometimes required to decompress compressed content stored in other blocks, on which the certain compressed content depends. For example, in some compression methods (such as the one used by the zip tool, referred hereinafter as 'zip'), if a piece of content re-appears more than once in the content, one appearance is kept in one block of the compressed version, while the other appearances are replaced with a pointer, or a "compression-reference" to the one appearance, thus preventing repeating appearances of the piece (the pointer can be further compressed etc.). This example is illustrated in FIG. 13, where 1301 represents an uncompressed version. The uncompressed version 1301 includes several virtual blocks, out of which the 1302, 1303 and 1304 are depicted. The virtual block 1302 includes a piece of content 1305. The virtual block 1303 includes two pieces of content, 1306 and 1307, that are identical to the content of 1305. The virtual block 1304 also includes a piece 1308 whose content is identical to the content of 1305. The version 1309 is the compressed version, corresponding to the uncompressed version 1301. The compressed version 1309 is stored in the storage device in a version that spans over at least three blocks, 1310, 1311 and 1312 respective of the virtual blocks 1302, 1303 and 1304. The content of piece 1305 is copied to the compressed version, giving rise to the piece 1313. It is noted that this piece 1313 can be compressed using other compression methods, but for the sake of simplicity of the description this possibility is ignored in the description of FIG. 13.

The block 1311 includes two compression-references, 1314 and 1315, both are indicative of the piece 1313, while the block 1312 also includes one such compression-reference 1316. The compression-references 1314, 1315 and 1316 replace the pieces 1306, 1307 and 1308, respectively. If the size of a compression-reference is smaller than the size of the respective piece it replaces, it is appreciated that the use of such a compression-reference reduces the size of the content stored in the version, or in other words, it compresses the content. It is further noted that the compression-references 1314, 1315 and 1316 can reference the uncompressed piece 1305, corresponding to 1313, and on any other corresponding uncompressed or compressed piece.

That is, FIG. 13, illustrates compression-dependencies between blocks. In order to decompress content of a block including such a compression-reference, it is required to decompress the content of the block including the compressed one appearance or at least a portion of this content, wherein the portion includes the one appearance. For example, in order to decompress the content of block 1312, the content of piece 1313 must be decompressed. It was noted before that unlike the simplified example of FIG. 13, where the content of 1313 appears as if it is uncompressed, the content of 1313 is usually further compressed, and thus it must be decompressed before the blocks 1311 and 1312 can be decompressed, i.e., before the uncompressed content of 1313 is copied into blocks 1311 and 1312.

If the content stored in the one block (including the one appearance) is updated before decompressing the other appearances (i.e., before decompressing the content of other blocks where the indicators are stored), then it may turn out to be impossible to decompress the other blocks. In the example, after the content of 1313 is updated, it is impossible to copy the original content of 1313 (or the content of 1305) to replace the indicators 1314, 1315 and 1316.

One way to overcome this limitation, according to embodiments of the invention, is to copy the content of 1313, e.g., to a backup storage, before overwriting it with the updated content. Then, when decompressing blocks 1311 and 1312, the original content of 1313 can be copied from the backup storage, instead of from 1313.

In addition or instead, computations needed for decompressing a particular block may need to be protected. Examples of computations include inter-alia: content of state registers, counters and/or tables computed during the decompression prior to the decompression of the particular block, one or more tables generated and written to previously compressed block(s) which are also required for the decompression of the particular block, for example Huffman trees of the Zlib or Gzip compression methods.

The reader will understand that in some embodiments, in addition to the compression dependencies illustrated in FIG. 13 there may also be segments whose update requires the original content of a modified segment, as discussed above. For example in one embodiment in addition to the compression dependencies illustrated in FIG. 13, there may be segments whose update requires original content such as in FIG. 9A.

Therefore generally, when updating content which will be compressed and will overwrite original compressed content, at least a portion of the original content (for example when uncompressed) needs to be protected (e.g., in the backup storage) if it is required for the update of other segments in the current block or for the update of other virtual blocks corresponding to physical blocks further in accordance with the update sequence (see, e.g., FIGS. 10, 11 and 12), if it is required for decompression of original physical blocks further in the update sequence, and/or if it is required for decompression of new (updated) physical blocks earlier in the update sequence. As explained above other computations may also or instead need to be protected.

It was noted before, with reference to FIG. 13 that in order to decompress content of a block including a compression-reference, it is required to decompress the content of the block including the referenced piece of content. See, e.g., block 1311 in FIG. 13 When updating version 1309 to another version not illustrated in the figure, in order to decompress block 1311, block 1310 must be decompressed too.

However, assuming that the blocks in FIG. 13 relate to the old version, if block 1310 precedes block 1311 in the update sequence, it is possible that the referenced piece of content (stored in block 1310) will be updated before the update process reaches block 1311. If this is the case, it may become impossible to decompress the content stored in block 1311. Therefore, the content stored in the referenced piece should be protected, e.g., in the backup storage, thus allowing decompression of block 1311 even though the compression-reference included therein originally references already overridden and thus unavailable piece of content.

Generally, when updating compressed content stored in an original block ("updated-block"), and the compressed original content includes compression-references to blocks preceding the updated-block in accordance with the update sequence (constituting "backward-references"), backward-referenced pieces of content (compressed or not) should be protected, e.g., in the backup storage. By protecting the content in non-volatile memory (such as backup storage) it is assured also that the update process can be resumed if it fails before termination, when some blocks include compressed updated content while others include compressed original content. That is, protection provides reliability in this case.

In addition, it should be considered that compression-references for original blocks can reference pieces of content being further to the updated-block in the update sequence (constituting "forward-references"). As was noted before, it is appreciated that the original content of the updated-block cannot be decompressed and surely not updated, before the referenced piece of content is decompressed. Thus, if the update process fails before updating the updated-block, it is assured that forward referenced pieces of content will not be overwritten yet, and therefore it will be possible to decompress the forward-referenced pieces of content again. It is not required, therefore, to protect forward-referenced pieces of content in non-volatile storage (e.g., backup storage), and thus it is enough to decompress them into RAM (constituting RAM-storage).

According to one embodiment of the invention, forward-referenced pieces of original content can be stored in the RAM-storage in the beginning of the update process, before updating content and overwriting original compressed content with updated compressed content. It is appreciated that it is possible to decompress content stored in blocks where forward-referenced pieces of content exist between these blocks, then storing in RAM-storage only the content used by the forward-referenced pieces. In a similar way, all backward-referenced pieces of content can be protected in the backup storage before updating starts.

It should be appreciated that if all the forward-referenced pieces of original content are stored in the RAM-storage and all backward-referenced pieces of content are protected in the backup storage, update can proceed in accordance with any required sequence, including an update sequence which is different than the compression sequence, as forward-referenced pieces of content are backed up in the RAM-storage while backward-referenced pieces of content are protected in the backup storage.

It is further explained that when linear compression is utilized, compression-references usually refer to pieces of content being before the compression-reference in accordance with the compression sequence. However, exceptions can occur. For example, Hoffman code is one kind of a linear compression, wherein those versed in the art would appreciate that a Hoffman-code compressed version includes a Hoffman table. However, this example is non-limiting and other objects, such as different kinds of directories etc. can be stored as well. In those cases when the directories and other objects are stored at the end of the original compressed version (again, in accordance with the update sequence), these objects can be protected in the backup storage, e.g., by inserting a special update command into the update package.

Similarly it should be appreciated that if the updated (new) compressed content references content later in the update order, then the new content of the updated-block cannot be decompressed before the referenced piece of new content is decompressed. However if the update process fails between the update of the referencing content and the referenced content, then unless the referenced content had been protected decompression of the new compressed content will not be feasible.

It will now be detailed non-limiting methodology embodiments for updating content where the old compressed version and/or the new compressed version have been compressed using multiblock compression and there can therefore be compression dependencies between blocks.

In order to limit the length of the description, all flowcharts presented below for the multiblock embodiment retain the references used above for stages in the block by block embodiment when the description is the same, and the reader is referred to the description of those stages above rather than repeating the description here.

Figure 14:
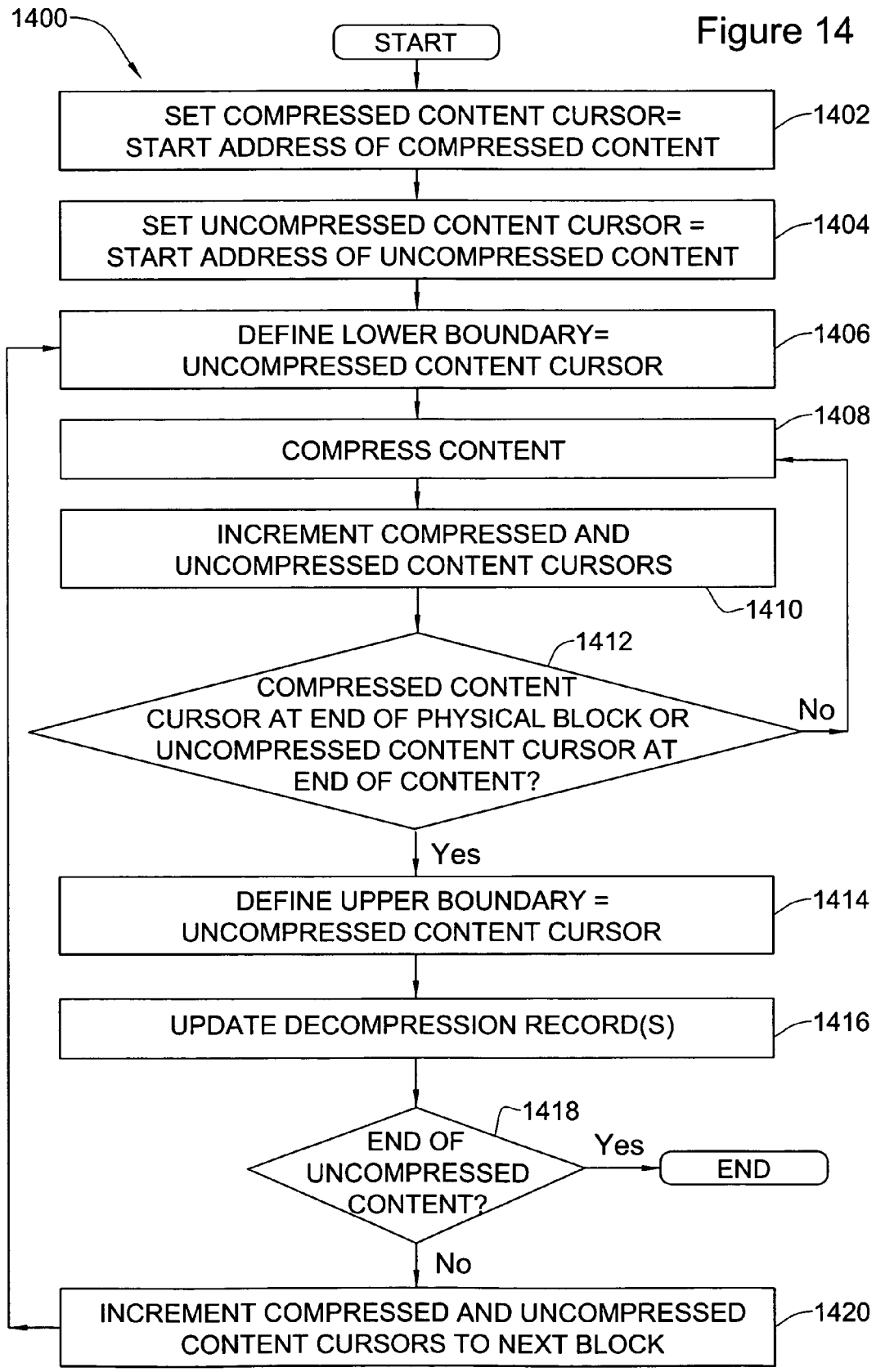
FIG. 14 is a flowchart of a method for compressing content, according to another embodiment of the present invention.

FIG. 14 illustrates a flowchart for multiblock compression, according to an embodiment of the present invention. In method 1400 in stage 1402, a compressed content cursor (keeping track of the compressed content) is set to the starting address of the compressed content, i.e. the beginning of the first physical block to which uncompressed content is to be compressed in accordance with the compression sequence associated with the embodiment's compression scheme. It should be noted that in some embodiments the compression algorithm and/or compression ratio used to compress an original version of content may differ from the compression algorithm and/or compression ratio used to compress the new version of content which updates the original version in-place. Note also that although the term physical block is used here, it is possible that the content is compressed to an area in RAM of equivalent size to a physical block. In stage 1404 the uncompressed content cursor (keeping tracking of the uncompressed content) is set to the starting address for the uncompressed content—i.e. the beginning of the first virtual block whose content is to be compressed. In stage 1406 the lower boundary of the virtual block is defined and/or recorded as the position of the uncompressed content cursor. In stage 1408 a unit of content, for example one byte, from the virtual block is compressed using any suitable compression scheme. The compressed content cursor and the uncompressed content cursor are then incremented to be positioned at the terminating addresses of the compressed unit of content and the corresponding uncompressed unit of content respectively (stage 1410). If the compressed content cursor is not at the end of the physical block and the uncompressed content cursor is not at the end of the uncompressed content (stage 1412) then another unit of content is compressed (stage 1408) and the compressed content cursor and uncompressed content cursor are incremented accordingly (stage 1410)

After the compressed content cursor reaches the end of the physical block or the uncompressed content cursor reaches the end of the uncompressed content (stage 1412), then in stage 1414 the upper boundary of the virtual block is defined and/or recorded as the position of the uncompressed content cursor. One or more decompression records may be updated in stage 1416 as discussed in more detail below. If the end of the uncompressed content has been reached (1418) then the method ends. Otherwise the compressed content cursor and the uncompressed content cursor are incremented (stage 1420) so as to refer to the next block. The process then iterates for the next block to stage 1406 until the last block is reached and the process ends (yes in stage 1418)

Thus by following the method of FIG. 14 or similar methods, the boundaries of each virtual block corresponding to each physical block may be defined and/or recorded during the compression.

Stage 1416 varies depending on whether the old version or new version is being compressed. In either case, decompression records allow the determination of an optimal update sequence and the protection of segments required for decompression. As mentioned above, it is desirable to update later in the update sequence content which in an original form thereof is required to decompress other original content. In contrast, it is desirable to update earlier in the update sequence content which in an updated form thereof is required to decompress other updated content. Therefore, in order to maintain the methodology of size dependencies developed above, where a block with a larger dependency is updated later in the update sequence, for the old version, the size of content from a particular block which is required to decompress other blocks is used to determine the size dependency of that particular block However, for the new version, the size of content from other blocks which is used to decompress a particular block influences the size dependency of that particular block.

Therefore assuming the old version is compressed, then for each block a decompression record is kept of content from that block which is required for decompressing other blocks. For example in one embodiment, a record for a particular block can include each piece of content required by another block, the size of the piece of content (in any predetermined units), and the block number requiring the piece of content. Continuing with the example, the record for each block can include one or more tuples, each tuple of the form: <block requiring content for decompression, required content, size of required content>. In one embodiment, if a piece of content is required for decompressing more than one block, the DR record includes only one tuple for that piece of content with the tuple including an array of the blocks requiring the piece of content. For example the form may be <block1 requiring content for decompression, . . . , blockn requiring content for decompression, required content, size of required content> This embodiment assume that a protected piece of content may be retrieved more than once for decompressing original blocks which are later in the update sequence.

However, assuming the new version is compressed, then for each particular block a decompression record is kept of content from other blocks which is required to decompress the particular block. For example in one embodiment, a record for a particular block can include each piece of content required from another block, the size of the piece of content (in any predetermined units), and the block number supplying the piece of content. Continuing with the example, the record for each block can include one or more tuples, each tuple of the form: <block supplying content required for decompression, required content, size of required content>.

In one embodiment, the same record can service a block regardless of whether the block comprises original and updated content, and in this embodiment the tuple can include a binary indication of whether the content relates to the original or updated content. Therefore, based on the binary indication, it can be understood if the content in the tuple is required for decompressing another block (original) or required for decompressing the block associated with the record (updated).

In one embodiment, the content in any tuple may be in uncompressed or compressed form depending on the form in which the content is required for decompression, with the size of the content reflecting the size of the content in that form.

In another embodiment, the content included in the tuple is uncompressed content and the recorded size is the size of the uncompressed content, because it is assumed that the protection buffer or update package stores any protected content in uncompressed content. In other embodiments, for example where the protected content is compressed prior to storage in the protection buffer or update package, the tuple may record compressed content and the size of the compressed content.

The format and contents of the decompression record may vary depending on the embodiment. For example, in one embodiment the size may not be recorded.

The content required for decompression may be actual content in a block (i.e. content which would be part of the block regardless of compression algorithms), content added to a block during compression, for example a stored table or any other computation, or content which is not really stored in any block for example state registers, memory counters, working tables or any other computation. For the purposes of the decompression records, it is assumed in one embodiment that any content which is not really stored in any block is "virtually" stored in the block which in the compression order immediately proceeds the block which requires that content for decompression. Below, unless otherwise stated, there is no differentiation in the processing of actual content, added content or virtually stored content listed in the decompression records.

Besides the compression reference example illustrated by FIG. 13, another example of actual content in a block which may be required for decompression is content relating to a command whose related content crosses over block boundaries. For example assume there is an incorporating command whose related content extends to subsequent block(s). In this case, the content in preceding block(s) relating to the command may be required to decompress the content in subsequent block(s) relating to the command.

Also, in such cases where compressed content crosses the block boundary, for the sake of accuracy, the uncompressed content compressed by this 'crossing' content is related to as being part of the following virtual block thus setting the boundary just before this piece of uncompressed content.

The reader should understand that stage 1416 following the compression of each block may update the decompression record for that block and/or the decompression records for other blocks.

In some embodiments, stage 1416 may be omitted, for example if decompression records are prepared during decompression of the compressed content and are not needed prior to that time (see below for usage of decompression records).

In one embodiment the decompression records are stored in a separate memory area, for example in a table in RAM.

In some embodiments, decompression records may also be stored in non-volatile storage, or in the update package. In other embodiments, decompression records remain in RAM and may be overwritten once processed (for example using method 1700 or 1800

It should be understood that because each virtual block corresponds to one physical block (and the boundaries of each virtual block corresponding to a physical block can be determined for example as in method 1400 or 1500 below), the decompression records may equivalently be associated with/refer to virtual blocks or physical blocks. However since the size/boundaries of a virtual block when containing old content which corresponds to a particular physical block may in some cases differ from the size/boundaries of the virtual block when containing new content which corresponds to the same particular physical block, for simplicity's sake, the decompression records are treated as being associated with/referring to physical blocks. The content and/or size in the decompression records as explained above may be in the uncompressed and/or compressed format as explained above.

Figure 15:
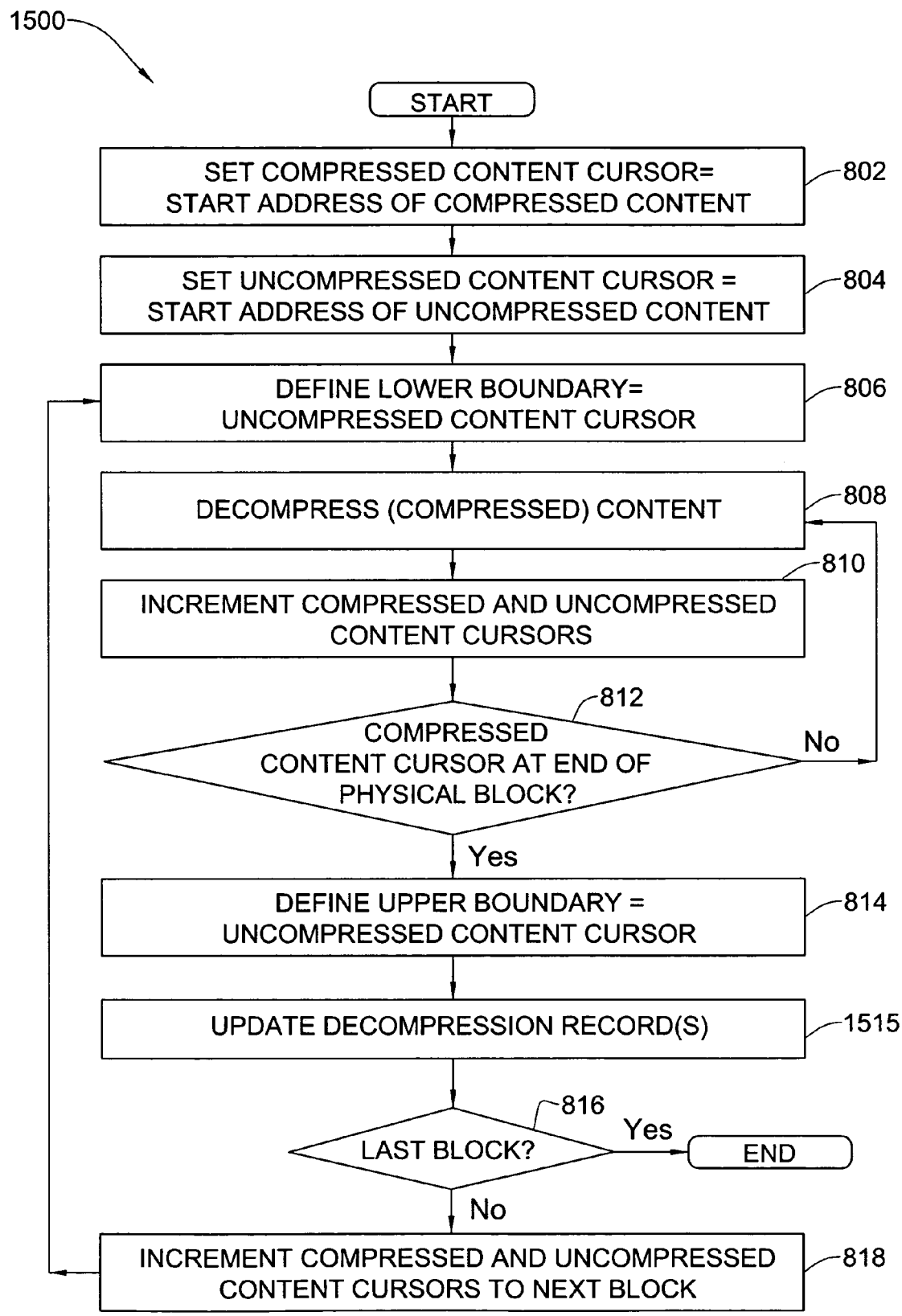
FIG. 15 is a flowchart of a method for decompressing content s, according to another embodiment of the present invention.

Decompression records may also or alternatively be determined during multiblock decompression. One example of multi-block decompression is illustrated in FIG. 15. It is assumed that decompression of physical blocks occurs in accordance with a compression sequence which is dependent on the compression method used.

In the illustrated embodiment, decompression proceeds such as in method 800 with the decompression of physical blocks following the same sequence as the compression sequence. However, each time a physical block has been decompressed, in stage 1515 any decompression records which need to be updated are updated, where decompression records were explained above in method 1400 stage 1416

In some embodiments, stage 1515, may be omitted, for example if decompression records or the equivalent had been prepared during compression of the compressed content and are accessible during decompression. For example, in some of these embodiments decompression records may have been stored in non-volatile storage, or in the update package and during decompression method 1500 the decompression records may be loaded into a separate memory area, for example a table in RAM.

Now that multi-block decompression and compression have been understood, referring back to FIG. 13, it should be understood that if the original block 1310 is updated prior to original blocks 1311 and 1312, it would pose difficulties unless the content of segment 1313 is stored elsewhere (for example in a protection buffer or in the update package in any appropriate form). Therefore if the reduction of storage is a desired feature, the decompression dependencies between blocks should be taken into account when determining the update sequence.

However in many cases, besides the decompression dependencies illustrated for example by FIG. 13, there are update dependencies, for example as illustrated in FIG. 9A. Therefore, in order to provide an update sequence that may minimize storage space and/or backup operations, a method is provided which depending on the embodiment may potentially take into account decompression dependencies and/or update dependencies. The reader should understand that in some cases, it may be desirable to ignore decompression dependencies and/or update dependencies and not try to determine an optimal update sequence, for example if storage size is not as large a factor as computation complexity of determining an update sequence.

Generally, however, it is desirable to reduce the number of backup operations and/or the protection buffer space required during the update process by selecting a certain update sequence. Bearing in mind that backup operations are time consuming, reducing the backup operations is beneficial in achieving a faster update process. In addition, taking into account that writing data into blocks in a storage device including blocks is time consuming, it should be appreciated that reducing the space used for protection (and hence possibly also the number of blocks used in the protection buffer) can also be beneficial in achieving a faster update process.

Before proceeding with the description of an embodiment for determining an update sequence, it should be noted that "Size" of a segment is the number of bytes occupied by the segment. However, this is non-limiting and it is possible to measure the size of a segment by any other applicable measure, such as bits, words, etc.

In addition, every block has a dependency value, denoted as DEP (block). It should be understood that because each virtual block corresponds to one physical block (and the boundaries of each virtual block corresponding a physical block can be determined for example as in method 1400 or 1500), the blocks B, $B_i$ may equivalently refer to virtual blocks or physical blocks. However since the size/boundaries of a virtual block when containing old content which corresponds to a particular physical block may in some cases differ from the size/boundaries of the virtual block when containing new content which corresponds to the same particular physical block, for simplicity's sake, the update sequence refers to the sequence of updating physical blocks.

The original (uncompressed) segments of a block B that correspond to updated (uncompressed) segments in the updated version constitute "original corresponding segments CS". The CS are assumed to be uncompressed because the embodiment assumes that the updating takes place when the content is uncompressed, and therefore the size of the CS are assumed to refer to the uncompressed size. However in other embodiments, the sizes may refer to the sizes of CS when compressed. The segments of an original block B that are required for decompression of other original blocks, or the working computation results required to decompress the block immediately following block B constitute "old decompression segments DSold" The segments or a working computation result required for decompressing updated block B constitute "new decompression segments DSnew". The form (compressed or uncompressed) of each DSold or DSnew is assumed to be the same as the form of that DSold or DSnew when listed as required content in the decompression record including that DSold or DSnew, where the form of required content listed in a DR may vary depending on the embodiment as explained above.

Therefore, initially the DEP value of a block is given by Equation $$DEP(B_i) = \sum_{j=1}^{m} Size(CS_j) + \sum_{r=1}^{s} Size(DSold_r) + \sum_{u=1}^{v} Size(DSnew_u) \quad \text{Equation 3}$$

Wherein:

$B_i$ is the i'th block (it is noted that blocks mentioned herein are updated blocks, i.e., blocks whose original content is overwritten by updated content, while it is unnecessary to protect content stored in those blocks that are not updated);

m is the number of original segments in the block that potentially require protection (m>=0);

$CS_j$ is an original segment in $B_i$ that corresponds to an updated segment, wherein j=1, 2, . . . , m; (m>=0, the number of such segments DSold$_r$ is a segment in decompressed $B_i$ or in compressed $B_i$ which other block(s) refer to when being decompressed while $B_i$ contains old content, or a working computation result (for example memory counters or tables of the working compression algorithm) which is used for decompression of $B_{i+1}$ (next block in the compression order). Note that r=1, 2, . . . , s, (s>=0, the number of such segments/results).

DSnew$_u$ is any segment (in a compressed or decompressed block) or a working computation result that is required for decompressing $B_i$ while containing new content, wherein u=1, 2, . . . , v, (v>=0, the number of such segments/results).

For example, assuming the dependencies of FIG. 9A and FIG. 13, and that original block 9A04 is identical to original block 1310, the initial dependency of block 9A04/1310 is:

DEP(9A04/1310)=size(9A11)+size(9A13)+size(9A14)+size(9A15)+size(1313)

Figure 16:
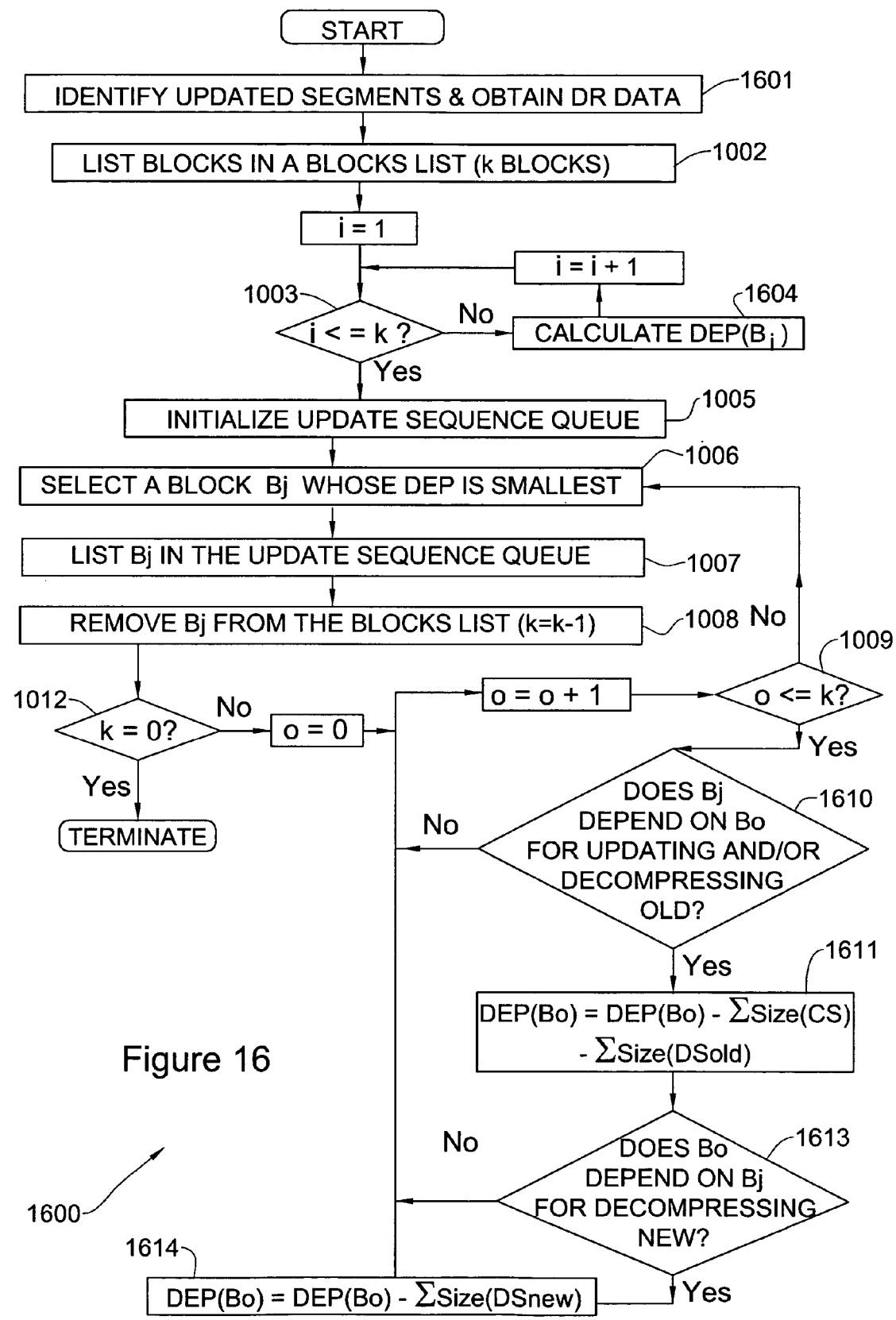
FIG. 16 is a flowchart of a method for determining an update sequence, according to another embodiment of the present invention.

It should be noted that the size of each DSold segment and DSnew segment for a particular block may be easily determined from decompression records developed during compression and/or decompression for example as discussed above with reference to FIG. 14 or 15. For example, if the size of the required content is included along with the required content in the decompression record, the recorded size can be used in the calculation of the DEP. As another example, if the size of the required content recorded in the decompression record is not included in the decompression record, the size of the required content can be calculated during the calculation of the DEP FIG. 16 illustrates an embodiment for determining an update sequence for a multi-block compression, according to an embodiment of the present invention.

In 1601 a pre-prepared update package is analyzed in order to identify corresponding segments as defined above. For simplicity's sake, it is assumed that the corresponding segments CS referred to in FIG. 16 are uncompressed segments of content.

It is noted that non-corresponding segments included in the updated version (i.e., segments that have no correspondence with segments in the original version), such as new content that is inserted into the updated version without any correspondence to the original version, does not necessarily affect the update sequence. Alternatively, the corresponding segments can be pre-identified (see, for example, FIG. 17), in which case 1601 can be skipped. In addition, a pre-prepared update package is not a pre-requisite. If there is no pre-prepared update package, it is possible to generate one, for example, by utilizing a diff tool as is known in the art or by any other way such as by the methods described in U.S. Pat. No. 6,546,552, WO 2004/114130 or WO 2005/003963.

In addition the old decompression segments and new decompression segments as defined above with respect to equation 3 are also identified. For example, in one embodiment the old decompression segments and new decompression segments may be obtained from decompression records. For example the decompression records may have been developed when new and old compressed blocks are decompressed and loaded into RAM, for example as described below with respect to FIG. 17. As another example, decompression records may have been included in a pre-packaged update package. The form (compressed or uncompressed) of each old decompression segment or new decompression segment is assumed to be the same as the form of that old or new decompression segment when listed as required content in a decompression record where the form of required content listed in a DR may vary depending on the embodiment as explained above.

Method 1600 continues as in method 1000 (see above description) for every block i (i=1, 2, . . . , k) in the block list (i.e. of blocks which will be updated), but DEP($B_i$) is calculated as in equation 3 (in 1604).

Once $B_j$ has been put in the update queue, the DEP value of any block still on the blocks list (i.e. not yet in the update queue), may be adapted to take into account that $B_j$ will be updated earlier. It was already explained that it is possible that $B_j$ depends on other blocks. That is, there are possibly updated segments in $B_j$ (or more specifically, in the updated version of $B_j$) whose corresponding original segments are in other original blocks. Alternatively or in addition, the decompression of $B_j$ (when $B_j$ has old content) may depend on (actual and/or added) content in other block(s) and/or on working computation results associated with the immediately preceding block in the compression order. It is also possible that the decompression of other blocks may depend on $B_j$ (when $B_j$ has new content) or on a working computation result associated with $B_j$ when $B_j$ is the immediately preceding block in the compression order.

Therefore, for each such other block $B_o$ that is still listed in the blocks list, segments corresponding to segments in the updated version of $B_j$ are identified and their size is reduced from DEP($B_o$). In addition or instead (actual, added and/or virtually stored) segments in original $B_o$ which also or instead are required for decompressing original $B_j$ are identified and their size is reduced from DEP($B_o$) in stages 1610 and 1611. (As noted above, segments required for decompression may include actual 25 content which would be stored in a block regardless of compression, added content which is added to a block during the compression and/or virtually "stored" content which is required for decompression of an immediately following block, however all may be processed similarly). In addition or instead (actual, added and/or virtually stored) segments in updated $B_j$ that are required for decompressing updated $B_o$ are identified and their size is reduced from DEP($B_o$) in stages 1613 and 1614. It should be evident that since the decompression records generated for example using method 1400 or 1500 list the blocks which require for their decompression content from original $B_o$ and list the blocks which supply content required for decompression of updated $B_o$, the compression dependencies between $B_j$ and $B_o$ required for the calculations in 1611 and 1614 may be easily obtained from the decompression records. If the sizes used in 1611 and 1614 had been recorded in the decompression records for example using method 1400 or 1500, then the sizes may be obtained directly from the decompression records. Otherwise the sizes can be calculated from the required content recorded in the decompression records. The computations of stages 1611 and 1614 are summarized by equation 4

$$DEP(B_o) = DEP(B_o) - \sum_{i=0}^{t-1} \text{Size}(CS_i) - \sum_{y=0}^{z-1} \text{Size}(DSold_y) - \sum_{a=0}^{b-1} \text{Size}(DSnew_a)$$

Equation 4

Wherein:

t is the number of corresponding segments (CS) in $B_o$ that correspond to segments $B_i$ (t>=1);

z is the number of decompression segments (whether actual, added or virtually stored) in old $B_o$ that are used for decompressing original $B_i$ (z>=1)

b is the number of decompression segments in new $B_i$ (whether actual, added or virtually stored) that are used for decompressing new $B_o$ (b>=1)

After the DEP values have potentially been modified as in equation 4 for all blocks remaining in the block list, the next block having the smallest dependency value is selected (1006) and the process repeats itself, until the blocks list is found to be empty (then, it is appreciated that k=0).

Upon termination, the update sequence queue represents the determined update sequence which takes into account update and compression dependencies. It should be noted that in other embodiments, the update sequence may take into account only update or only compression dependencies by modifying equation 3 and 4. For example, if only update dependencies are taken into account equations 3 and 4 reduce to equations 1 and 2 respectively. As another example, if only compression dependencies are taken into account then equation 3 becomes $$DEP(B_i) = \sum_{r=1}^{s} \text{Size}(DSold_r) + \sum_{u=1}^{v} \text{Size}(DSnew_u)$$

and equation 4 reduces to $$DEP(B_o) = DEP(B_o) - \sum_{y=0}^{z-1} \text{Size}(DSold_y) - \sum_{a=0}^{b-1} \text{Size}(DSnew_a).$$

The reader will understand that the above modifications to equations 3 and 4 are not limiting and that depending on the embodiment the update sequence may take into account any combination of update dependencies, decompression dependencies (original version), and decompression dependencies (updated version), with equations 3 and 4 adjusted accordingly.

It should be noted that according to one embodiment the update package can be re-arranged to reflect the update sequence. Alternatively it is possible to associate the update sequence, or more accurately, a representation thereof, with the update package. A representation of the update sequence can be, for example, by sorting and storing the update commands in the update package according to their target segments addresses, in accordance with the update sequence.

It should be appreciated that method 1600 assumes that any segment CS and DSold of block $B_o$ which is required to update and/or decompress original block $B_j$ is not required to update nor decompress any other blocks. However in an embodiment where any particular segment of $B_o$ may be required for update and/or decompression of other blocks in addition to Bj, equation 4 can be modified so that the size of CS and/or $DS_{old}$ are only subtracted from the DEP of $B_o$ if all dependent blocks are prior to Bo. In other words, stage 1610 can be modified to ask "Is Bj the latest block in the update order which depends on Bo for updating and/or decompressing old?"

Figure 17A:
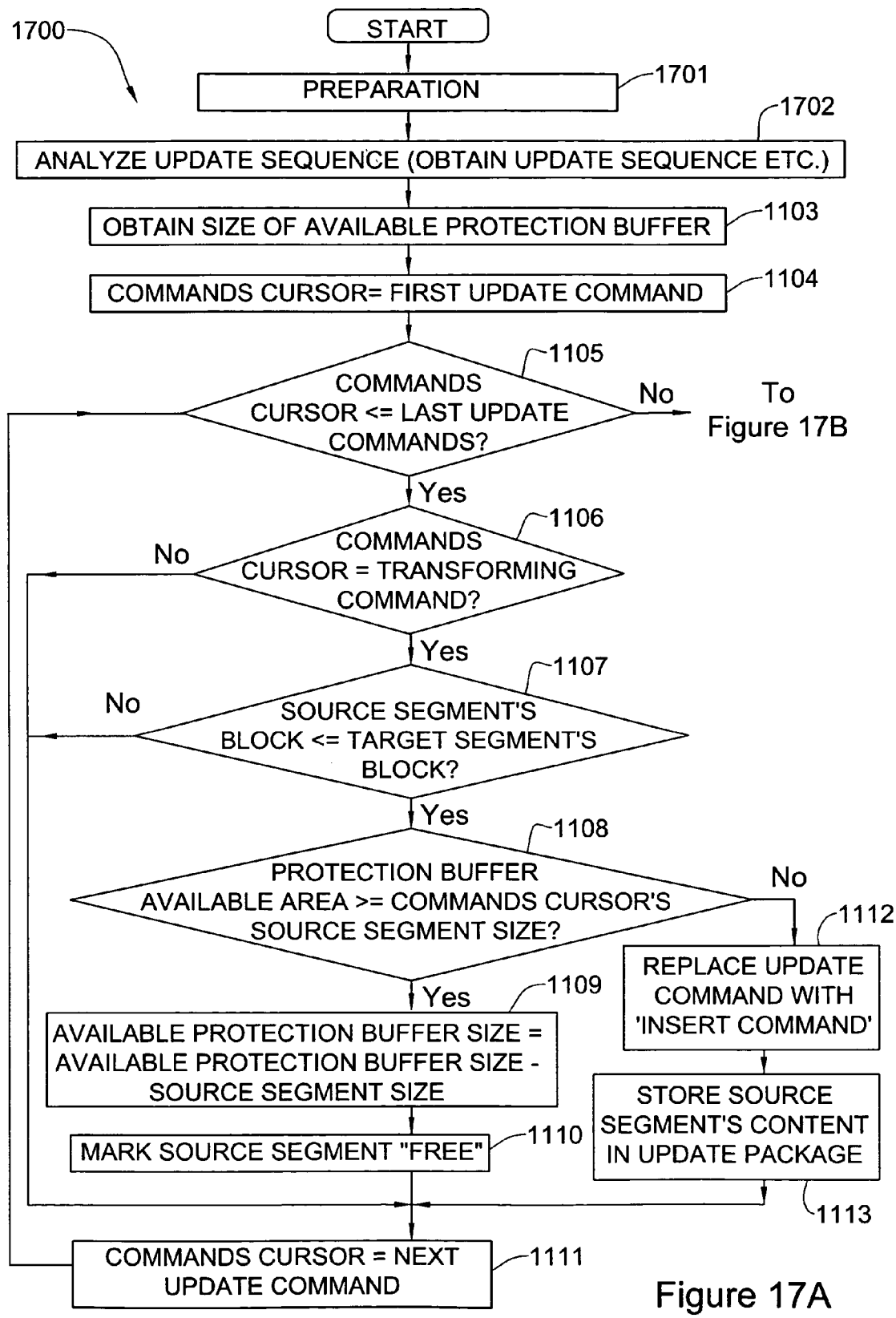
FIG. 17 (divided into 17A and 17B) is a flowchart of a method for generating an update package, according to another embodiment of the present invention.
Figure 17B:
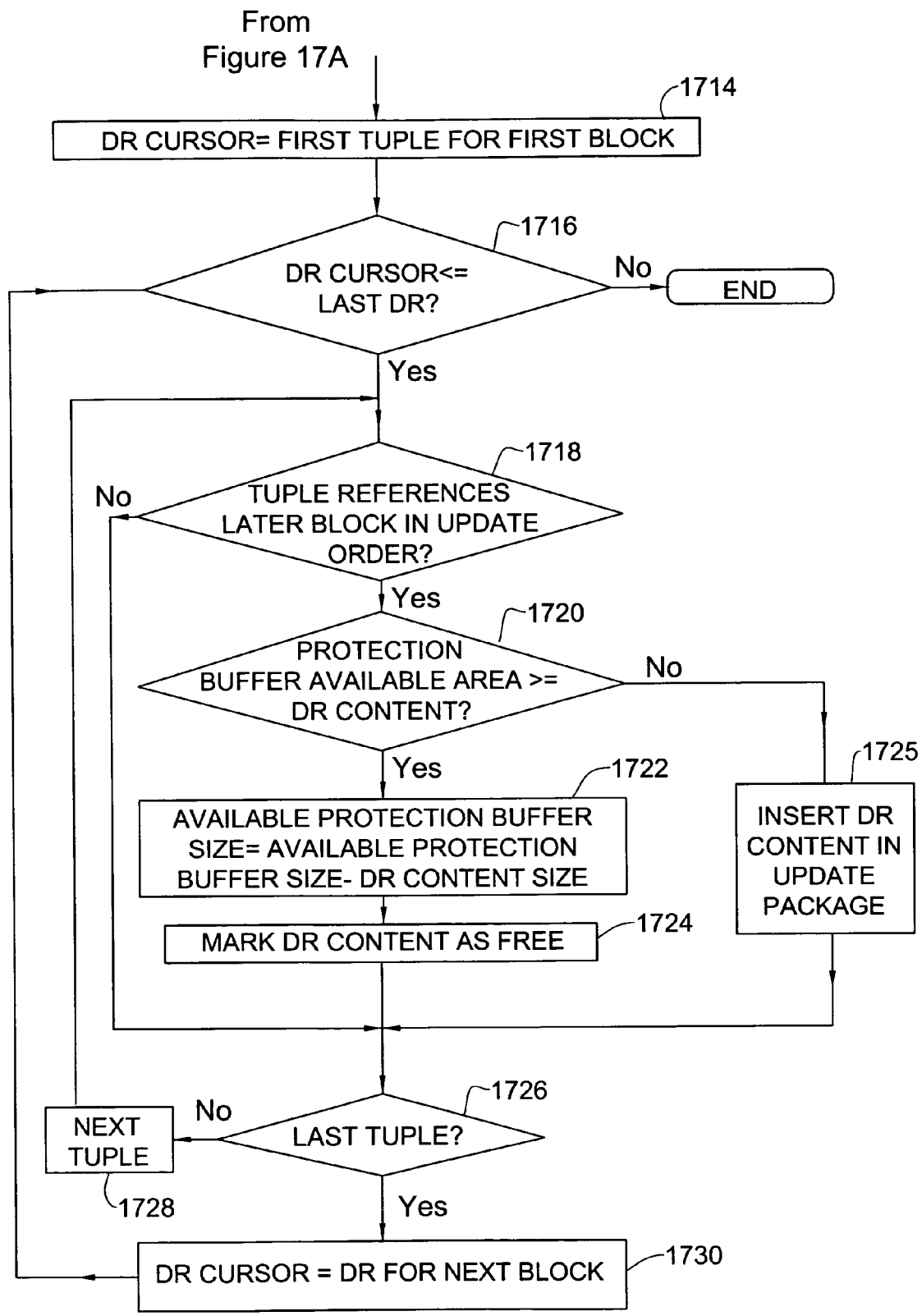

FIG. 17 is a flowchart illustrating generation of an update package, in accordance with one embodiment of the invention. Before providing detailed explanation of the flowchart, it should be appreciated as discussed above that when generating an update package, the generator has to predict the updated devices' behavior, including protection buffer usage, thus allowing to improve usage thereof, e.g., by determining the update sequence. Only upon predicting that the protection buffer is fully occupied (or unavailable), copy commands are replaced with insert commands, as done, for example, in U.S. Pat. No. 6,018,747 and other content required for updating or decompression is inserted into the update package.

It should be noted that the method 1700 includes a simulation of content protection in the protection buffer so as to be able to insert into the update package any protected content which does not fit into the protection buffer. The order in which content is simulated to be inserted into the protection buffer and the actual order in which content is inserted into the update package (when the protection buffer is simulated to be full) may follow the predicted usage of (i.e. requirement for) the content, for example during the method 1800 or 1900 discussed below. In another embodiment, the order of simulated storage of content into the protection buffer and actual storage of content into the update package may follow a different order. In this other embodiment, there may be a medium for allowing the retrieval of the correct content from protection buffer or update package during for example method 1800 or 1900. In yet other embodiments, the protection buffer and/or area in the update package may be delineated into different areas so as to mark the area for segments required for update, the area for segments required for decompression (old) and/or the area for segments required for decompression (new). In one of these other embodiments the order within a delineated area follows the predicted usage of the content however the areas may be arranged in a different sequence of physical addresses than the predicted sequence of accessing the areas (i.e. even if assume that would need segments required for decompression of old prior to segments required for decompression of new, the segments required for decompression of new may possibly be arranged at lower addresses than those required for decompression of old). However, in any case it is preferred that the simulation in method 1700 correctly simulates (i.e. predicts) the actual order of content protection in the protection buffer, for example as in method 1800, so that method 1800 can justifiably assume that the update package includes any protected content which does not fit into the protection buffer.

For simplicity of illustration an embodiment is described where the order of simulated storage of content into the protection buffer and actual storage of content into the update package does not necessarily follow the predicted usage of content, but there is a medium for allowing the retrieval of the correct stored content. This medium can include for example a cross reference table (aka correspondence table), providing a correspondence between blocks, DR tuples, and/or update commands relating to protected content (for example, for decompressing a block with old content, for decompressing a block with new content, or for updating a block with old content) and the storage location of the protected content (for example, the location in the protection buffer or update package). The correspondence table can be stored for example in the protection buffer, update package or elsewhere.

Stage 1701 includes preparation. For example, an update package (constituting a first update package) is obtained by any method. It can be generated locally, or received from an external source, e.g., via a communication network, in an inter-process communication, by reading it from any kind of storage device, etc. To this end the update package (constituting a first update package) can be generated by any known method, such as in accordance with U.S. Pat. No. 6,546,552, WO 2004/114130 or WO 2005/003963 or by utilizing a known per se diff tool.

In one embodiment, as part of the update package generation, the old version which has been compressed using multi-block compression is decompressed and loaded into RAM and the new version which has been compressed using multi-block compression is decompressed and loaded into RAM. A correspondence is determined between the virtual blocks of the decompressed old content and the physical blocks of the compressed old content, and similarly between the virtual blocks of the decompressed new content and the physical blocks of the compressed new content, for example as determined through the execution of the method of FIG. 15 or from the previous storage of virtual block boundaries during a previous execution of the method of FIG. 14 or 15. In addition, DRs related to the old content and related to the new content are determined through the execution of the method of FIG. 15 or from the previous storage of DRs during a previous execution of the method of FIG. 14 or 15.

For example in one embodiment a received update package may optionally include the virtual block boundaries and/or DRs for old and/or new content or alternatively, as part of the decompression executed in stage 1701, virtual boundaries and/or DRs (defined for example as in the method of FIG. 15) may be stored in the update package.

In stage 1702 the update package is analyzed in order to obtain an update sequence. The update sequence can be determined, for example, in accordance with FIG. 16 described above. In addition, in those cases when the update package is pre-organized in accordance with a preferred update sequence, or when it is associated, e.g., with information laying out a preferred update sequence (such as a list), 1702 can be skipped. In one embodiment, the update commands and/or decompression records may be reordered to reflect the update sequence.

Method 1700 continues as in method 1100 (with stages 1103 to 1113—see above description), however instead of terminating when the last update command has been reached (no in stage 1105), the method proceeds with determining which content in DRs is to be included in the update package, because of simulated space constraints in the designated protection buffer. The reader is referred above to the description of methods 1400 and 1500 for more details on DRs. It should be noted that because the embodiment assumes a correspondence table, the update commands need not necessarily be processed in the update order, however the simulated order of processing should preferably mimic the actual order processed in method 1800 discussed below.

In stage 1714 a DR cursor is initiated to point to a first tuple of the DR associated with a first block to be processed. For simplicity of description, in the described embodiment, it is assumed that tuples associated with the DR(s) of the same block are processed sequentially. The sequence of processing the blocks may follow any order, for example according to the update sequence, according to the compression sequence or by any other sequence. In another embodiment, tuples relating to the DR(s) of the same block are not necessarily processed sequentially. Preferably, the simulated order of processing the tuples should mimic the actual order processed in method 1800 discussed below. It is also assumed for simplicity of description that there is one DR for each block including tuples relating to the block with new content and tuples relating to the block with original content. For example, each tuple can include a binary indication of whether the tuple relates to decompressing original or new content. Alternatively, there may be multiple DRs for each block, for example two, with one relating to the block with new content and one relating to the block with old content.

In any case, as long as the DR cursor has not been advanced past the last DR in stage 1716, then in stage 1718 it is determined whether the tuple currently examined references a later block in the update order. If the tuple relates to the block with old content, then it is determined if the content in the examined tuple is required to decompress at least one block later in the update order (for example by examining the block reference(s) in the tuple). If the tuple relates to the block with new content, then it is determined if the content in the examined tuple, required to decompress the examined block, is supplied by a block later in the update order (for example by examining the block reference in the tuple). It should be noted that if the block tuples have the format of <block(s) requiring/supplying content in DR for decompression, required content in DR, size of required content> then just by examining the DR and knowing the update order, stage 1716 can be determined.

If the examined tuple references only earlier blocks, then no further processing is necessary and the method can move to the next tuple in the DR(s) for the block or to a DR relating to the next block if the tuple is the last for the examined block (stage 1726)

If on the other hand the tuple of the DR references at least one later block then in stage 1722 it is determined if there is remaining space in the protection buffer to store the DR content. If there is space in the protection buffer, the remaining space is reduced by the size of the DR content (stage 1722) and optionally the content is marked as free in 1724. For example the size of the content recorded in the tuple may be used or the size of the content recorded in the tuple may be calculated. If there is no space in the protection buffer, then in stage 1725 the content in the tuple of the DR is inserted into the update package. In one embodiment the content in the tuple of the DR is inserted as is into the update package (i.e. if uncompressed in DR then stored uncompressed, and if compressed in DR then stored compressed), while in another embodiment the content can be manipulated, for example compressed, decompressed, etc, prior to storage in the update package. In an embodiment with a cross reference table, an entry may be made in a cross reference table, for example referencing the location in the update package and the block(s) requiring the content for decompression and/or the block supplying the content the decompression.

In one embodiment, after a predetermined number of "no"s to 1720 and/or from the prior execution of 1108 in method 1700, it may be assumed that there is no more room in the protection buffer regardless of the size of the content in the DR tuple and subsequently stage 1725 (protection in update package) may directly follow a "yes" to stage 1718.

In one embodiment, in stage 1718 it may also be checked if the tuple content had already been protected in the update package and/or the protection buffer, for example because of earlier processed tuples, and in this case the method can continue directly to stage 1726, provided the protected tuple content can be easily obtained during update. In another embodiment, instead of protecting the tuple content again, a pointer to the protected tuple content may be instead stored.

The process continues with 1726, then proceeding to the next tuple in stage 1728, or if the tuple is the last tuple for the examined block, then to a DR for the next block in stage 1730. Once the last tuple in the DR for the last block has been processed, the method ends.

It should be evident to the reader that depending on the embodiment, the size of the protection buffer may be decreased at the expense of the update package and vice versa, for example to meet system constraints.

It should be noted that the update package can include optionally include decompression commands, for decompressing compressed original content stored in storage blocks. It can also optionally include compression commands, for compressing the updated virtual blocks into content stored in blocks of the compressed updated version.

Depending on the embodiment, the update package can be compressed prior to provision to an updated device as described below with reference to FIG. 18, using a compression method agreed to by the update package builder and the updated device.

Before turning to describe the update process operating in the updated devices, it should be appreciated that according to some embodiments, the protection buffer can be reused in order to increase its effectiveness. In other words, when content stored in the protection buffer is not required anymore, some embodiments can free the area used by this not-required content (e.g., by physically deleting the content or by marking it as free etc.) thus allowing the update process to re-use the free area for further backup operations required while updating. Reusing the protection buffer effectively allows performing more protection operations and hence, the update package size can be reduced (less protected content needs to be stored therein). The reuse is simulated during generation of the update package, hence allowing the generator to know when the protection buffer is full and when there is a free space therein.

Figure 18A:
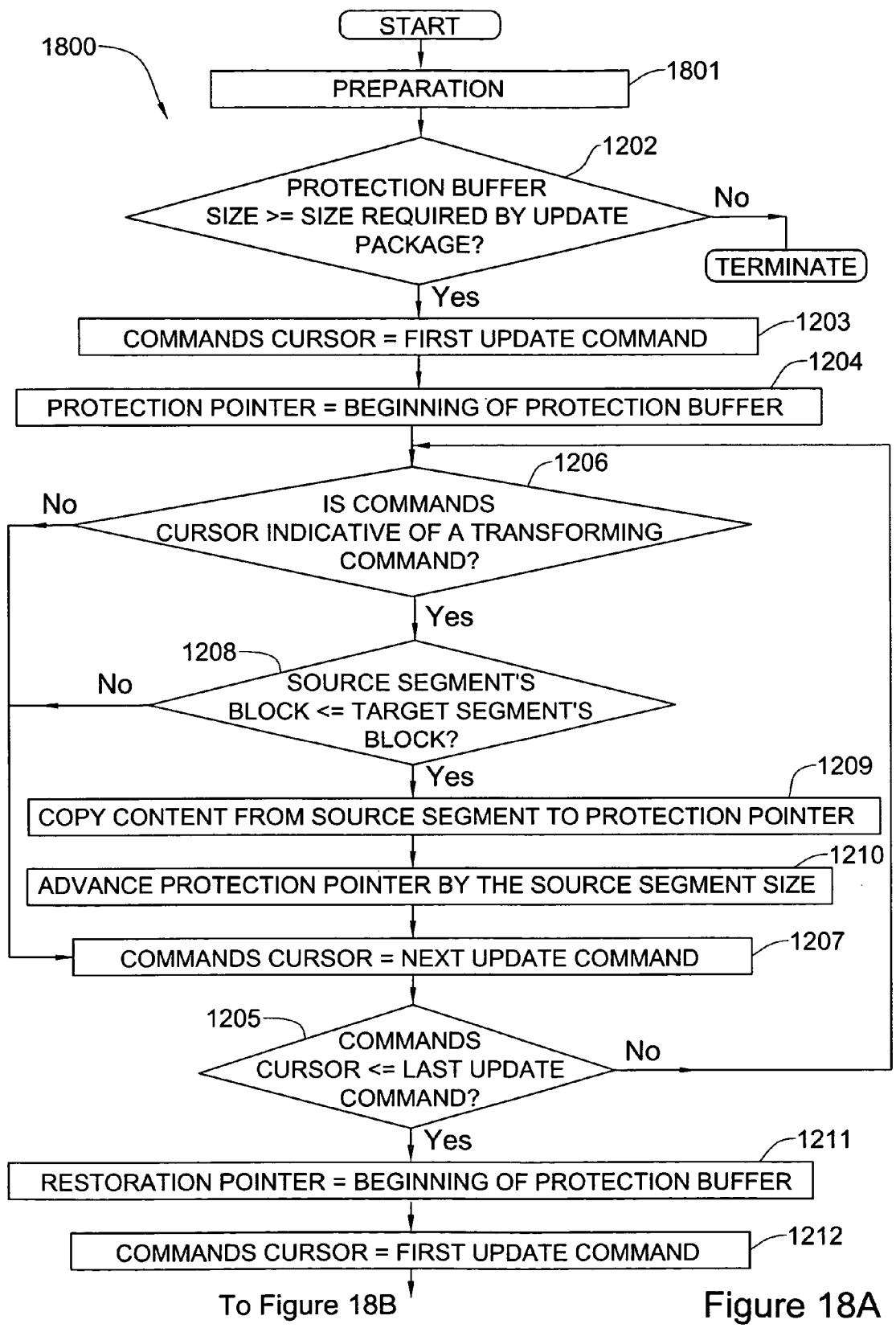
FIG. 18 (divided into 18A, 18B and 18C) is a flowchart of method for updating an original version of content to an updated version thereof, according to another embodiment of the present invention.
Figure 18B:
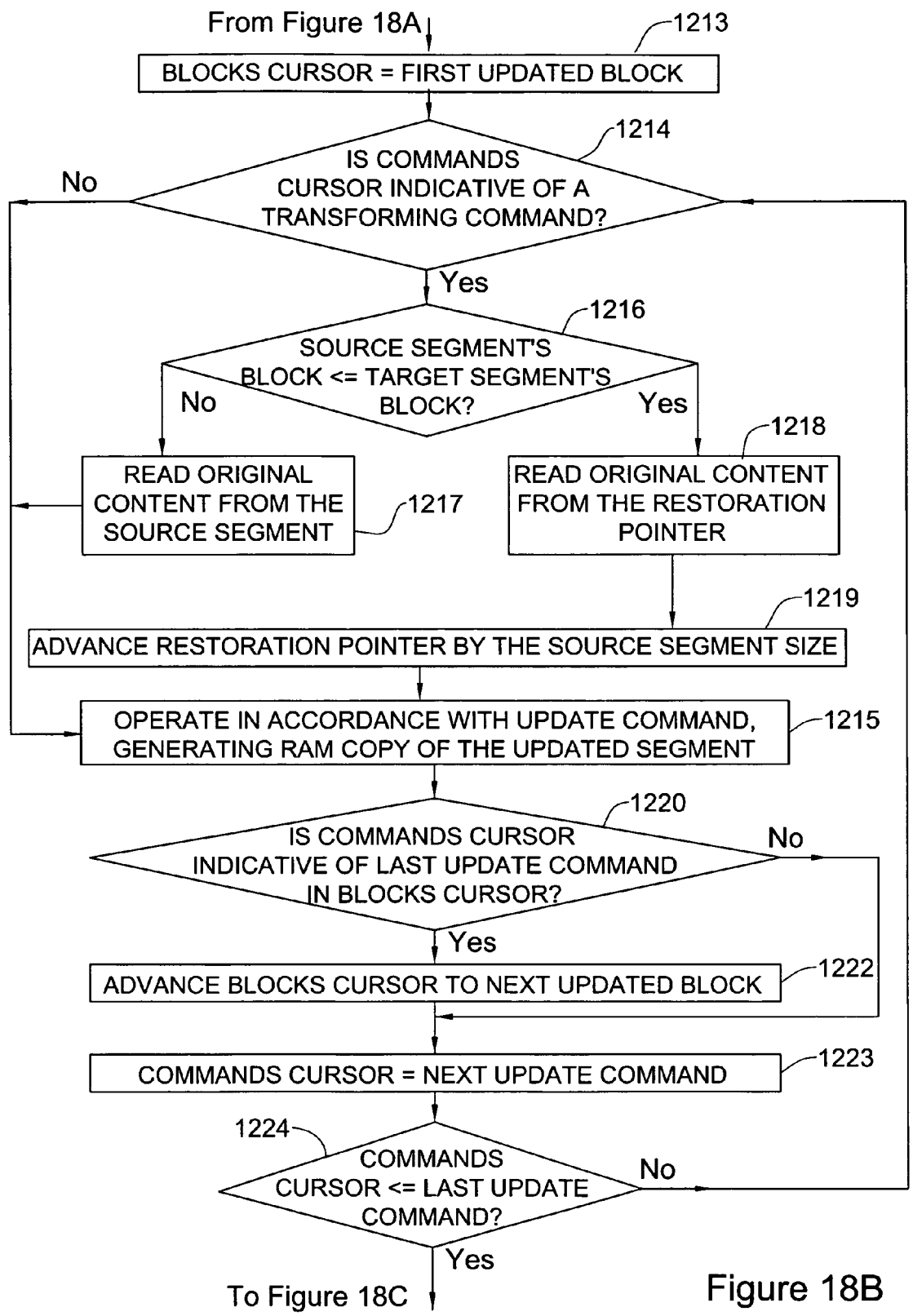
Figure 18C:
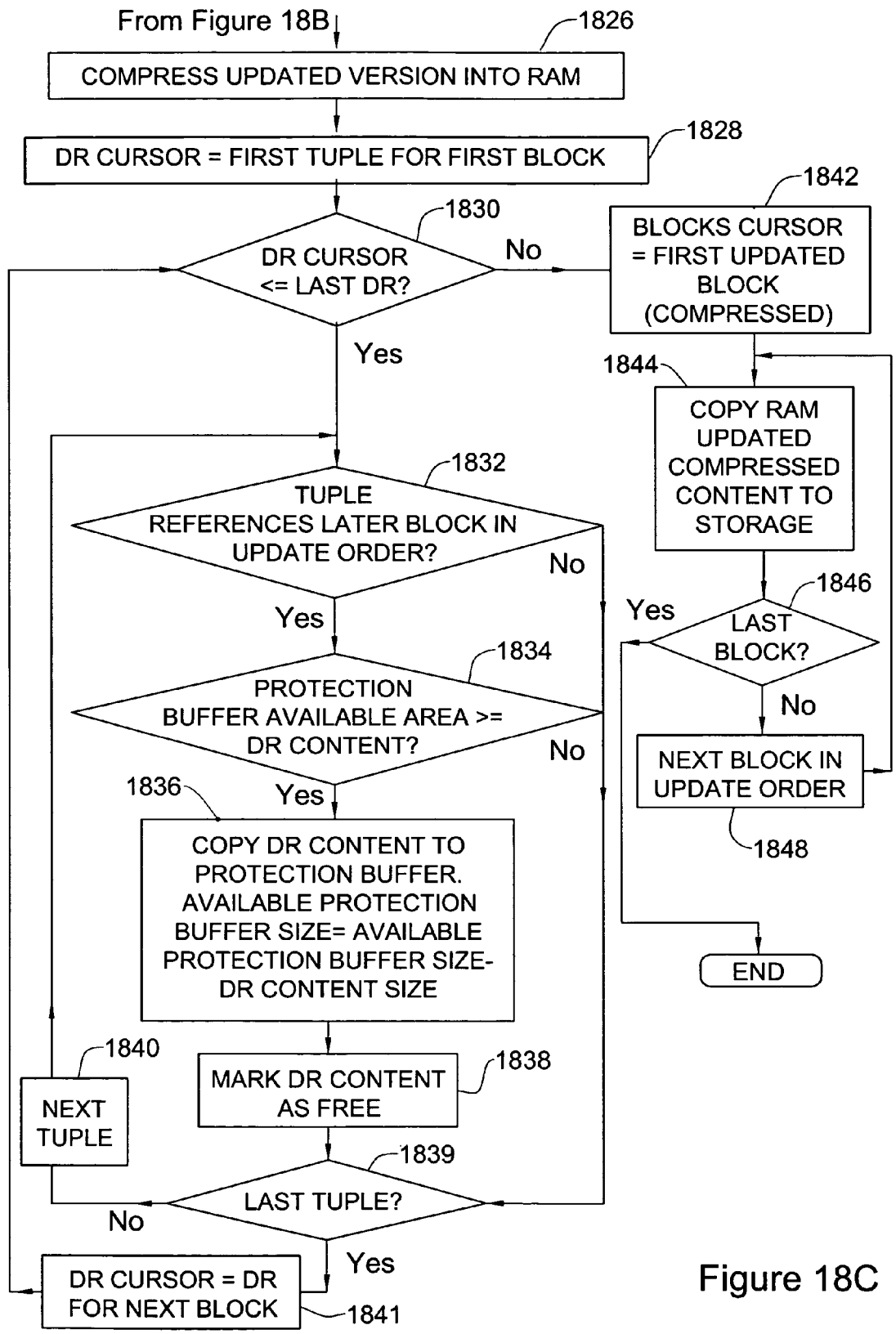

After considering an embodiment 1700 for generating an update package, FIG. 18 illustrates a method of updating a version which is multi-block compressed, according to an embodiment of the present invention. FIG. 18 is applicable, for example, in an update process operable in an updated device. It should be appreciated that the illustrated embodiment is adapted to operate in an updated device having a storage device including blocks.

As part of the preparation (stage 1801), when an update process starts operating, it obtains, or accesses an update package stored in the storage device 103, e.g., in volatile or non-volatile memory. It is appreciated that the updated device could have received the update package previously from the update server 105. Alternatively, the update package was loaded to the storage device by any applicable means, such as by copying it from a portable memory device (e.g., a floppy or compact disc) or by receiving it from the Internet. It should be further appreciated that according to the embodiment, the accessed update package has a certain update sequence. The update sequence can be determined simply by the order of the update commands in the update package, or is can be determined in accordance with additional information stored in association with the update package, such as a list determining the sequence for executing update commands, e.g., if different from the sequence in which the commands appear in the package. According to the example, the update sequence is adapted to reduce protection buffer usage in the updated device, or at least improves utilization of the protection buffer available therein. According to one embodiment, the update package could have been generated and the update sequence could have been determined (e.g., in an update package generator) in accordance with the flowcharts of FIGS. 16 and 17.

In 1801, the old compressed version is retrieved from the storage device and decompressed into RAM, for example in the compression order. The correspondence between the virtual blocks in the decompressed old version and the compressed old version may be determined for example through the execution of the method of FIG. 15 or from the previous storage of virtual block boundaries during a previous execution of the method of FIG. 14 or 15. In addition, DR tuples related to the old content may be determined through the execution of the method of FIG. 15 or from the previous storage of virtual block boundaries during a previous execution of the method of FIG. 14 or 15. For example in one embodiment the obtained update package may optionally include the virtual block boundaries and/or DR tuples related to the old content. In any case the source uncompressed segments in virtual blocks upon which the update commands are executed can be easily associated with corresponding compressed physical blocks in order to determine when the uncompressed source segment is update in the update sequence.

In one embodiment the obtained update package includes the virtual boundaries of the new uncompressed version and optionally the associated DR records, for example which were earlier determined and stored through the execution of the method of FIG. 14 or 15. In this case the target uncompressed segments in virtual blocks upon which the update commands are executed can be easily associated with corresponding (compressed) physical blocks in order to determine when the target uncompressed segment is updated in the update sequence. Therefore for simplicity of description it is assumed that the virtual boundaries were received in the update package. Further in the description this assumption will be relaxed when describing another embodiment.

Method 1800 then proceeds as in method 1200, with the processing of the update commands preferably in the same order as was simulated (see above method 1700).

In an embodiment with a cross reference table, a location entry is made for each segment protected in the protection buffer, for example between the location in the protection buffer and the update command, source segment block and/or target segment block. In such an embodiment, the restoration pointer may be extraneous and in this case stage 1211 (initialization of the restoration pointer) may be omitted and in stage 1218 the content may be retrieved from the protection buffer, using the cross reference table.

Stage 1221 of method 1200 is omitted in method 1800, i.e. the physical storage blocks are not updated with the content in RAM.

After stage 1224, instead of the process ending, the updated (i.e. new) version is compressed into RAM using a multiblock compression in stage 1826, for example as in method 1500. It is assumed that the virtual block boundaries for each block (which corresponds to the compressed block in RAM) and the DR tuples for the new compressed blocks in RAM are available either through execution of stage 1826, or from the update package. Alternatively if the DRs for the new blocks were included in the update package, the multiblock compression in stage 1826 may be deferred until later (for example prior to stage 1842)

The DR tuples (required for decompressing old or new blocks) are processed in the same order as was simulated in method 1700.

In stage 1828 a DR cursor is initiated to point to a first tuple of the DR associated with a first block to be processed. For simplicity of description, in the described embodiment, it is assumed that tuples associated with the DR(s) of the same block are processed sequentially. The sequence of processing the blocks may follow any order, for example according to the update sequence, according to the compression sequence or by any other sequence. In another embodiment, tuples relating to the DR(s) of the same block are not necessarily processed sequentially. Preferably, the actual order of processing the tuples should mimic the simulated order processed in method 1700 discussed above. It is also assumed for simplicity of description that there is one DR for each block including tuples relating to the block with new content and tuples relating to the block with original content. For example, each tuple can include a binary indication of whether the tuple relates to decompressing original or new content. Alternatively, there may be multiple DRs for each block, for example two, with one relating to the block with new content and one relating to the block with old content.

As long as the DR cursor has not advanced past the last DR in stage 1830, it is determined in stage 1832 whether the tuple currently examined references a later block in the update order. If the tuple relates to the block with old content, then it is determined if the content in the examined tuple is required to decompress at least one block later in the update order (for example by examining the block reference(s) in the tuple). If the tuple relates to the block with new content, then it is determined if the content in the examined tuple, required to decompress the examined block, is supplied by a block later in the update order (for example by examining the block reference in the tuple). It should be noted that if the block tuples have the format of <block(s) requiring/supplying content in DR for decompression, required content in DR, size of required content> then just by examining the DR and knowing the update order, stage 1832 can be determined.

If the tuple examined references only earlier blocks, then no further processing is necessary and the method can move to the next tuple in the DR(s) for the block or to a DR relating to the next block if the tuple is the last for the examined block (stage 1839 and then to 1840 or 1841)

If on the other hand the tuple of the DR references at least one later block, then in 1834 it is determined if there is remaining space in the protection buffer to store the DR content. If there is no space, then it is assumed that the tuple content had previously been stored in the update package (see method 1700) and the process moves to stage 1839.

If there is space, the content of the tuple is copied to the protection buffer and the remaining space of the protection buffer is reduced by the size of the tuple content (stage 1836). In one embodiment the content in the tuple of the DR is inserted as is into the protection buffer (i.e. if uncompressed in DR then stored uncompressed, and if compressed in DR then stored compressed), while in another embodiment the content can be manipulated, for example compressed, decompressed, etc, prior to storage in the protection buffer. In an embodiment with a cross reference table an entry may be made in the cross reference table for example referencing the location in the protection buffer and the block(s) requiring the content for decompression and/or the block supplying the content for decompression. Optionally the DR content is marked as free in 1838.

In one embodiment, in stage 1832 it may also be checked if the tuple content had already been protected in the update package and/or the protection buffer, for example because of tuples processed earlier in method 1800, and in this case the method can move to stage 1839, provided the tuple content is easily accessible or alternatively a pointer to the protected content may be instead stored.

In one embodiment after a predetermined number of "no"s to 1834, it may be assumed that there is no more room in the protection buffer regardless of the size of the content in the DR tuple and subsequently the process may continue with stage 1842.

The process moves to 1839 and then to the next tuple in stage 1840, or if the tuple is the last tuple for the examined block, then to a DR for the next block (stage 1841).

Once the last tuple in the DR for the last block has been reached, the blocks cursor is set to the first updated compressed block in RAM, in accordance with the update order (stage 1842). In stage 1844 the updated compressed block is copied from RAM to the corresponding physical block in storage. The blocks are copied in the update order (stage 1848) until the last block is reached (stage 1846) and the method ends.

In another embodiment, assume that the original version is decompressed into RAM and that the updated uncompressed version is to be written to a different area in RAM (i.e. not overwriting the original version in RAM). In this embodiment, prior to stage 1207 (i.e. prior to advancing to the next update command), the current update command can be executed, thus building the complete updated uncompressed version in a different area in RAM. In this embodiment, stages 1211 and 1224 can be omitted with the method continuing with stage 1826 as described above In other embodiments, assume that the virtual boundaries for virtual blocks in the updated version are not known from the update package or from prior to executing method 1800. Also assume that the update commands in the update package are independent of the virtual boundaries of the blocks in the updated version. For example the update package may designate an address range which should be allocated in RAM for the updated uncompressed version and the commands can relate to addresses within that range (for example with respect to the lower or upper bound of the range). In these embodiments, the update commands are executed in no particular order, building an updated uncompressed version in RAM) (the old uncompressed version is not overwritten). Then the uncompressed updated version may be compressed in RAM, for example using method 700 where a same size area in RAM substitutes for each physical block. Once compression has been achieved, the virtual block boundaries of the uncompressed updated version and the associated DRs are known. In one of these embodiments these virtual boundaries of the updated version are stored in non-volatile memory, for example in the protection buffer. The update commands are then analyzed, for example in the update sequence (or in any sequence followed in method 1700) in order to protect any source segment which needs to be protected in the protection buffer—see above description of stages 1203, 1204, 1206, 1208, 1209, 1210, 1207, and 1205. After the last command has been analyzed the method can continue with stage 1828 as described above.

It should be appreciated, further to the flowchart of FIG. 18 that the size of the protected content (just before storing it in the non-volatile protection buffer) may in one embodiment include less blocks than the number of n (n>1) blocks of the original version that are modified in the updated version. That is, in this embodiment less than n operations are required in order to store protected content in the non-volatile protection buffer. If the number of block storage operations is designated m, it should be appreciated that in this embodiment 2<=m<2n.

It is further noted that reusing the protection buffer could be beneficial. The reuse which was simulated during generation of the update package (with reference to FIG. 17) reflects the behavior of the update process described in FIG. 18. Hence, if reuse is utilized, it is possible to check further to 1844 if the updated compressed content just stored used protected content and if so as long as the protected content is not required for updating additional segments (corresponding to the same physical block or corresponding to other physical blocks following in accordance with the update sequence), decompressing additional original blocks further in the update order, or decompressing additional new blocks earlier in the update order, this protected content can be marked as free. In this embodiment, when all the protected content stored in one block of the non-volatile protection buffer is marked as free, this protected content can be deleted and the block can be reused.

As mentioned above, in some cases the compression algorithm and/or compression ratio used for the new version is not necessarily the same at the compression algorithm and/or compression ration used for the original version. Method 1800 fully allows for this possibility since there is no limitation on whether the compression used in the new version is the same or different as the compression used in the original version. It should further be understood that in some embodiments there may not be an updating of uncompressed content but simply a recompression of original content using a different algorithm and/or compression ratio. In these embodiments, the update package may include commands to recompress the original content using a different algorithm and/or compression ratio. Because there are no transforming commands in these embodiments, source segments do not need to be protected and therefore simulation of source segment protection in the protection buffer and replacement of the update commands with insert commands in method 1700 may be omitted. In addition in these embodiments where no uncompressed content is updated, it can be shown that the optimal update sequence is the compression sequence and therefore DR content does not need to be determined (for example in method 1400 or 1500) or protected. Simulation of DR content protection in the protection buffer and insertion of DR content in the update package may be omitted in method 1700 in these embodiments. Similarly, actual source segment/DR content protection of segments in the protection buffer in method 1800 may be omitted in these embodiments. The in-place updating should therefore be understood to include embodiments where an original version is updated in-place with a new ("updated") version which has been compressed in accordance with a different algorithm and/or compression ratio than the original version, regardless of whether the content in the uncompressed original version is identical or not to the content in the uncompressed updated version.

If the update process fails, the version stored in the storage device can be an intermediate version, while the RAM-stored compressed updated version is erased. In order to resume writing the missing compressed-updated content into those blocks of the intermediate version that include compressed-original content, at least the missing RAM-stored compressed-updated content should be re-constructed. Part of the compressed-updated content can be stored in the intermediate version, but the other part is missing.

It should be appreciated that the blocks where the missing compressed updated content should have been stored include compressed original content (content constituting "remaining compressed original content"). In addition, backward-referenced pieces of content are stored in the backup storage. It should also be appreciated that RAM-storage for the remaining compressed original content can be generated (further to decompressing the remaining compressed original content in accordance with the compression sequence).

Then, the uncompressed updated virtual blocks corresponding to the missing compressed updated content can be re-generated in accordance with the update sequence, starting from the first block (in accordance with the update sequence) where remaining compressed original content is stored. The uncompressed updated content constructed by this resumed updated process is stored in RAM, as before.

It should be appreciated that the RAM-stored uncompressed updated content is not a complete uncompressed updated version (or the required more-than-one-virtual blocks). Those compressed content of these virtual blocks that are missing is stored in the intermediate version. Since it is possible to examine the uncompressed updated virtual blocks in accordance with the compression sequence, thus identifying those missing virtual blocks, it should be appreciated that the first missing virtual block will be identified before any preceding missing virtual block (precedence in this case is in accordance with the compression sequence). It is thus possible to identify the compressed updated content corresponding to each missing virtual block (the compressed updated content is stored in a block of the intermediate version) and decompress this identified compressed updated content, yielding the missing uncompressed updated content to be stored in the missing virtual block. Checking each virtual block in the uncompressed updated version this way, uncompressing stored content to yield those identified virtual blocks, results in a complete uncompressed updated version stored in RAM (or generally, the result is the uncompressed content RAM-stored in the more-than-one-virtual block).

Now the RAM-stored uncompressed updated version (or the uncompressed content RAM-stored in the more-than-one-virtual block) can be re-compressed to yield a RAM-stored compressed updated version, and this content that wasn't written before the interruption can be written in-place into the updated blocks.

Figure 19A:
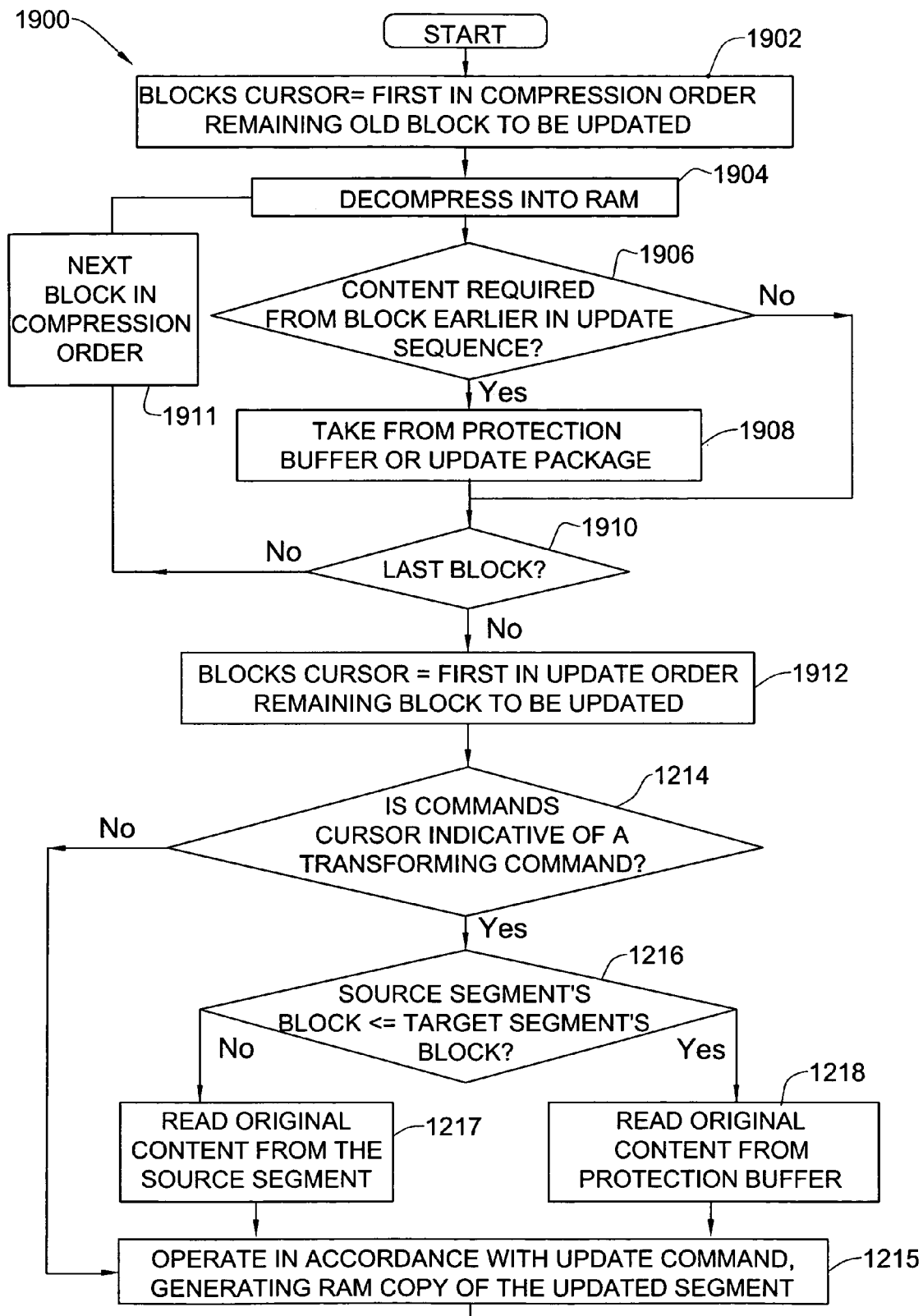
FIG. 19 (divided into 19A, 19B and 19C) is a flowchart of a method for resuming the updating of an original version of content to an updated version thereof, according to another embodiment of the present invention.
Figure 19B:
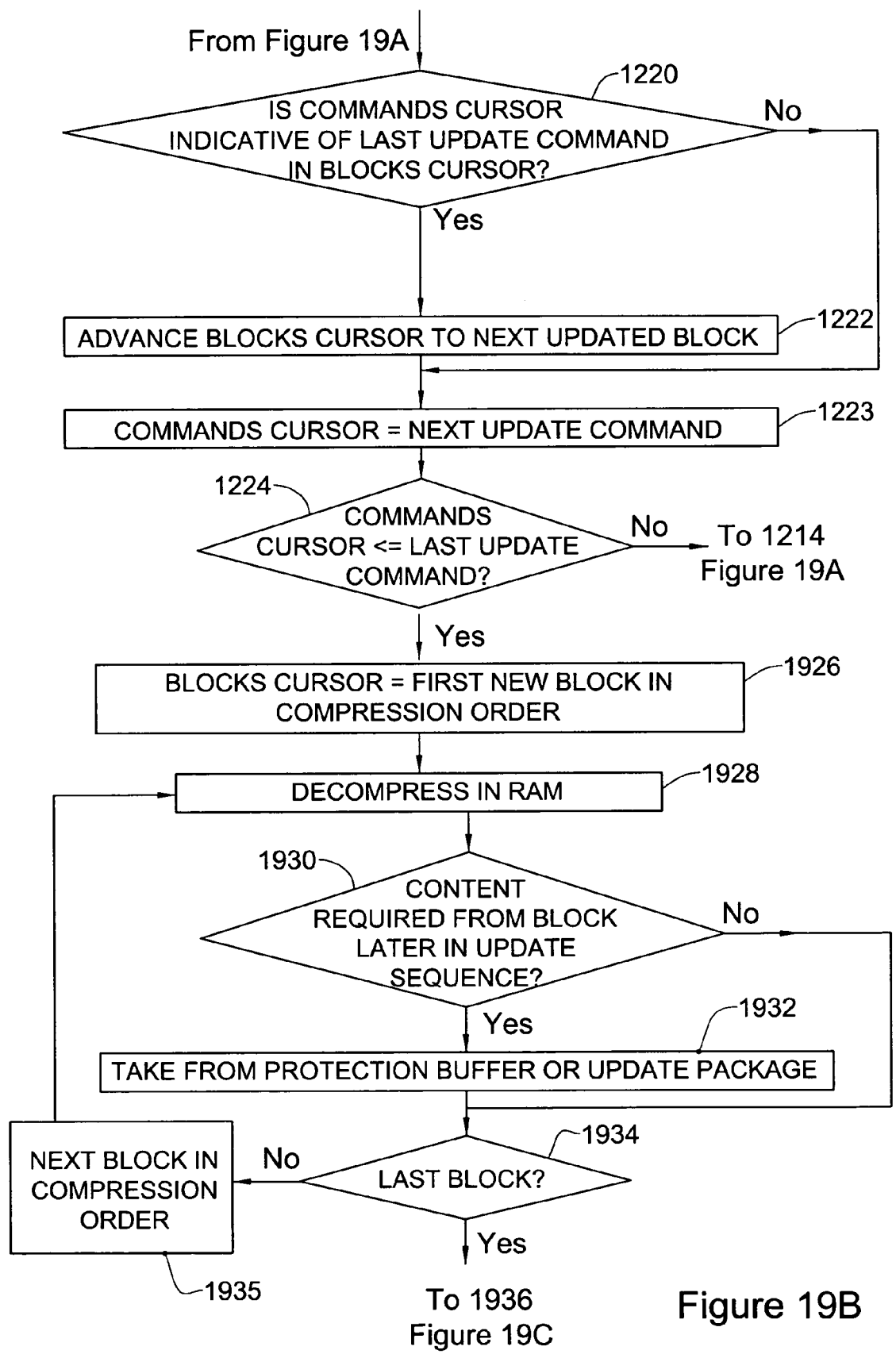
Figure 19C:
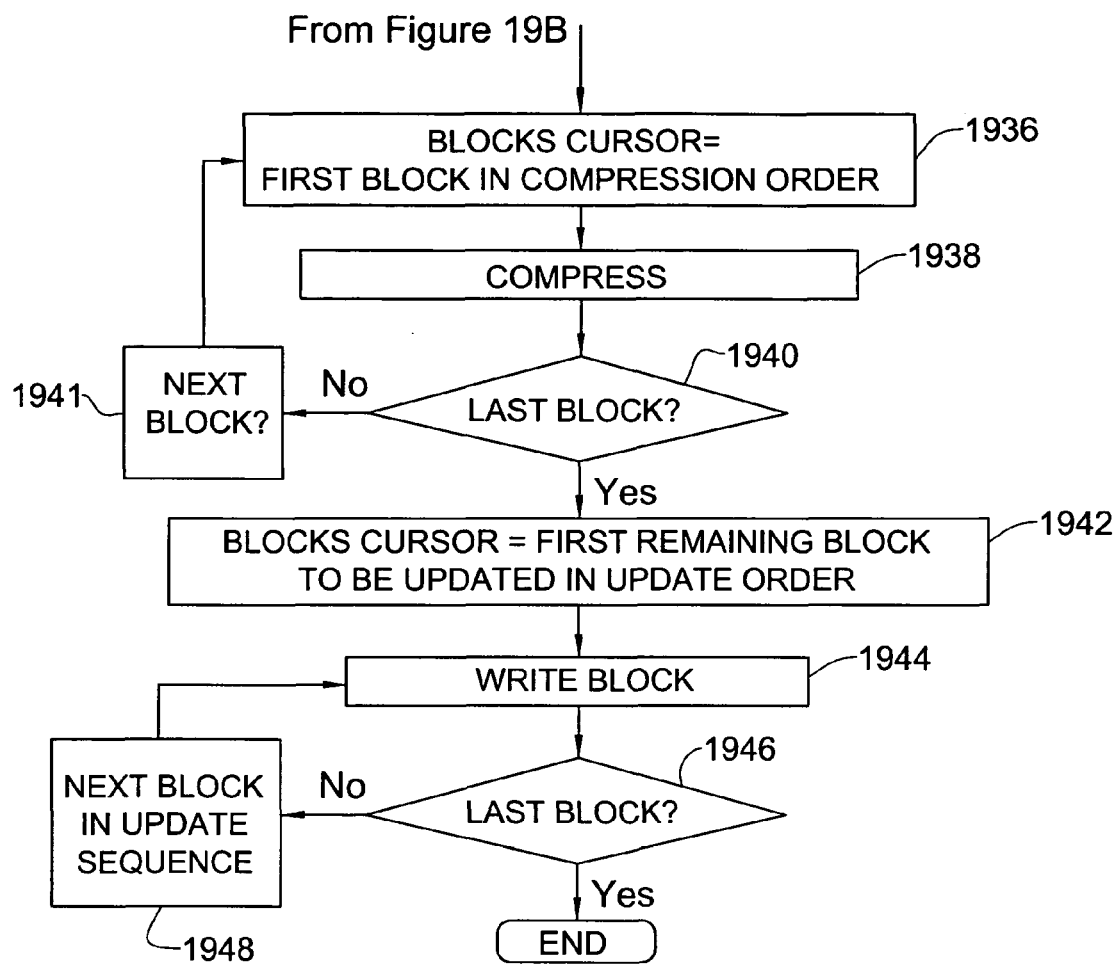

FIG. 19 illustrates a method 1900 for resuming an update which has been interrupted during the writing of the updated blocks to storage, according to an embodiment of the present invention. It is assumed that the interruption occurs in stage 1844 when some of the blocks have been copied into storage while others have not. Therefore, assuming the contents of RAM have been erased, all that remains are the blocks in storage, some of which contain old content and some of which contain new (updated) content, and what is protected in the protection buffer or update package.

The reader will understand if the interruption instead occurred prior to overwriting the blocks in physical storage with updated content, then upon interruption method 1800 could restart from the beginning without any problem.

In stage 1902, the blocks cursor points to the first remaining original block in the compression order (i.e. if blocks earlier in the compression order have already been updated these blocks are ignored for now). The resume location can be determined for example as in US Published Application Number 20050216530 to Meller et al, which is incorporated by reference herein. In stage 1904 the original blocks are decompressed into RAM in the compression order, for example using method 1500 (but omitting stage 1515 because the decompression records have earlier been determined and processed in method 1700 and/or 1800). In 1906 it is determined if the decompression requires content associated with the original version of a block earlier in the update sequence (which has since been updated). If yes, then in stage 1908 the content may be taken from the update package or protection buffer, depending on where the content was protected in method 1700 and/or 1800. For example a cross reference table may provide the location of the required content. The method decompresses each original block in the compression order in stage 1911, (skipping for now the processing of any already updated blocks) until all the original blocks have been decompressed (stage 1910). The blocks cursor points to the first original block left to be updated in the update sequence in stage 1912. The method then proceeds with updating the original blocks, executing for example stages 1214 to 1220 and 1222 to 1224, (but omitting stage 1219 and 1221 from method 1200). In stage 1218, the protected content is retrieved using a cross reference table instead of the restoration pointer (Note that the updating which advances the restoration pointer is divorced from the writing of the updated blocks to storage in method 1800 and therefore upon write interrupt the restoration pointer would have already been advanced to the end of the protection buffer and would therefore have no relationship to the block where the writing interrupt occurred).

Once the last update command has been executed, the method continues with stage 1926, with the block cursor pointing to the first new block in the compression order. Each block is decompressed in RAM in stage 1928 for example using method 1500 (but omitting stage 1515 because the decompression records have earlier been determined and processed in method 1700 and/or 1800) in the compression order (stage 1935). If for any block, in stage 1930 the content required for decompressing the block is associated with a block later in the update sequence (and therefore not yet updated), then in stage 1932 the required content may be taken from the update package or protection buffer, depending on where the content was protected in method 1700 and/or 1800. After the last new block has been decompressed into RAM (stage 1934), then in stage 1936, the block cursor points to the first block in the compression order.

It should be understood that some of the blocks in RAM were updated prior to the interrupt and some of the blocks were updated as part of method 1900 (i.e. after resuming the update) but that together the blocks form an uncompressed new version.

In stage 1936, the blocks cursor points to the first block in the compression order and the blocks are compressed into RAM in stage 1938 in the compression order (stage 1941). Once the last block has been compressed (stage 1940), the writing of the compressed blocks to storage may be resumed. In stage 1942, the blocks cursor points to the first remaining original block (compressed) to be updated in the update sequence. Each remaining block which had not yet been written to storage is written to storage (stage 1944) in the update sequence (stage 1941) until the last block is reached (stage 1946) and the method ends.

Although the described embodiments described with reference to FIGS. 17, 18 and 19 assume that source segments relating to transforming commands may be potentially protected in the protection buffer and/or update package, it should be understood that in other embodiments, other data relating to transforming commands may in addition or instead be protected. For example in one of these other embodiments, target segments may be potentially protected instead of or in addition to source segments. As another example, in one of these other embodiments a manipulated form of source segments and/or target segments may be protected, where the manipulation may or may not be related to the transformation prescribed by the command.

Yet, it is noted that the embodiments described above are non-limiting and alternative embodiments can exist if required. For example, an alternative embodiment can protect data (including objects) in the update package instead of protecting it in the backup storage.

Understanding the single-block and multi-block embodiments, it is noted that the update package should include update commands. It was previously explained that the update package can RAM-store and protect forward and backward referenced pieces of content (constituting together "protection operations"). According to one embodiment these protection operations can be realized by inserting protection commands into the update package. However, according to an alternative embodiment protection can be deduced by the update process while operating on the updatable devices, thus the explicit protection commands are not required in the update package.

Following the methods described for generating update packages and for updating original versions of content thus generating updated versions thereof, apparatuses that are able to perform these methods will be further described.

Figure 20:
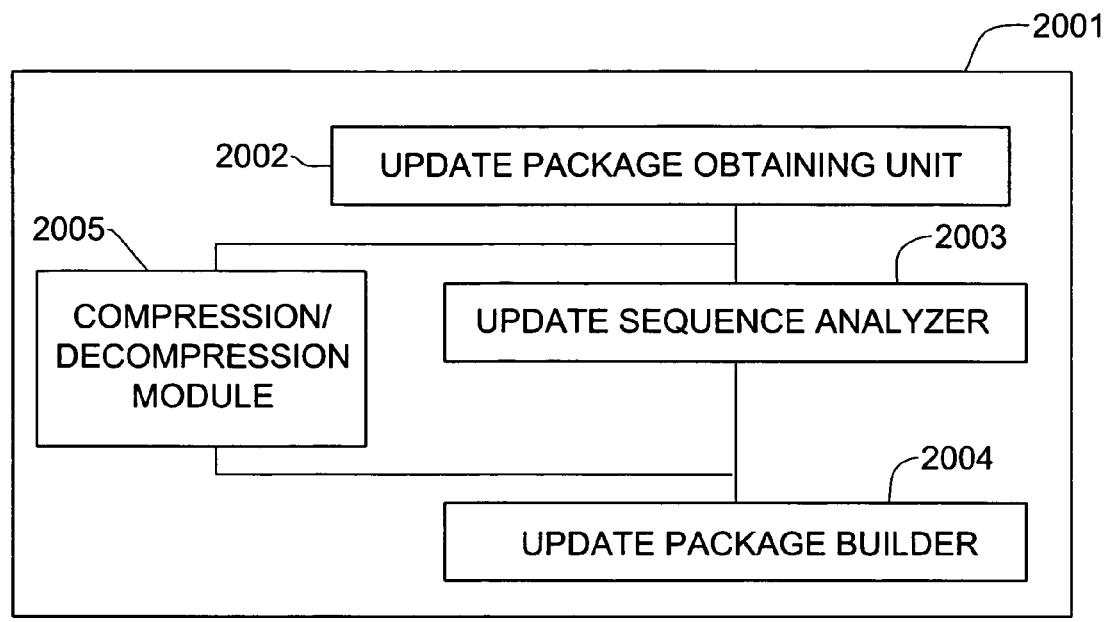
FIG. 20 illustrates an apparatus for generating an update package, in accordance with an embodiment of the invention.

FIG. 20 illustrates an apparatus 2001 for generating an update package in accordance with one embodiment of the invention, such as the update package generator 104. According to the embodiment the update package generator 104, includes an update package obtaining unit 2002. The update package obtained by the update package access unit 2002 can be any update package, including a simple delta generated by applying a known per se diff tool, or any other update package, generated in accordance with any method applicable to the case. In addition, it should be appreciated (as was previously noted with reference to 1101 in FIG. 11, or 1701 of FIG. 17 for example) that the update package obtaining unit can obtain a pre-prepared update package or generate an update package in accordance with any method known in the art.

An update sequence analyzer 2003 is coupled to the update package access unit 2002. The update sequence analyzer 2003 receives an update package from the update package access unit 2002 and determines an update sequence that improves protection buffer usage. The update sequence can be determined, for example, in accordance with the method illustrated in FIG. 10 or FIG. 16

An update package builder 2004, coupled to the update sequence analyzer 2003 builds a new update package, in accordance with the update package received from the update package obtaining unit 2002 and the update sequence determined in the update sequence analyzer 2003. FIGS. 11 and 17 illustrate embodiments of a method that can be applied in the update package builder 2004. Apparatus 2001 also includes a compression/decompression module 2005 for performing block by block and/or multiblock compression/decompression depending on the embodiment.

It is noted that according to certain embodiments the invention includes an apparatus 2001 for generating an update package, wherein the update package is configured to optimize an update sequence. The optimization, according to certain embodiments will achieve a protected content size which is smallest than any other protected content size achieved by any other update sequence. According to other embodiments the protected content size is smaller than the average protected content size achieved by all possible update sequences. According to yet other embodiments, the protected content size is smaller than an arbitrary size of a protected content that depends on an arbitrary updated sequence associated with the update package. In addition, other variants are also applicable.

Figure 21:
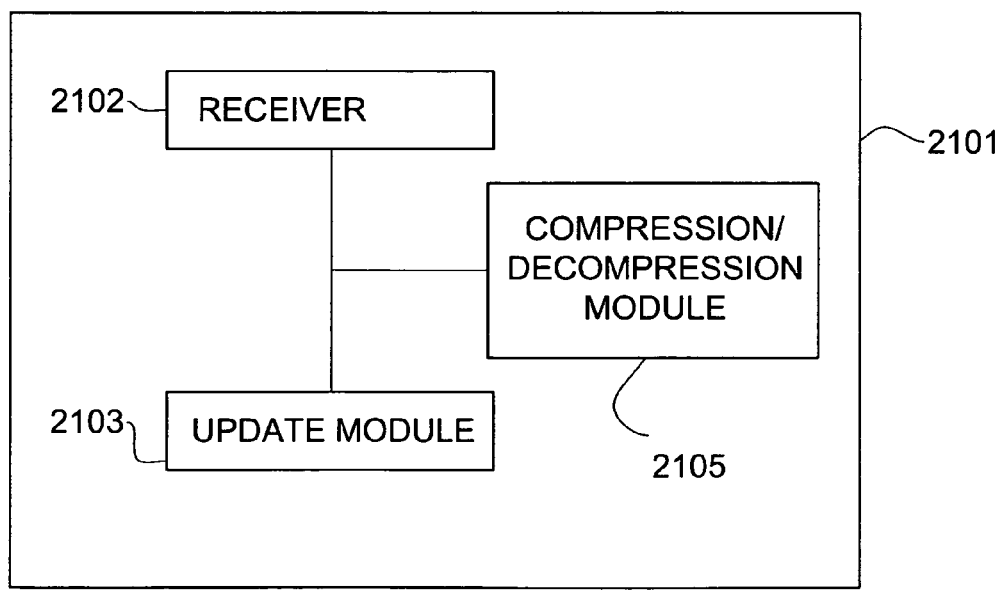
FIG. 21 illustrates an apparatus for updating an original version of content to an updated version thereof, in accordance with an embodiment of the invention.

FIG. 21 illustrates an apparatus 2101 for updating an original version of content to an updated version thereof, in accordance with another embodiment of the invention. The apparatus 2101 includes a receiver 2102 that obtains an update package. As was previously explained, e.g. with reference to 1201 in FIGS. 12A and 12B or 1801 of FIG. 18, the update package can be obtained by receiving it from a communication network or it can be obtained by any alternative method. The apparatus 2101 further includes an update module 2103 such as an update process that is adapted to update the original version currently stored in the updated device's storage device thus generating an updated version. The update module 2103 can operate, for example, in accordance with the flowchart illustrated in FIG. 12, 18 or 19. Apparatus 2101 also includes a compression/decompression module 2105 for performing block by block and/or multiblock compression/decompression depending on the embodiment.

It should be evident that compression/decompression module 2005 and/or 2105 may be separated into separate compression and decompression modules, with either one or both compression and decompression modules present in either of apparatus 2001 and/or 2101. For example, in one embodiment, apparatus 2001 includes only a decompression module or only a compression module. As another example, in one embodiment, apparatus 2101 includes only a decompression module or only a compression module.

In one embodiment, the algorithms used for decompression and/or compression in apparatus 2001 when preparing an update package take into account the algorithms used for decompression and/or compression in apparatus 2101 (when updating the content as per the prepared update package) or vice versa.

In one embodiment compression and/or decompression can be performed by a compression and/or decompression software (constituting a compression module and a decompression module, for example 2105) installed on the updatable device and activated by the update process. Alternatively, the update process can include a decompression module for decompressing the compressed original version and/or a compression module for compressing the updated version to yield the compressed updated version. It should be appreciated that this is not-limiting and any alternative embodiment is allowed when applicable, such as a combination (e.g., an update process that includes a compression module and is coupled to a decompression module) or even an update process that includes or is coupled to, e.g., only a compression module. It is appreciated that the latter update process can update un-compressed original content, compressing the updated content to yield compressed updated content. The opposite is also correct. It is possible to include only a decompression module, thus allowing updating decompressed original version, yielding an updated version which is uncompressed, etc.

Assuming that a compressed original version is replaced by an uncompressed updated version, the methods and system described above can be applied mutatis mutandis, for example omitting any of decompression/compression, calculation of virtual blocks/boundaries, and/or determination/examination of decompression records for the updated version. Assuming that an uncompressed original version is replaced by a compressed updated version, the methods and systems described above can be applied mutatis mutandis, for example omitting any of decompression/compression, calculation of virtual blocks/boundaries and/or determination/examination of decompression records for the original version.

The reader will understand that assuming the original and updated versions are stored compressed on the storage device, one may be compressed using the single block compression described above and the other may be compressed using the multi-block compression described above. For example in one embodiment, the original version may be compressed block by block and the updated version may be multi-block compressed. In another embodiment, the original version may be multi-block compressed and the updated version may be compressed block by block. Methods and systems described above can be applied in these embodiments, mutatis mutandis. For example, the determination/examination of decompression records may be omitted for the version which is compressed block by block.

Therefore embodiments of the invention include inter-alia an uncompressed original version replaced in the storage device by a block by block compressed updated version; an uncompressed original version replaced by a multi-block compressed updated version; a block by block compressed original version replaced by an uncompressed updated version; a block by block compressed original version replaced by a block by block compressed updated version (using the same or a different compression algorithm/ratio); a block by block compressed original version replaced by a multi-block compressed updated version; a multi-block compressed original version replaced by an uncompressed updated version; a multi-block compressed original version replaced by a block by block compressed updated version; and a multi-block compressed original version replaced by a multi-block compressed updated version (using the same or a different compression algorithm/ratio). It should be understood that depending on the embodiment the uncompressed content of the updated version may be the same or different than the uncompressed content of the original version as discussed above It will also be understood that the system according to the invention may be a suitably programmed computer. Likewise, the invention contemplates a computer program being readable by a computer for executing the method of the invention. The invention further contemplates a machine-readable memory tangibly embodying a program of instructions executable by the machine for executing the method of the invention.

In addition, those versed in the art would appreciate that a system according to the invention can be hardware. Alternatively, the system can compose hardware and software components.

While the invention has been shown and described with respect to particular embodiments, it is not thus limited. Numerous modifications, changes and improvements within the scope of the invention will now occur to the reader.

The invention claimed is:

1. A method for in-place updating of an original version of content stored in a non-volatile storage device with storage blocks to yield an updated version of content, the method comprising:
   obtaining an update package;
   copying said original version or part thereof to a volatile memory;
   updating, in accordance with said update package, said original version or part thereof to provide an uncompressed updated version or part thereof in the volatile memory;

compressing said uncompressed updated version or part thereof by independently compressing virtual blocks of uncompressed updated content such that all content of a virtual block when compressed, is substantially equal in size to and fits into one storage block; and writing said compressed updated version or part thereof in place of said original version or part thereof in said non-volatile storage device, each independently compressed virtual block being written to a separate storage block.

2. The method of claim 1, wherein said original version is compressed, said copying said original version or part thereof including:

decompressing at least part of said original version or part thereof.

3. The method of claim 2, wherein said compressed original version using a different compression algorithm or compression ratio than said compressed updated version.

4. The method of claim 1, wherein at least part of the content of each one of n (n>1) blocks of the original version is modified in the updated version, and wherein said updating and said writing include performing m block storage operations, each block storage operation including writing content to a block in the non-volatile storage device;

the block storage operations include update block storage operations storing updated content of the updated version in the non-volatile storage device, the updated content is generated in accordance with at least the update package;

wherein $2<=m<2n$.

5. The method of claim 1, wherein at least part of the content of each one of n (n>1) blocks of the original version is modified in the updated version, and wherein said updating and said writing include performing block storage operations, each block storage operation including writing content to a block in the non-volatile storage device, and wherein the block storage operations include also at least one backup block storage operation wherein each backup block storage operation includes storing protected content in a non-volatile protection buffer.

6. The method of claim 5, wherein said update package includes transforming commands, each having a source segment and a target segment, and wherein said protected content includes data associated with a transforming command.

7. The method of claim 5, wherein during said writing said volatile memory is erased, further comprising:

copying remaining said original version of content or part thereof from said storage device to the volatile memory;

updating said remaining said original version of content or part thereof, including retrieving at least some of said protected content which is required for said updating;

compressing said updated remaining content or part thereof so as to independently compress virtual blocks of uncompressed updated original content; and writing said updated remaining content or part thereof in place of said at least part of said original remaining content in said storage device wherein each said independently compressed virtual block is written to a separate storage block.

8. The method of claim 5, wherein the update package is associated with an update sequence, and wherein the size of the protected content in said non-volatile protection buffer depends on said update sequence; said size is smaller than an arbitrary size of a protected content that depends on an arbitrary update sequence associated with the update package; said arbitrary update sequence is selected arbitrarily from among all possible update sequences which can be associated with said update package.

9. The method of claim 5, wherein the update package is associated with an update sequence, and wherein the size of the protected content in said non-volatile protection buffer depends on said update sequence; said size is smallest size among sizes of protected content that depend on any update sequence of all possible update sequences which can be associated with the update package.

10. The method of claim 1, wherein said update package includes data for delineating said virtual blocks of uncompressed updated version of content.

11. The method of claim 10, wherein one of said virtual blocks is updated, compressed and written prior to updating, compressing and writing another of said virtual blocks.

12. The method of claim 1, wherein said original version is entirely updated and then compressed prior to writing said compressed updated version to said storage device.

13. A method for generating an update package for in place updating of an original version of content stored in a non-volatile storage device with storage blocks to yield an updated version of content, the method comprising:

decompressing into virtual blocks any of said original and updated versions which comprise separate storage blocks for each independently compressed content;

determining if any data of said original version will be required for at least one transforming command, wherein said at least one transforming command uses content of said origin version to generate updated content; and if any data of said original version is determined to be required for at least one transforming command, simulating protection by storing a copy of said determined data required for performing transforming commands in a protection buffer, so that said copy of said determined data of said original version exists upon updating said original version and modifying said determined data.

14. The method of claim 13, further comprising:

storing virtual block delineation for any of said original version and updated version in said update package.

15. The method of claim 13, wherein the update package is associated with an update sequence for updating said storage blocks, and wherein the total size of data relating to transforming commands which require protection depends on said update sequence; said size is smaller than an arbitrary size of a protected content that depends on an arbitrary update sequence associated with the update package; said arbitrary update sequence is selected arbitrarily from among all possible update sequences which can be associated with said update package.

16. The method of claim 13, wherein if said protection buffer is not sufficient, protecting in the update package data required for performing transforming commands is protected in the update package.

17. The method of claim 13, wherein a transforming command includes a source segment and a target segment.

18. A method for in-place updating of an original version of content stored in a non-volatile storage device with storage blocks to yield an updated version of content, the method comprising:

obtaining an update package including transforming commands that use content of said original version to generate updated content;

copying said original version to a volatile memory, wherein if said original version includes content in more than one storage block which was compressed interdependently, then said copying includes decompressing said original version into the volatile memory and protecting at least some content which is required for decompressing said original version;

updating the original version to provide an uncompressed updated version; and copying said updated version back to the non-volatile storage device in place of the original version wherein if said updated version is to be stored compressed where blocks are compressed interdependently, then said copying includes protecting at least some content which is required for decompressing said updated version and compressing interdependently updated blocks;

wherein at least one of said original version and said updated version includes content in more than one storage block which was compressed interdependently.

19. The method of claim 18, wherein said protected content includes actual content in a version which is unrelated to compression.

20. The method of claim 18, wherein said protected content includes content added to a version relating to compression.

21. The method of claim 18, wherein said protected content includes data required for decompression of a block of a version which is virtually associated with an immediately preceding block of said version.

22. The method of claim 18, wherein the update package is associated with an update sequence for updating said storage blocks, and wherein said protected content which is required for decompression of a storage block containing updated content is associated with another storage block containing updated content which is updated later than said storage block according to said update sequence.

23. The method of claim 18, wherein the update package is associated with an update sequence for updating said storage blocks and wherein said protected content which is required for decompression of a storage block containing original version of content is associated with another storage block containing original version of content which is updated earlier than said storage block according to said update sequence.

24. The method of claim 18, wherein at least part of the content of each one of n (n>1) blocks of the original version is modified in the updated version, and wherein said copying, compressing, and writing include performing m block storage operations, each block storage operation including writing content to a block in the non-volatile storage device;

the block storage operations include update block storage operations storing updated content of the updated version in the non-volatile storage device, the updated content is generated in accordance with at least the update package;

wherein 2<=m<2n.

25. The method of claim 18, wherein during said writing said volatile memory is erased, further comprising:

copying remaining original content from said non-volatile storage device to the volatile memory, wherein if said remaining original content is stored compressed in said non-volatile storage device, said copying includes decompressing said remaining original content;

updating said remaining original content;

copying updated content from said non-volatile storage device to the volatile memory, wherein if said updated content is stored compressed in said non-volatile storage device said copying includes decompressing said updated content; and using said protected content when decompressing any of said remaining original content or said updated content.

26. The method of claim 18, wherein said original version was compressed using a different compression algorithm or compression ratio than used to compress said updated version.

27. The method of claim 18, wherein one of said original version and said updated version includes separate storage blocks for each independently compressed content.

28. A method for generating an update package for in place updating of an original version of content stored in a non-volatile storage device with storage blocks to yield an updated version of content, the method comprising:

obtaining uncompressed old and uncompressed new versions of content;

obtaining dependencies between storage blocks of any of old and new versions resulting from (i) any of a plurality of transforming commands that use content of said original version to generate updated content and (ii) decompression of one or both versions; and if any data of said original version is determined to be required for any of the plurality of transforming commands, simulating protection in a protection buffer by storing a copy of said determined data of said original version required for performing any of the plurality transforming commands and decompressing one or both versions.

29. The method of claim 28, wherein if said protection buffer is not sufficient, protecting in the update package data required for performing any of transforming commands and decompressing one or both versions.

30. The method of claim 28, further comprising:

storing virtual block delineation and decompression records for any of said uncompressed old and uncompressed new versions in said update package.

31. The method of claim 28, wherein the update package is associated with an update sequence for updating said storage blocks, and wherein the total size of data requiring protection depends on said update sequence; said size is smaller than an arbitrary size of a protected content that depends on an arbitrary update sequence associated with the update package; said arbitrary update sequence is selected arbitrarily from among all possible update sequences which can be associated with said update package.

32. The method of claim 28, wherein said data required for decompression includes actual content in a version which is unrelated to compression.

33. The method of claim 28, wherein said data required for decompression includes content added to a version relating to compression.

34. The method of claim 28, wherein said data required for decompression includes data required for decompression of a block of a version which is virtually associated with an immediately previous block of said version.

35. An apparatus for in-place updating of an original version of content stored in a non-volatile storage device with storage blocks to yield an updated version of content, comprising:

a volatile memory;

a receiver configured to obtain an update package including transforming commands that use content of said original version to generate updated content;

an update module configured to (i) copy said original version in said non-volatile storage device to said volatile memory and (ii) update said original version to provide said updated content; and a compression module configured to compress said updated version by:

(i) interdependently compressing uncompressed virtual blocks of said updated version, each of which corresponding to more than one storage block in said non-volatile storage device, protecting at least some content of said original version determined to be required for at least one transforming command, and by storing a copy of said determined data in a protection buffer, or (ii) independently compressing each virtual block of uncompressed updated content such that all content of a virtual block, when compressed, is substantially equal in size to and fits into one storage block, wherein said update module is also configured to write said compressed updated version in place of said original version in said non-volatile storage device.

36. An apparatus for generating an update package for in place updating of an original version of content stored in a non-volatile storage device with storage blocks to yield an updated version of content, comprising:

a decompression module configured to determine a correspondence between each storage block and an uncompressed virtual block and to determine decompression dependencies between blocks or configured to determine a correspondence between each storage block and an uncompressed virtual block which, when independently compressed, (i) substantially equals a size of and fits into one storage block;

a processor for (i) generating an update package and (ii) if any data of said original version is determined to be required for performing any one of a plurality of transforming commands, simulating protection by storing a copy of said determined data in a protection buffer, such that said copy of said determined data of said original version exists upon updating said determined data.

37. A computer program product comprising a non-transitory computer useable medium having computer readable program code embodied therein for in-place updating of an original version of content stored in a non-volatile storage device with storage blocks to yield an updated version of content, the computer program product including a computer readable program code for causing the computer to:

obtain an update package;

copy said original version or part thereof to a volatile memory;

update said original version or part thereof to provide an uncompressed updated version including virtual blocks;

compress said uncompressed updated version by independently compressing each virtual block of uncompressed updated content such that all content of a virtual block when compressed, is substantially equal in size to and fits into one storage block; and write said compressed updated version in place of said original version or part thereof in said non-volatile storage device, each independently compressed virtual block being written to a separate storage block.

38. A computer program product comprising a non-transitory computer useable medium having computer readable program code embodied therein for generating an update package for in place updating of an original version of content stored in a non-volatile storage device with storage blocks to yield an updated version of content, the computer program product including computer readable program code for causing the computer to:

decompress into virtual blocks any of said original and updated versions which comprise separate storage blocks for each independently compressed content;

determine if any data of said original version is required for at least one transforming command; and if any data is determined to be required for at least one transforming command, simulating protection in a protection buffer by storing a copy of said determined data so that said copy of said determined data of said original version exists upon updating said original version.

39. The computer program product of claim 38, wherein a transforming command includes a source segment and a target segment.

40. A computer program product comprising a non-transitory computer useable medium having computer readable program code embodied therein for in-place updating of an original version of content stored in a non-volatile storage device with storage blocks to yield an updated version of content, the computer program product comprising computer readable program code for causing the computer to:

obtain an update package including transforming commands that uses content of said original version to generate updated content;

copy said original version to a volatile memory, wherein if said original version includes content in more than one storage block which was compressed interdependently, then said copying includes decompressing said original version into the volatile memory and protecting at least some content which is required for decompressing said original version;

computer readable program code for causing the computer to update the original version to provide an uncompressed updated version; and computer readable program code for causing the computer to copy said updated version back to the non-volatile storage device in place of the original version wherein if said updated version is to be stored compressed where blocks are compressed interdependently, then said copying includes protecting at least some content which is required for decompressing said updated version and compressing interdependently updated blocks;

wherein at least one of said original version and said updated version includes content in more than one storage block which was compressed interdependently.

41. A computer program product comprising a non-transitory computer useable medium having computer readable program code embodied therein for generating an update package for in place updating of an original version of content stored in a non-volatile storage device with storage blocks to yield an updated version of content, the computer program product comprising computer readable program code for causing the computer to:

obtain uncompressed old and uncompressed new versions of content;

obtain dependencies between storage blocks of any of old and new versions resulting from (i) any of a plurality of transforming commands that uses content of said original version to generate updated content and (ii) decompression of one or both versions; and if any data of said original version is determined to be required for any of the plurality of transforming commands, simulating protection by storing, in a protection buffer, a copy of said determined data of said original version required for performing any of the plurality of transforming commands, so that said copy of said determined data of said original version exists upon updating said original version.

* * * * *